(12) United States Patent
Koduri

(10) Patent No.: US 12,733,558 B2
(45) Date of Patent: Sep. 8, 2026

(54) CONFIGURABLE LEADED PACKAGE

(71) Applicant: Texas Instruments Incorporated, Dallas, TX (US)

(72) Inventor: Sreenivasan Kalyani Koduri, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 358 days.

(21) Appl. No.: 17/560,229

(22) Filed: Dec. 22, 2021

(65) Prior Publication Data

US 2022/0230944 A1 Jul. 21, 2022

Related U.S. Application Data

(60) Provisional application No. 63/132,825, filed on Dec. 31, 2020.

(51) Int. Cl.

| | |
|---|---|
| ***H01L 23/498*** | (2006.01) |
| ***H01L 21/48*** | (2006.01) |
| ***H01L 23/00*** | (2006.01) |
| ***H01L 23/31*** | (2006.01) |
| ***H10W 70/05*** | (2026.01) |
| ***H10W 70/65*** | (2026.01) |

(Continued)

(52) U.S. Cl.

CPC ....... *H10W 90/701* (2026.01); *H10W 70/093* (2026.01); *H10W 70/65* (2026.01); *H10W 70/66* (2026.01); *H10W 72/073* (2026.01); *H10W 72/075* (2026.01); *H10W 74/114* (2026.01); *H10W 72/884* (2026.01); *H10W 90/734* (2026.01); *H10W 90/754* (2026.01)

(58) Field of Classification Search

CPC ............. H10W 90/756; H10W 90/701; H10W 70/114; H10W 70/093; H10W 70/65; H10W 70/66

USPC .................................................. 257/666, 675

See application file for complete search history.

(56) References Cited

U.S. PATENT DOCUMENTS

| | | | | |
|---|---|---|---|---|
| 5,235,211 A | | 8/1993 | Hamburgen | |
| 5,731,227 A | * | 3/1998 | Thomas ................. | H01L 24/85 438/125 |

(Continued)

FOREIGN PATENT DOCUMENTS

| | | |
|---|---|---|
| JP | H04199739 | 7/1992 |
| JP | H05275601 | 10/1993 |

(Continued)

OTHER PUBLICATIONS

PCT Search Report PCT/US 2021/065534 mailed Apr. 7, 2022, 2pgs.

(Continued)

*Primary Examiner* — John M Parker

(74) *Attorney, Agent, or Firm* — Dawn Jos; Frank D. Cimino

(57) ABSTRACT

A semiconductor package includes a base insulating layer; a semiconductor die attached to a portion of the base insulating layer; and a first continuous lead electrically connected to the semiconductor die. The first continuous lead includes a first lateral extension on a first surface of the base insulating layer, a second lateral extension on a second surface of the base insulating layer, and a connecting portion between the first lateral extension and the second lateral extension. The connecting portion penetrates through the base insulating layer.

40 Claims, 33 Drawing Sheets

(51) Int. Cl.

| | |
|---|---|
| ***H10W 70/66*** | (2026.01) |
| ***H10W 72/00*** | (2026.01) |
| ***H10W 74/10*** | (2026.01) |
| ***H10W 90/00*** | (2026.01) |

(56) References Cited

U.S. PATENT DOCUMENTS

| | | | | |
|---|---|---|---|---|
| 5,747,874 | A * | 5/1998 | Seki .................... | H10W 90/701 257/702 |
| 5,886,876 | A | 3/1999 | Yamaguchi | |
| 6,319,753 | B1 * | 11/2001 | Ichikawa ............ | H01L 23/3107 438/126 |
| 2012/0104581 | A1 | 5/2012 | Yeh et al. | |
| 2012/0205694 | A1 | 8/2012 | Chern et al. | |

FOREIGN PATENT DOCUMENTS

| | | | |
|---|---|---|---|
| JP | H07335912 | A | 12/1995 |
| JP | 2000031365 | | 1/2000 |
| JP | 2000307030 | | 11/2000 |
| JP | 2001196488 | | 7/2001 |
| JP | 2001196488 | A | 7/2001 |
| JP | 2009224726 | | 10/2009 |
| KR | 19990013634 | A | 2/1999 |
| KR | 20130127995 | A | 11/2013 |
| KR | 20170104926 | A | 9/2017 |
| TW | 201017853 | A | 5/2010 |

OTHER PUBLICATIONS

European Patent Office Search Report dated Jun. 6, 2024, 2 pgs.

Office Action from Intellectual Property Office mailed on Apr. 8, 2025.

JP Office Action mailed Jul. 30, 2025.

Korean Office Action mailed Jan. 12, 2026, 9 pgs.

* cited by examiner

C'
B'
112
106
110
A
A'
116
118
120
B
104
108
102
114
C 116
106
102
122
108

110
110
110
112
102
114
114
114

110
110
110
112
116
116
116
102
118
114
118
114
118
114

E'
D'
106
110
112
116
114
118
102
D
E 110
110
110
112
116
120
116
116
102
120
120
118
114
118
114
118
114

110
110
110
112
116
116
116
102
114
114
114

106
110
L'
112
116
118
102
114
L

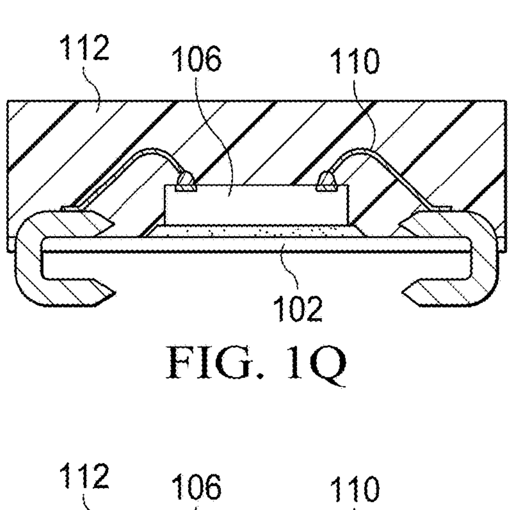
FIG. 1Q
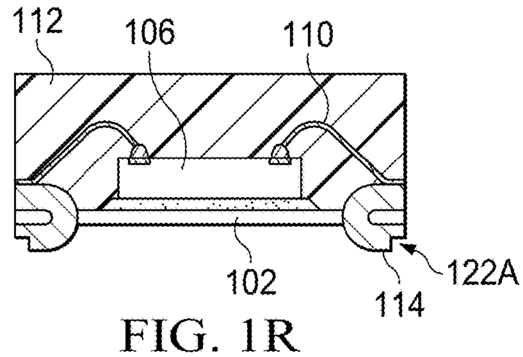
FIG. 1R
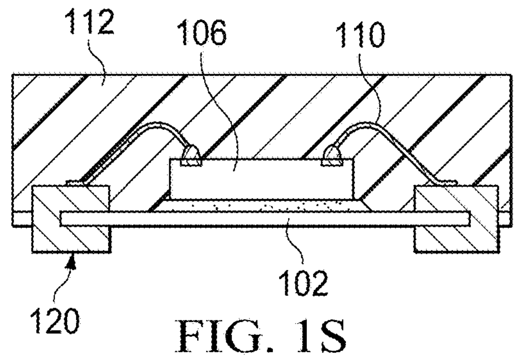
FIG. 1S
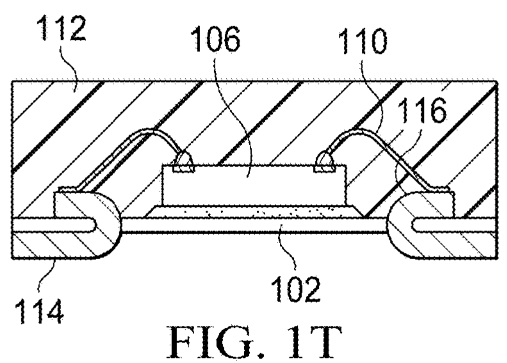
FIG. 1T
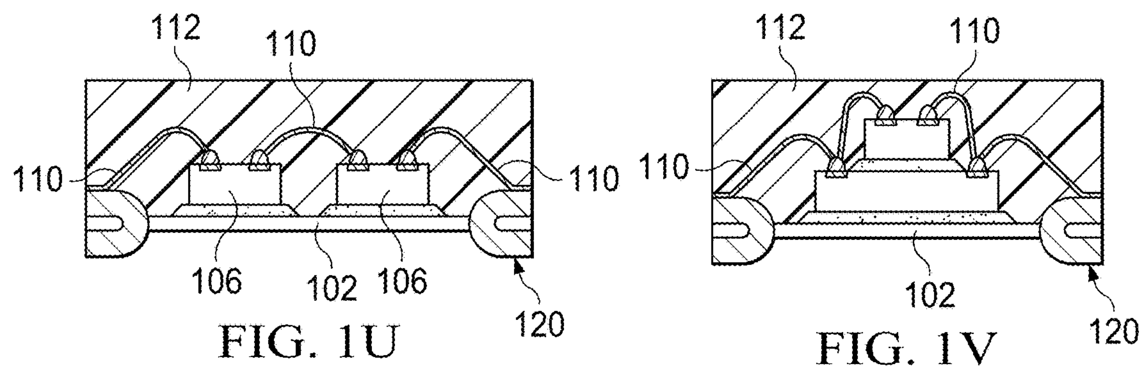
FIG. 1U
FIG. 1V
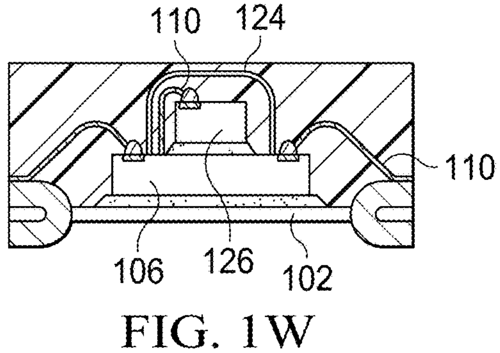
FIG. 1W

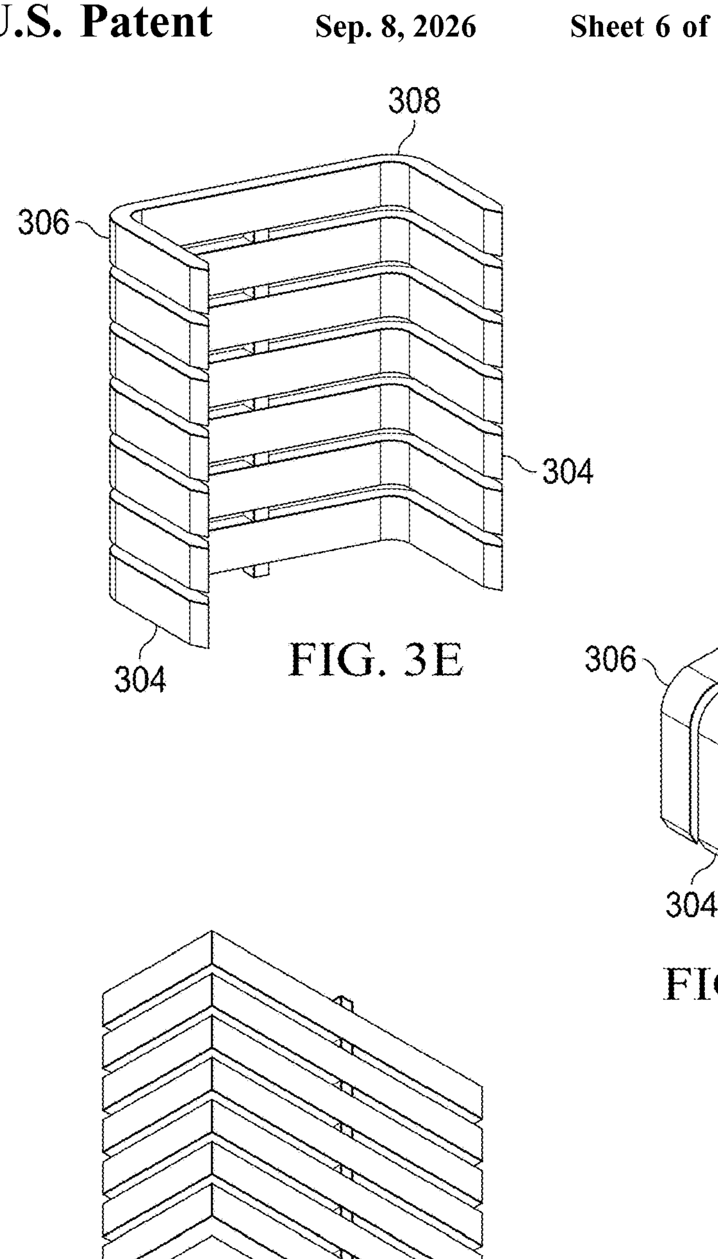
FIG. 3E
FIG. 3G
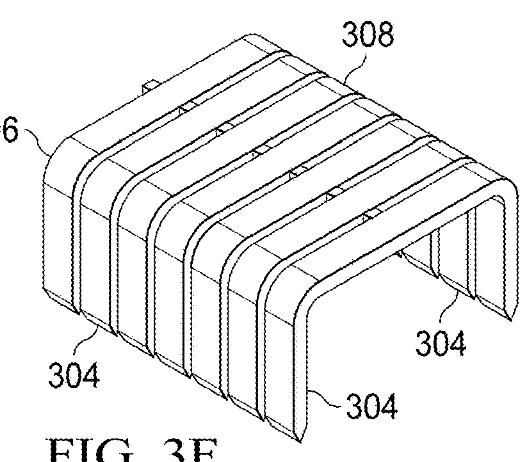
FIG. 3F
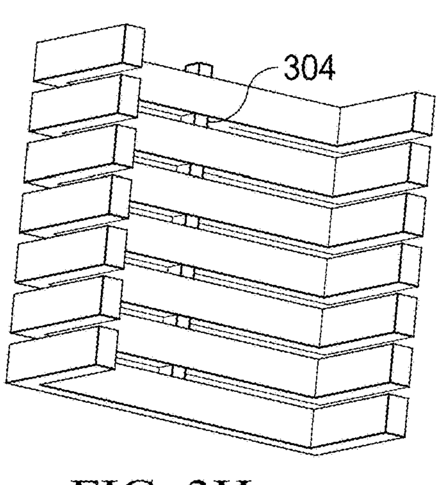
FIG. 3H

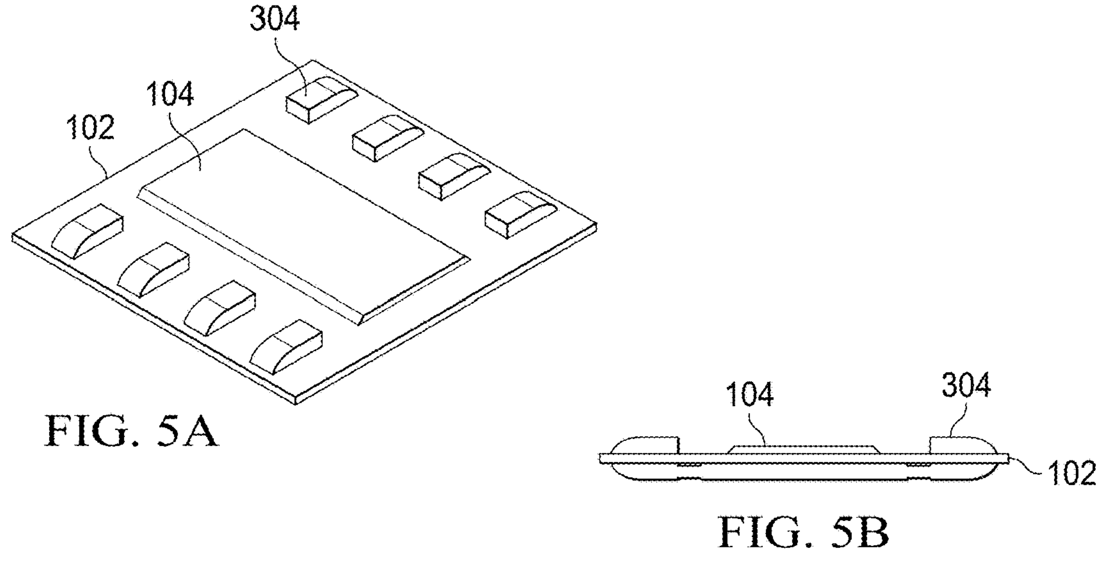
FIG. 5A
FIG. 5B
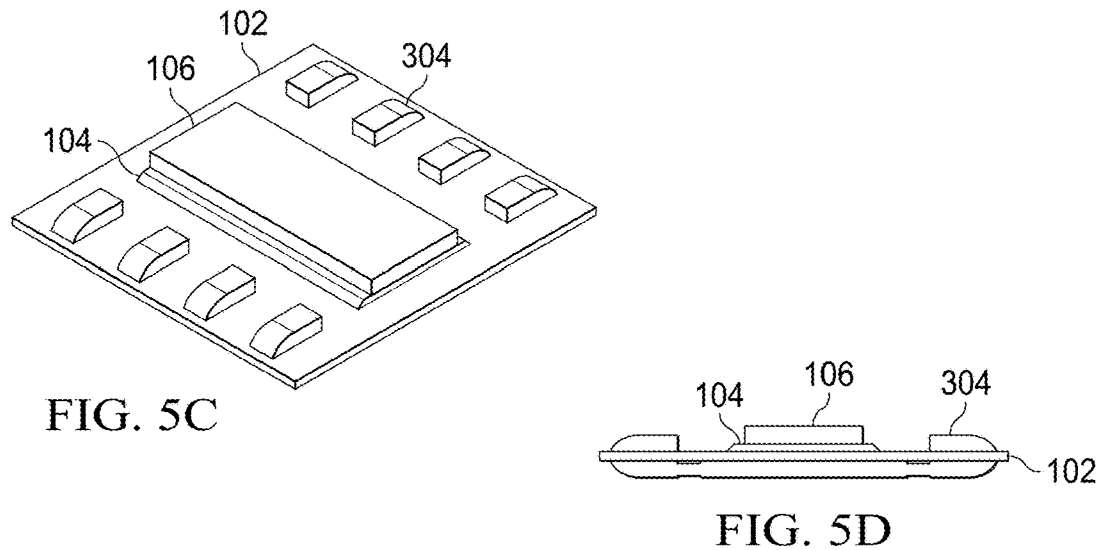
FIG. 5C
FIG. 5D
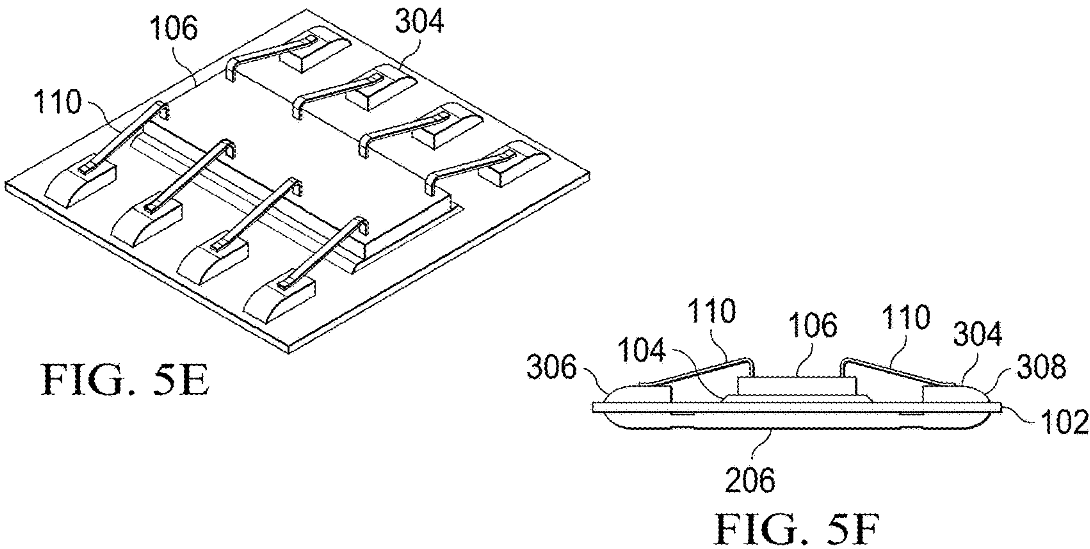
FIG. 5E
FIG. 5F

102

304
805
308
810
815
805
810
306
102

820
110
820
805
805
810
820
306
304
112
102
106
104
308
810

825
825
825
825
106
104
308
805
810
830
805
810
306
304
102

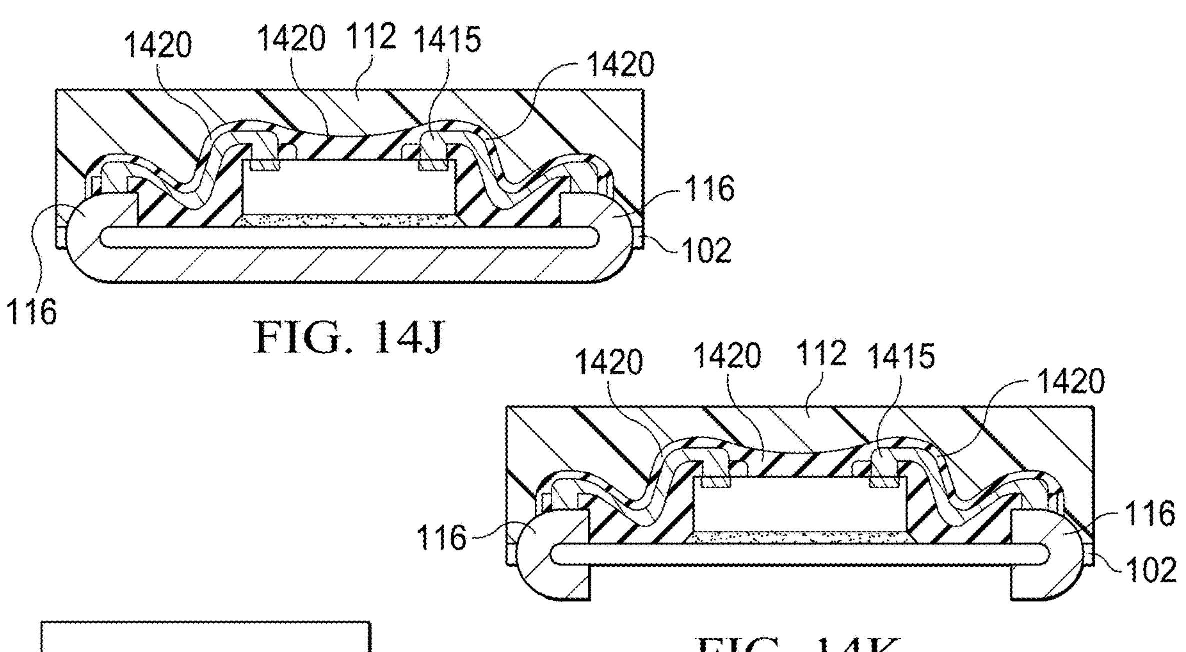
FIG. 14J
FIG. 14K
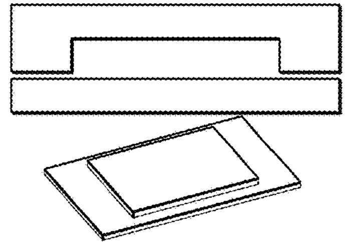
FIG. 14L
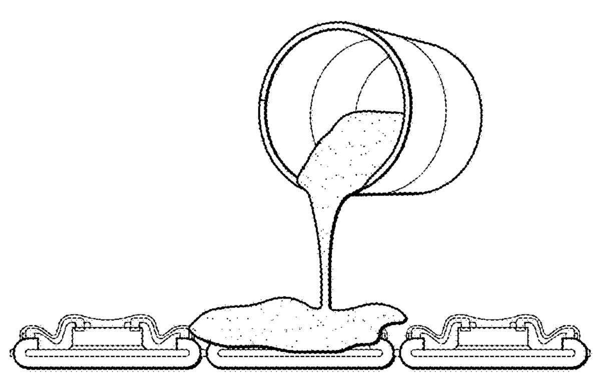
FIG. 14M
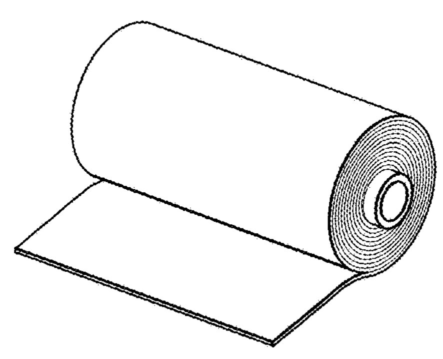
FIG. 14N
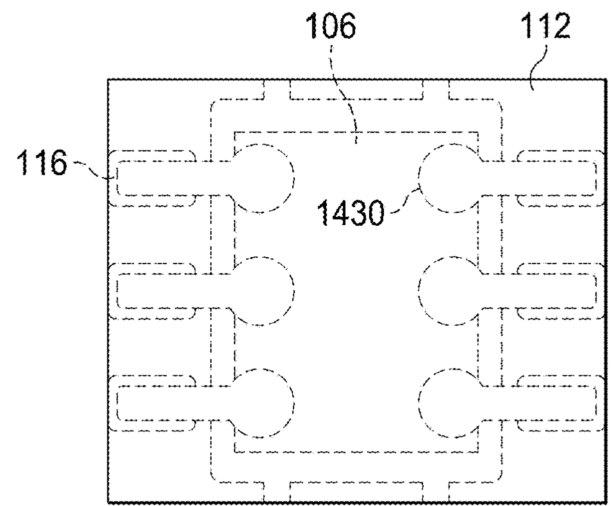
FIG. 14O

| pCLP STACKUP (mm) | | |
|---|---|---|
| a | SYMBOL | 0.030 |
| b | ENCAPSULATION | 0.200 |
| c | COVER INSULATION LAYER | 0.010 |
| d | CONDUCTIVE TRACE | 0.010 |
| e | FOUNDATION INSULATING LAYER | 0.010 |
| f | DIE | 0.200 |
| g | DIE ATTACH | 0.025 |
| h | BASE INSULATING LAYER | 0.050 |
| i | STANDOFF | 0.125 |
| j | LEAD | 0.125 |
| | | |
| T | TOTAL | 0.785 |

| pCLP STACKUP (mm) | | |
|---|---|---|
| a | SYMBOL | 0.030 |
| b | ENCAPSULATION | 0.200 |
| c | COVER INSULATION LAYER | 0.010 |
| d | CONDUCTIVE TRACE | 0.010 |
| e | FOUNDATION INSULATING LAYER | 0.010 |
| f | DIE | 0.200 |
| g | DIE ATTACH | 0.150 |
| h | BASE INSULATING LAYER | 0.050 |
| i | STANDOFF | 0.125 |
| j | LEAD | 0.125 |
| | | |
| T | TOTAL | 0.910 |

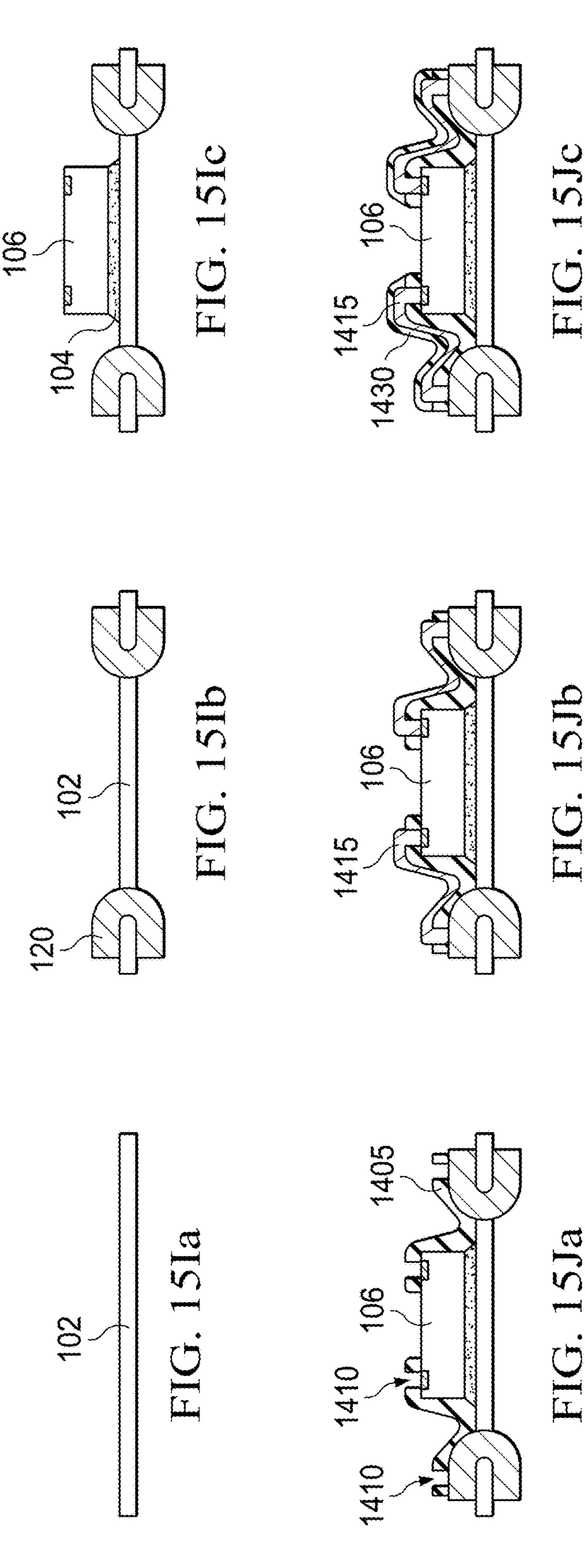
FIG. 15Ia
FIG. 15Ib
FIG. 15Ic
FIG. 15Ja
FIG. 15Jb
FIG. 15Jc
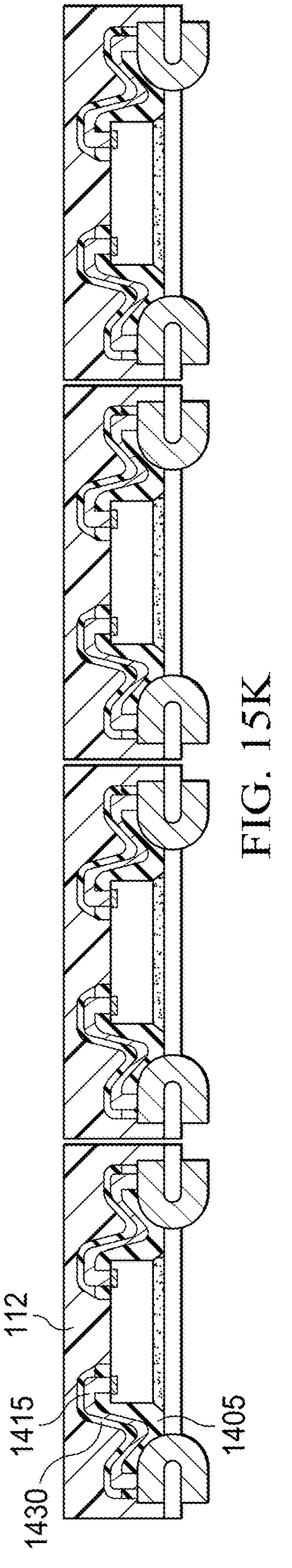
FIG. 15K 112
106
1435
1405
120

CONFIGURABLE LEADED PACKAGE

CROSS REFERENCE TO RELATED APPLICATIONS

This application is related to copending provisional application titled "PRINTED PACKAGE AND METHOD OF MAKING THE SAME, filed on Dec. 31, 2020, with the first named inventor Sreenivasan Kalyani Koduri, which is herein incorporated by reference in its entirety.

TECHNICAL FIELD

The present disclosure relates generally to semiconductor packages, and more particularly to a leaded package.

BACKGROUND

Semiconductor devices are packaged using a metal, plastic or ceramic package to protect the semiconductor device from impact, corrosion and moisture. Packages also provide a connection means between the semiconductor device inside the package and other electrical components outside the package.

Packages include metal connections that electrically connect the semiconductor device to the external world. These connections, known as leads, may be soldered to circuit boards or other external components. Packages that are molded around the semiconductor die, for example plastic packages, additionally provide a mechanical means to hold the leads in place.

The semiconductor die in the package is attached to a die attach pad of a lead frame, and electrically connected to the leads. A given package is limited by its lead frame configuration. An easily configurable lead frame design is desirable. Wire bonding has been a great interconnect process. However, it is running into its limitation due to the emerging needs for size, quality, manufacturability, and cost. An alternative approach is needed.

SUMMARY

A first aspect provides a semiconductor package. The semiconductor package includes a base insulating layer; a semiconductor die attached to a portion of the base insulating layer; and a first continuous lead electrically connected to the semiconductor die. The first continuous lead includes a first lateral extension on a first surface of the base insulating layer, a second lateral extension on a second surface of the base insulating layer, and a connecting portion between the first lateral extension and the second lateral extension. The connecting portion penetrates through the base insulating layer.

A second aspect provides a semiconductor package. The semiconductor package includes a base insulating layer; a lead including a first lateral extension on a first surface of the base insulating layer and a second lateral extension on a second surface of the base insulating layer, and a connecting portion between the first lateral extension and the second lateral extension. The connecting portion penetrates through the base insulating layer. A semiconductor die is attached to a portion of the first lateral extension and electrically connected to the lead.

A third aspect provides a semiconductor package. The semiconductor package includes a base insulating layer; a semiconductor die attached to a portion of the base insulating layer; and a first lead electrically connected to the semiconductor die. The first lead includes a first lateral extension on a first surface of the base insulating layer, a second lateral extension on a second surface of the base insulating layer, and a connecting portion between the first lateral extension and the second lateral extension. An end of the second lateral extension includes a recess.

A fourth aspect provides a method of manufacturing a semiconductor package. A first and second ends of a conductive pin having a first bend and a second bend is inserted through a base insulating material and causing a third bend and a fourth bend to form in the conductive pin. A portion of the conductive pin between the first bend and the second bend is then removed. Thereafter, the semiconductor die is attached to the base insulating material.

A fifth aspect provides a semiconductor package. The semiconductor package includes a conductive pin having a first bend and a second bend. The semiconductor package further includes a base insulating material where the conductive pin extends through the base insulating material. The first bend is on a first side of the base insulating material and the second bend is on a second, opposite side of the base insulating material. A semiconductor die is electrically connected to the conductive pin.

Other aspects and examples are provided in the Drawings and the Detailed Description that follows.

BRIEF DESCRIPTION OF THE VIEWS OF DRAWINGS

For a more complete understanding of the present disclosure, and the advantages thereof, reference is now made to the following descriptions taken in conjunction with the accompanying drawings, in which:

FIGS. 2A-2I illustrate various views of a base insulating layer and the construction of a continuous lead in the configurable leaded packages according to various examples.

FIGS. 3A-3D illustrate the process of making continuous leads from a wire according to various examples.

FIGS. 3E-3H illustrate various perspective views of a stapling pin set according to various examples.

FIGS. 5A-5H illustrate the process of making the configurable leaded package in FIG. 1A.

FIGS. 14A-140 illustrate various views of a printed configurable leaded package according to various examples.

Figure 15A:
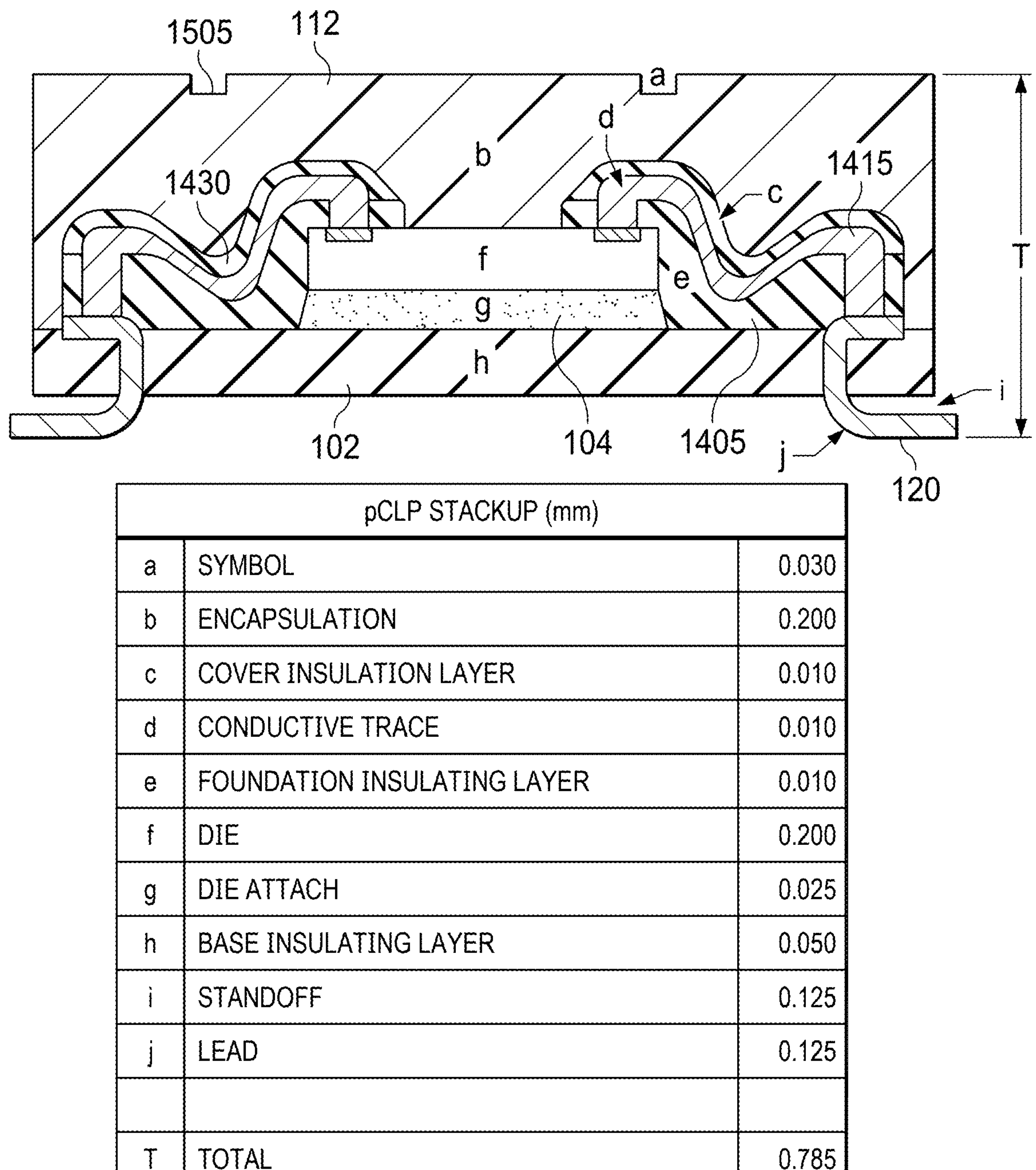
FIGS. 15A and 15B illustrate cross-sectional views of the printed CLP with dimensions of each component in the package.
Figure 15B:
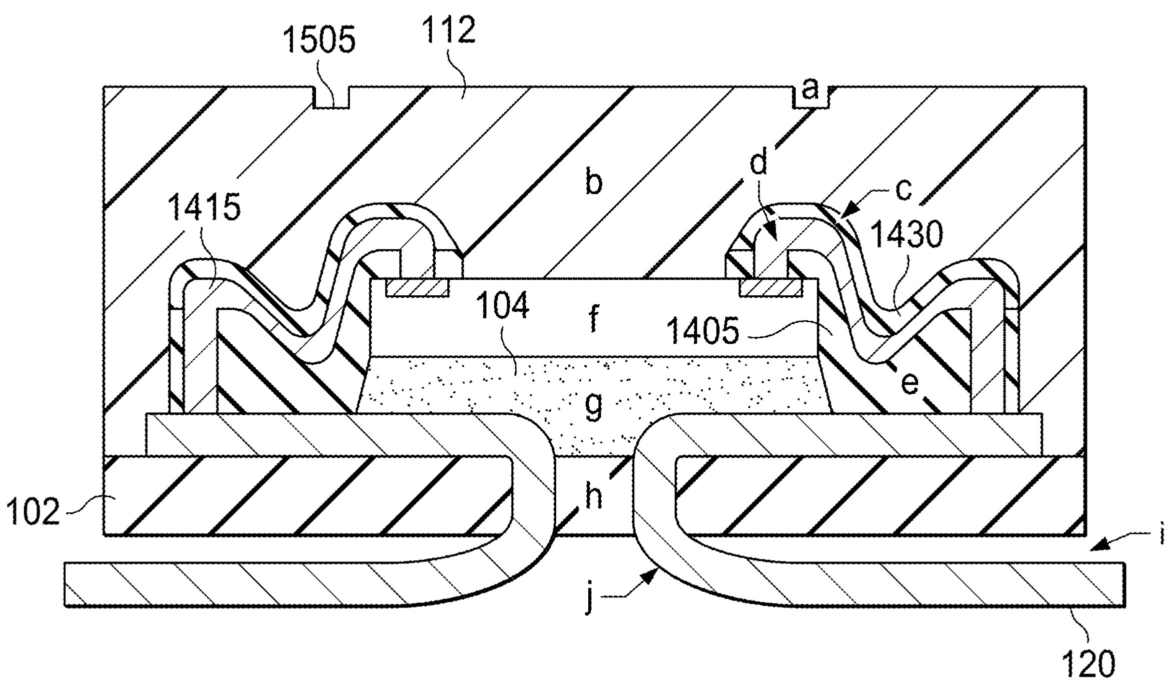
Figure 15C:
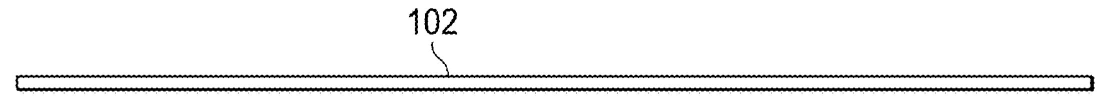
FIGS. 15C-15K illustrate various views of a printed configurable leaded package according to various examples.
Figure 15D:
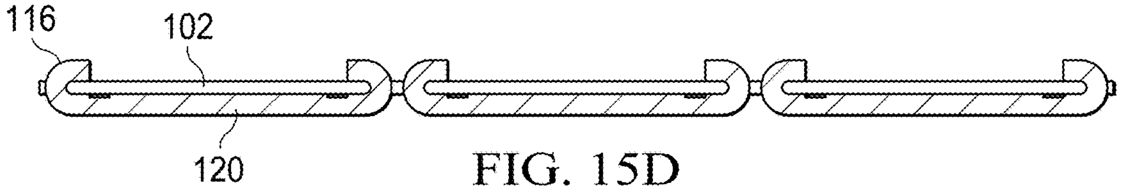
Figure 15E:
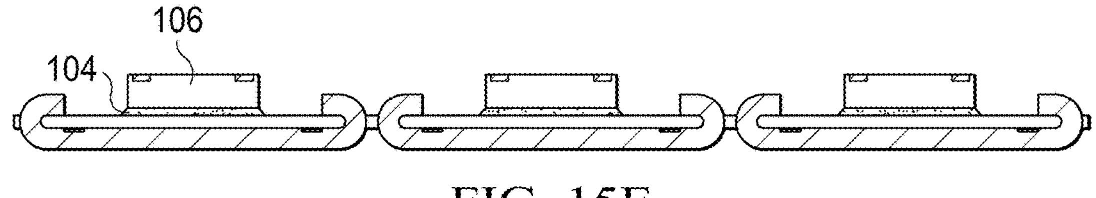
Figure 15F:
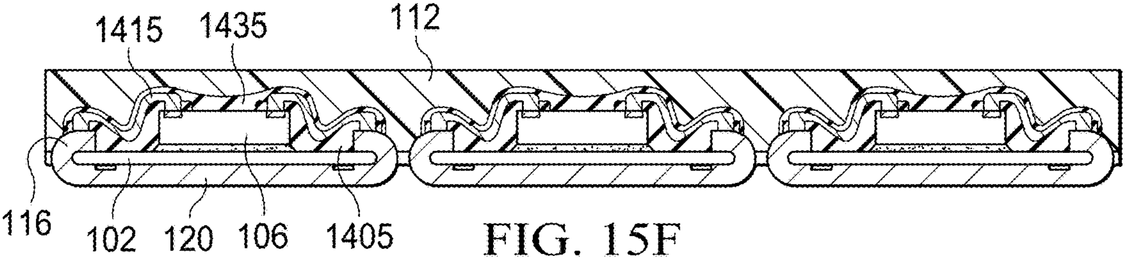
Figure 15G:
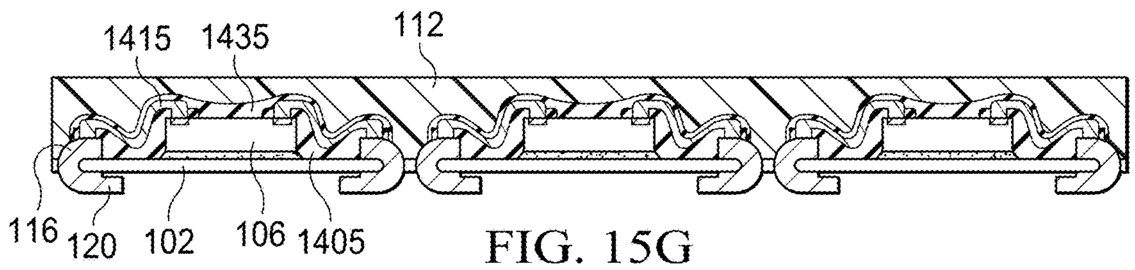
Figure 15H:
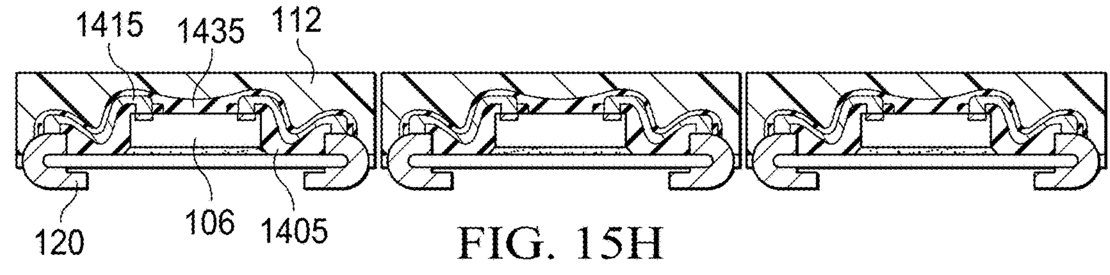
Figures 15L, 15M, 15N:
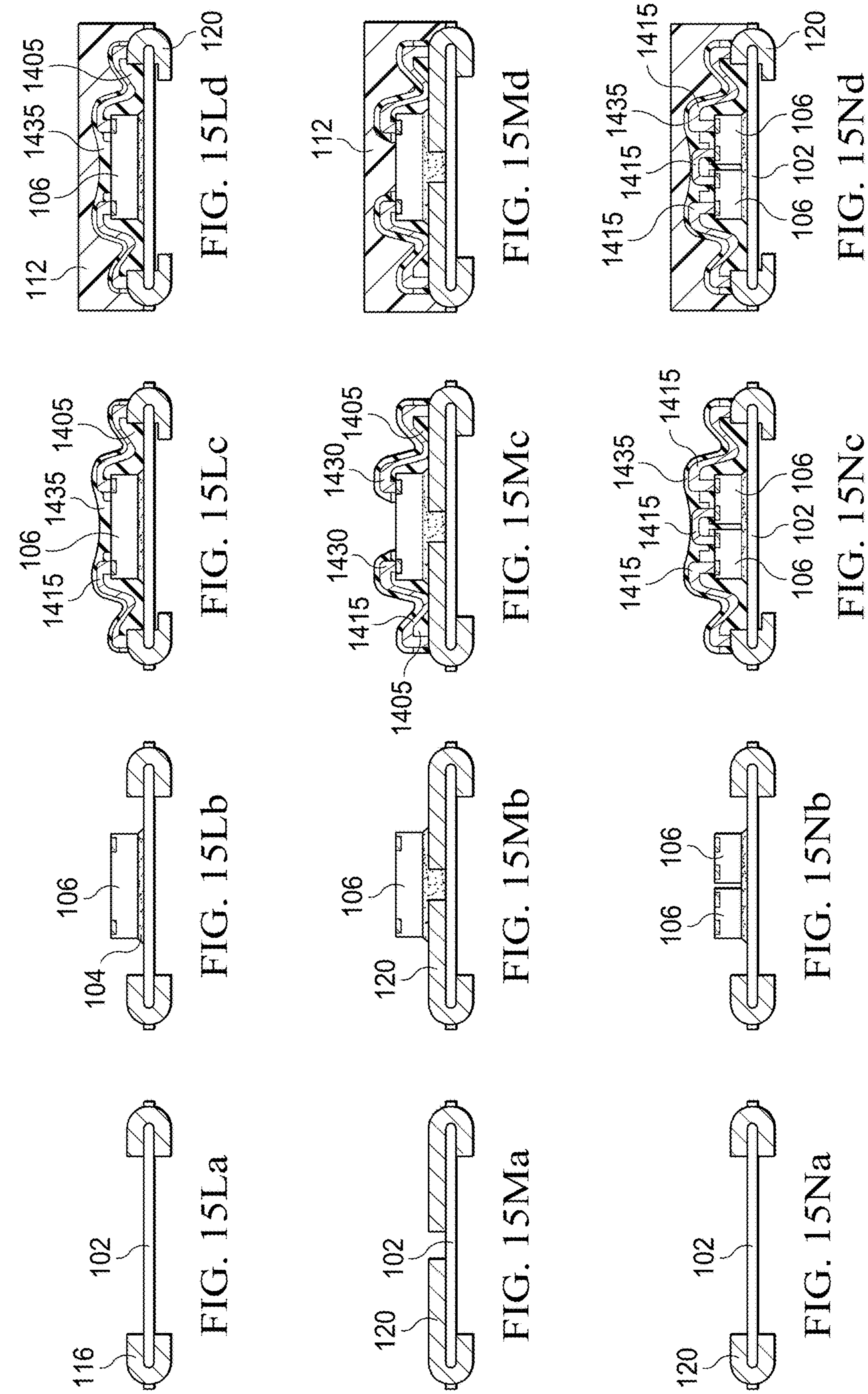

FIGS. 15La-15Ld illustrate various views of a printed configurable leaded package with a clamp according to an example.

FIGS. 15Ma-15Md illustrate various views of a printed configurable leaded package in a chip-on-lead configuration according to an example.

FIGS. 15Na-15Nd illustrate various views of a printed configurable leaded package with multiple dies according to an example.

FIGS. 16A-16D illustrate a process of constructing a pin interconnect package according to various examples.

FIGS. 17A-17G illustrate various examples of the pin interconnect package according to various examples.

FIGS. 18A-18F illustrate various perspective views of a through-hole version of a single-in-line pin interconnect package according to various examples.

FIGS. 19A-19D illustrate various perspective views of molded pin interconnect packages according to various examples.

Figure 20:
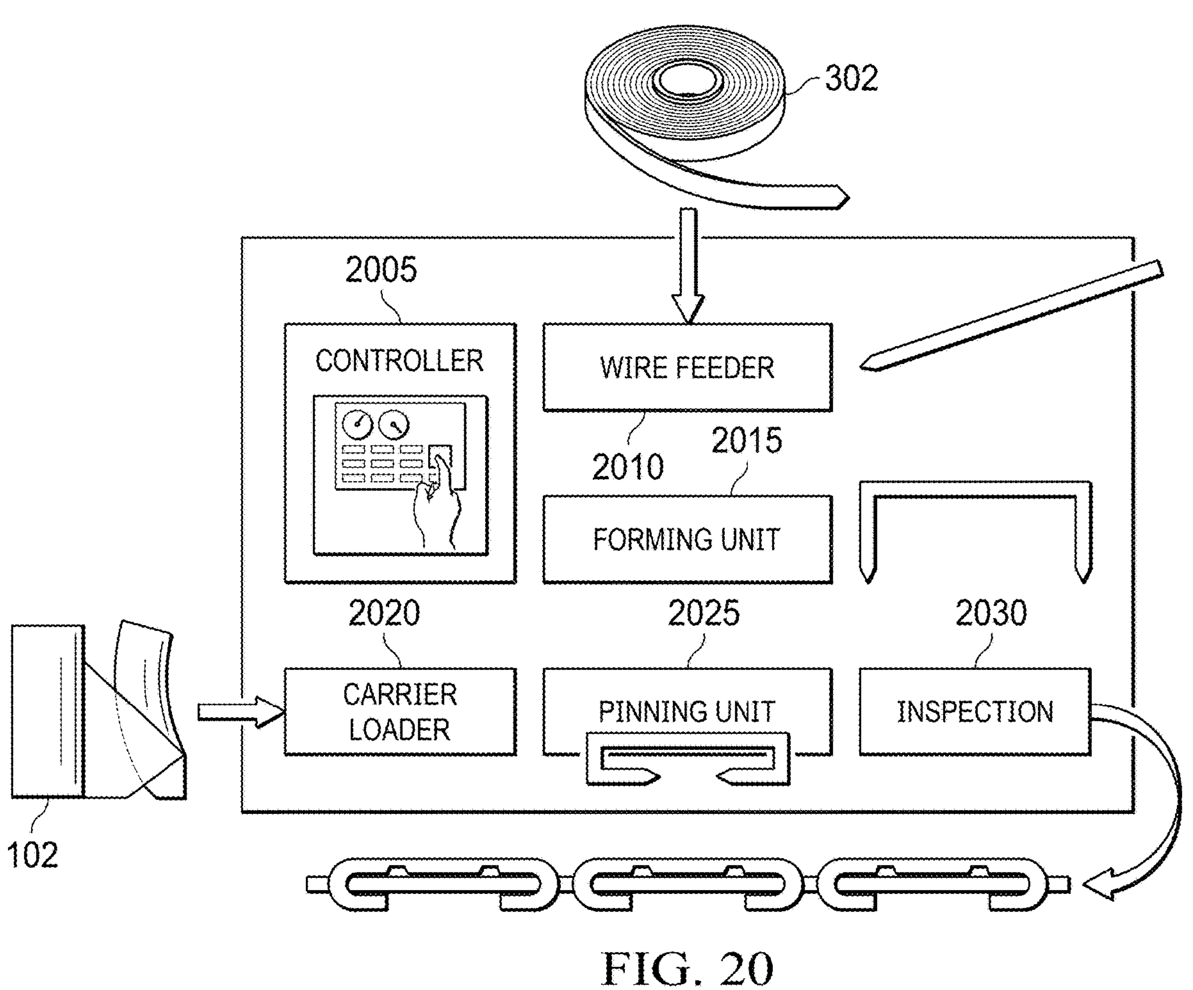

FIG. 20 illustrates a system or a tool to manufacture a configurable lead package according to various examples.

Figure 21:
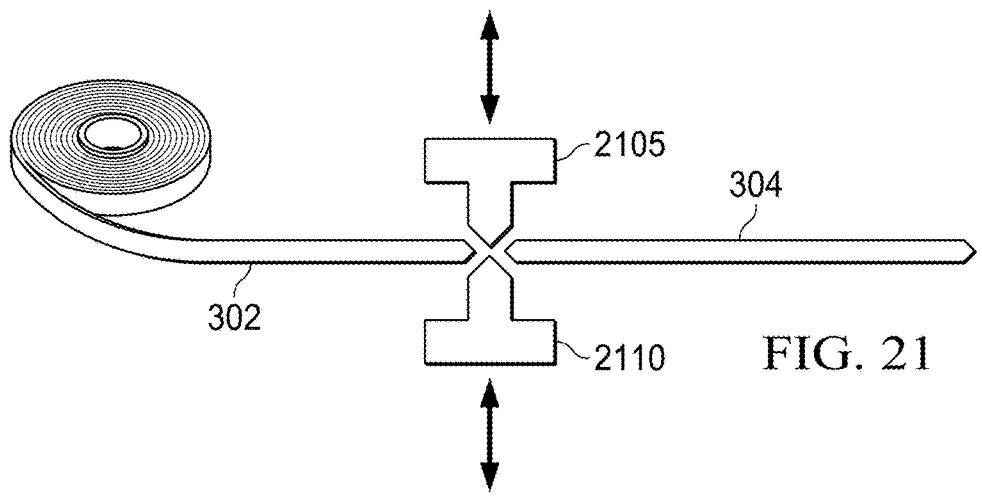

FIG. 21 illustrates details of a wire feeder of the system of FIG. 20.

Figure 22A:
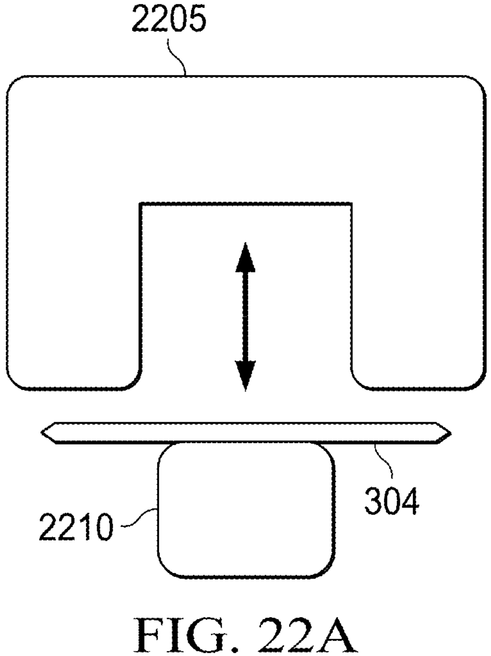
Figure 22B:
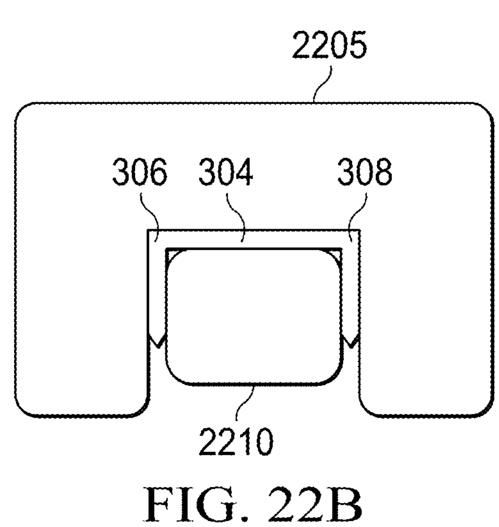

FIGS. 22A and 22B illustrate details of a forming unit of the system of FIG. 20.

Figure 22C:
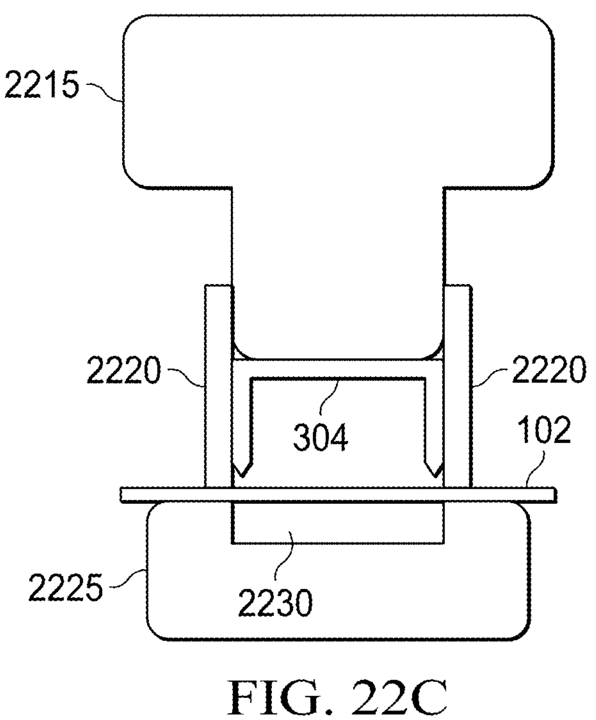

FIG. 22C illustrates details of a pinning unit of the system of FIG. 20.

Figure 23:
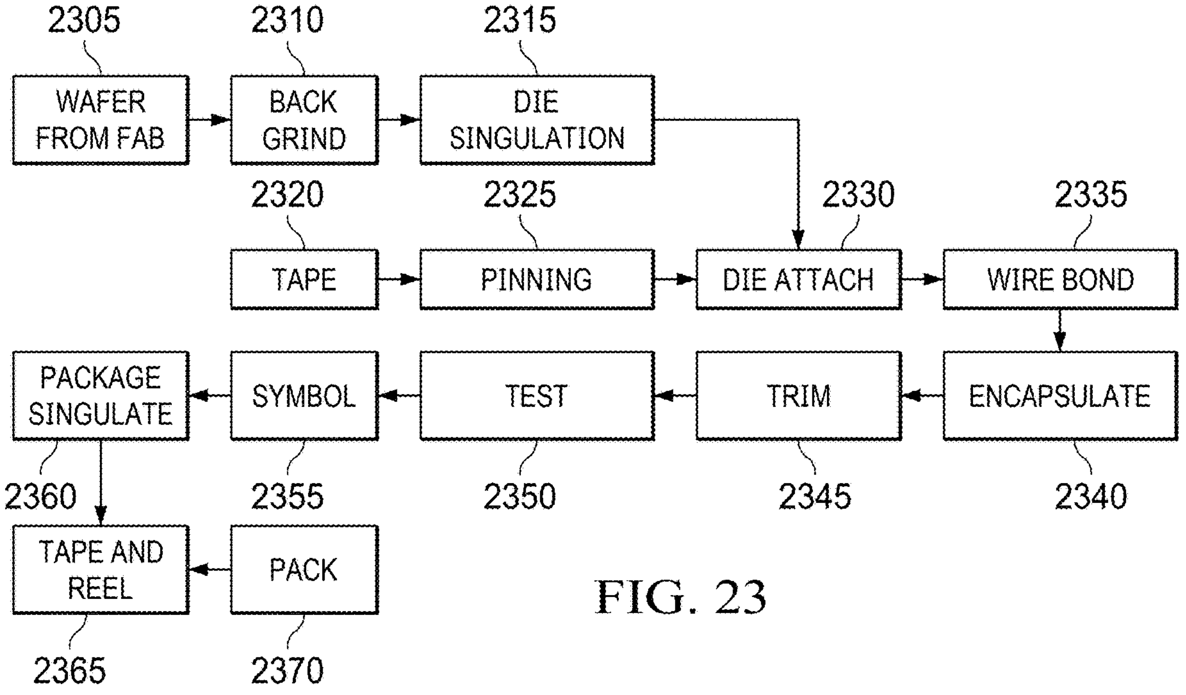

FIG. 23 illustrates a block diagram of a process flow of making the configurable leaded package according to various examples.

DETAILED DESCRIPTION

Industrial and high reliability applications prefer leaded packages. Thru-hole, Gull wing, and J-lead are such common package configurations. These packages come in configurations such as plastic dual in-line package (PDIP), small outline integrated circuit (SOIC) package, quad flat package (QFP), thin-shrink small outline package (TSSOP), micro small outline package (MSOP), small outline transistor (SOT) package, etc., with each of them standardized for body size, pin count, pin pitch, lead shape and lead. Ease of use and board level reliability (BLR) make these packages for applications that need long life and high reliability.

On the other hand, packages such as quad flat no-lead (QFN) package, wafer level chip scale package (WCSP), and ball grid array (BGA) packages have dominated the consumer and portable electronics. These newer generation packages provide smaller body sizes, broad flexibility on body sizes, pin counts and pin pitch options. Additionally, these packages are more manufacturing friendly with block molding or wafer level packaging with much lower cycle-times and tooling costs to create new variations. Marginal cost of tooling a new gull-wing package may well exceed $500,000 and several months for manufacturing, while a QFN variation would be below $50,000 and can be created in a few weeks.

Even with all these benefits, these leadless packages fall short of the reliability and usability requirements of harsh and industrial requirements. SOIC packages are offered with 1.27 mm pin pitch and 1.75 mm overall thickness, while the TSSOPs are standardized to 0.65 mm pin pitch and 1.2 mm max thickness. Both are generally tooled for distinct pin counts such as 8, 14, 16, 20, 24 pin etc. Once tooled, a good portion of the equipment and tooling is not shared across pin/package types because they are made for a specific package and locked into that package. While there is an occasional need to optimize leaded packages, such as 1 mm and 0.55 mm pin pitch, it is practically not possible to create such "odd size" solutions due to the manufacturing complexities including tool changes, limitations, and cost. Unfortunately, leadless or BGA packages do not always match the end application needs.

A new package design and manufacturing process is disclosed here to address the limitations of the available leaded packages. This new package design provides the manufacturing flexibility of leadless packages along with the reliability of leaded packages. Unlike the available lead frames or package substrates, the lead frame is proposed to be custom built in a unique new method. At a high level, the process of making the new configurable leaded package starts with a blank insulating substrate. Onto this, pins, leads, or continuous leads are inserted/stapled/clamped at desired locations. These pins can be flexibly configured to create desired footprints. If the blank insulating substrate or blank insulating layer is a flexible base film, then a carrier can be used to hold it stretched, or use it in a reel to reel configuration. By placing the pins under the package, full entitlement of lead frame density is achieved even for the leaded packages. Due to the inherent configurability, multiple package sizes, pin counts, pin pitches can be created easily. The configurable leaded package eliminates the need to inventory large number of lead frame variations and dedicated package production lines for a specific pin/package types.

On the top side of the pinned blank insulating layer, the die is attached and wire bonded to the leads prior to molding. Then the pins on the bottom side can be singulated, if needed, thus creating J-lead, C-lead, or gull-wing leads from the bottom side of the package. Such design yields to variable pin sizes, pitch, package sizes, along with block molding with full utilization of strip and no loss of space between packages for pins. Maximum units/strip possible is achieved, along with leaded package structure with this process.

In various examples, a base insulating layer or base insulating material (used interchangeably hereinafter) includes an insulating layer, having a portion exposed from the semiconductor package that provides mechanical support for the semiconductor die within the semiconductor package. The base insulating layer includes a flexible layer or a semi-rigid layer with flexibility or a tensile strength between 40-50 N/cm. Other material properties and characteristics of the base insulating layer include 180 degree peel adhesion of approximately 2.4 N/cm, elongation at break of approximately 37%. It is noted that the base insulating layer does not include any conductor within other than the connecting portion of a continuous lead, a lead, or a conductive pin. Examples of the base insulating layer include a polyimide material, a Kapton tape, a fiber cloth, a fiber board, a glass cloth, a back grind tape, a plastic plate, or a pre-molded blank.

In various examples, a uniform construction of the lead, a pin or a conductive pin includes a structure made as a single unit without any joints in between. For example, the lead according to various examples includes no joints between the first and second lateral extensions and the connecting portion. In other words, the lead is formed in a single process and therefore forms a single unit without any sign of materials formed at different times in the process. In this example, plating or coating layers over the base material of a pin or a conductive pin that affects corrosion, oxidization, wettability, and bondability, adhesion are not considered materials formed at different times in the process.

In various examples, a lead, a continuous lead, or a conductive pin includes a conductive structure shaped to have a first lateral extension, a second lateral extension parallel to the first lateral extension, and a connecting portion between the first lateral extension and the second lateral extension. The pin includes characteristics and shape reflective of bending a linear structure (a single unit without any joints in between forming the uniform construction) to form the first and second lateral extensions and the connecting portion in between. For example, the first and second lateral extensions include a bend near the connecting portion forming a suitable shape of the lead, continuous lead, or the conductive pin.

In various examples, a portion of the lead, a continuous lead, or a conductive pin includes an external lead of the semiconductor package that is attachable to a printed circuit board. This portion referred to as the second lateral extension includes features of solder wettability and adhesion promotion that enables attachment to solder or other conductive adhesives and to attach to a PCB or inserted into a socket with contacts.

In various examples, the semiconductor die includes a semiconductor substrate with various conducting layers forming a functional circuitry. A top metal layer of the semiconductor die includes bond pads. It is noted that the semiconductor die can be replaced with other electrical components in various examples, for example an inductor which is electrically connected to the lead, and are within the scope of this disclosure.

In various examples the liquid to be deposited can be referred to as ink and as used herein the term "ink residue" can include cured ink, which could be of dielectrics, insulating materials, conductive materials, adhesives, and polymers as used in the arrangements.

In various examples, elements of the arrangements are described as "parallel" to one another when the elements are intended to lie in planes that, when extended infinitely, will not meet. However, the term parallel as used herein also includes substantially parallel to indicate surfaces that may slightly deviate in direction due to manufacturing tolerances, if the two surfaces generally lie in planes that are spaced apart and would not intersect when extended infinitely when the surfaces were made without these deviations, the surfaces are also parallel. Parallel surfaces extend in a direction side by side and do not meet.

FIGS. 1A-1H are cross-sectional views of configurable leaded packages according to various examples.

Figures 1A, 1B, 1C, 1D, 1E, 1F, 1G, 1H:
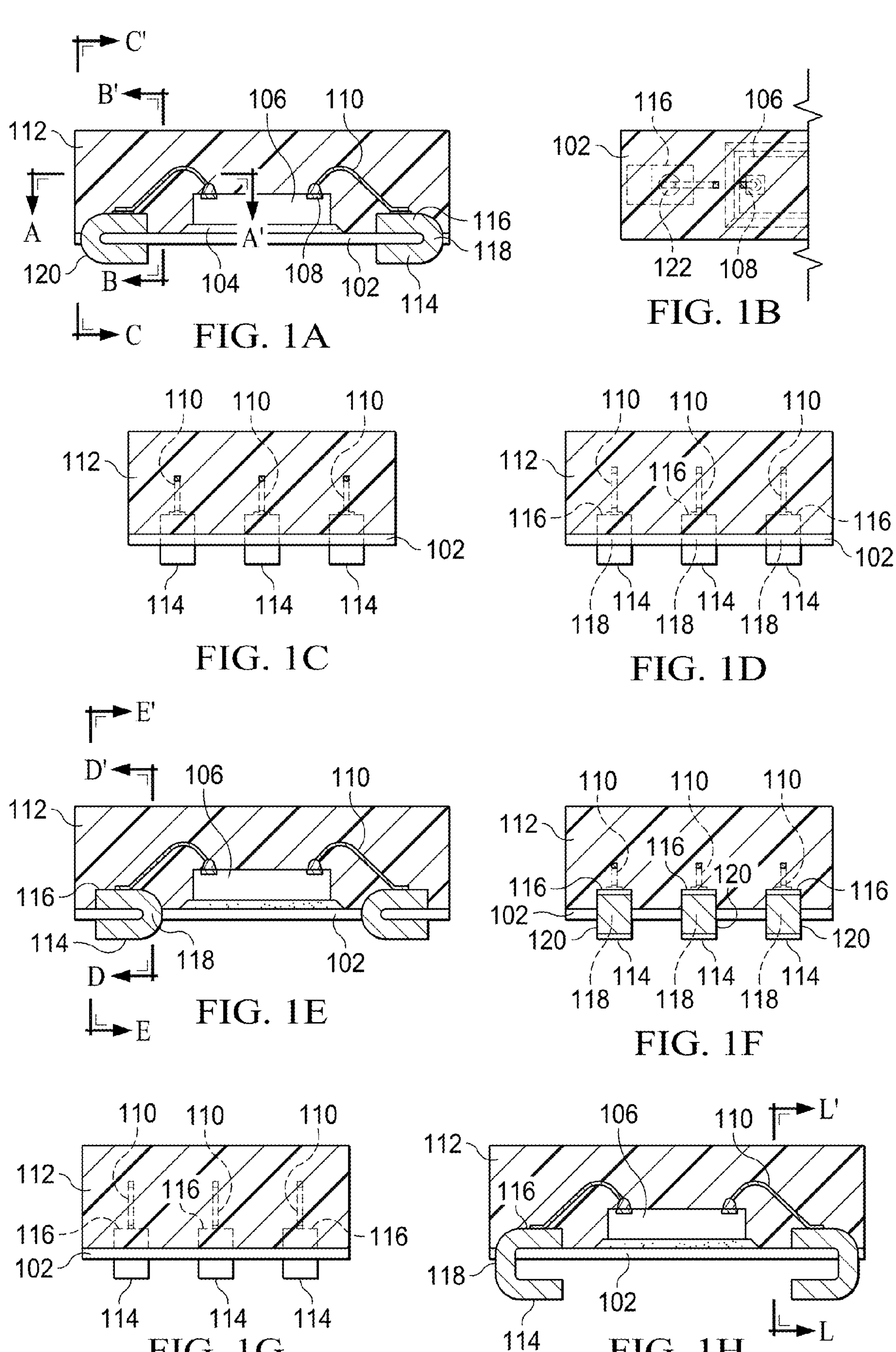
FIGS. 1A-1W illustrate various views of configurable leaded packages according to various examples.

Referring to FIG. 1A, a cross-sectional view of a configurable leaded package with a C type lead. C type refers to the shape of the lead, resembling to the alphabetical letter C, from a cross-sectional view of the semiconductor package. The semiconductor package includes a semiconductor die 106 attached to a base insulating layer 102 via a die attach material 104.

Figures 2A, 2B, 2C, 2D, 2E, 2F, 2G, 2H:
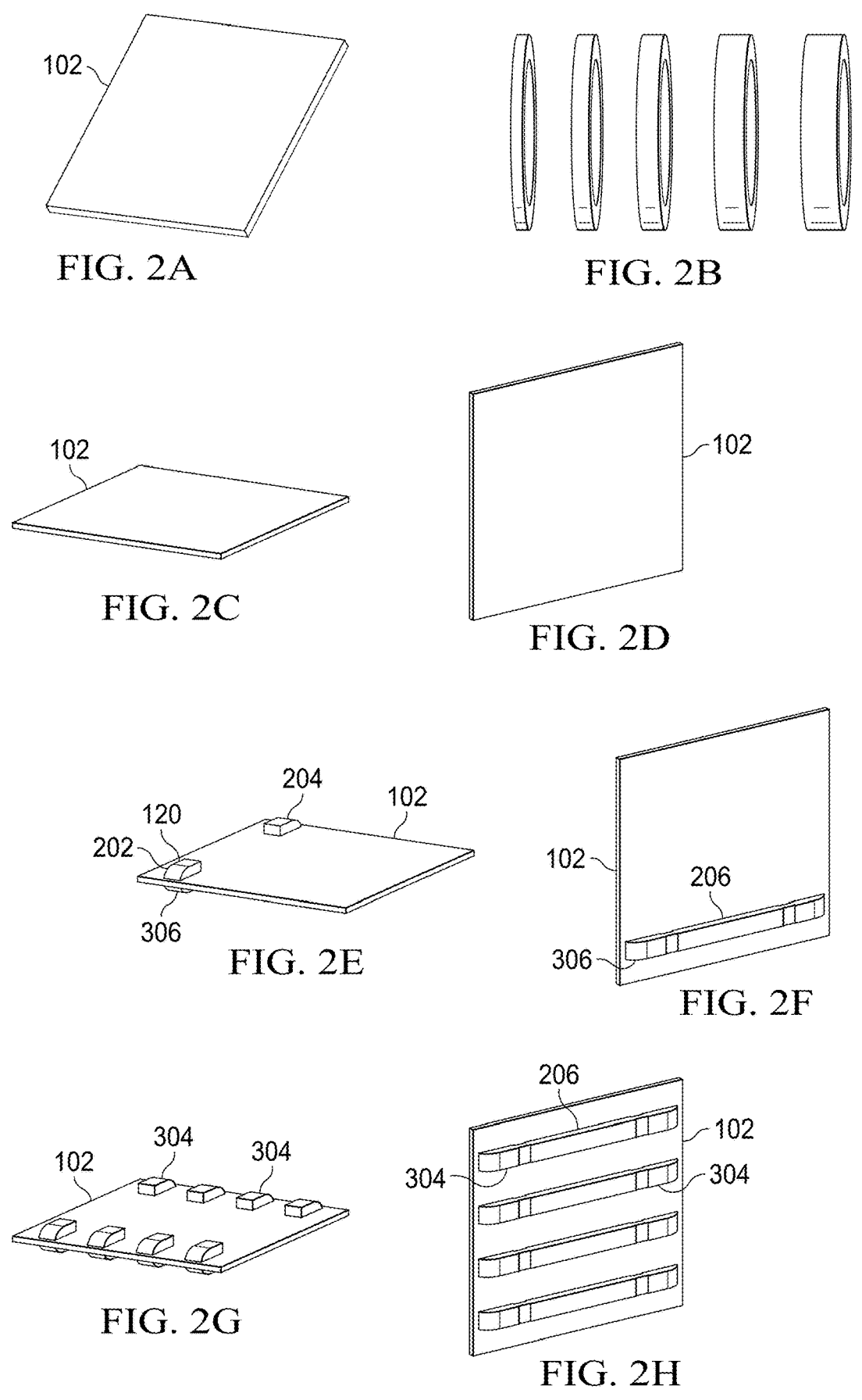

The semiconductor die 106 includes multiple bond pads 108 on the top side. A conductor is attached to each of the bond pads. In this example, the conductor is a bond wire 110. The bond wire 110 includes copper with or without plating, gold, aluminum, silver, or other suitable conductors. Wire bonding uses a combination of downward pressure, ultrasonic energy, and in some cases heat, to make a weld or bond. A ball bond is used to connect one end of the bond wire 110 to the bond pad 108 using thermosonic bonding. The other end of the bond wire 110 is attached to a continuous lead 120. It is noted that only two continuous leads 120 (first continuous lead on the left side of FIG. 1A or the second continuous lead on the right side of FIG. 1A) are shown in FIGS. 1*a*-1*h*. There are several continuous leads 120 present in the package as shown in other examples (FIGS. 2G and 5E, etc.).

In wire bonding, a wire is disposed in, and gripped by, a bonding head of an automatic wire-bonding tool. Bonding head may be any suitable size and shape and may be formed from any suitable material. Bonding head includes a wire passage, also known as a "capillary," that is configured to accept a suitable wire. Wire passage may have any suitable profile and may be formed in bonding head in any suitable manner. After wire passage, a bonding ball is formed by using an instantaneous electrical spark or a small hydrogen flame to melt the tip of bond wire 110 to form a bonding ball. The bonding head is then positioned over the die using a computer controlled apparatus, such as a robotic arm, to position bonding head, and thus wire and bonding ball, over each of the bond pads. Heat is applied to bonding ball to soften ball. After application of heat, the bonding head moves towards the bond pad, thereby pressing the heated bonding ball against bond pad, causing the bonding ball to at least partially flatten against bond pad, forming a bond between the bond wire 110 and the bond pad 108. This type of bonding is referred to as "thermo-compression" bonding.

In an alternate example, a pulse of ultrasonic energy may be applied to the ball. This additional energy is sufficient to provide the heat necessary to soften bonding ball so that it may be pressed against and bond with the bond pad 108. This type of bonding is referred to as "thermosonic" bonding. Although thermos-compression and thermosonic bonding methods are discussed above, any other appropriate method for bond pads 108 and bonding ball can be implemented.

In the thermosonic bonding, one end of the bond wire 110 forms a ball bond, to the bond pad 108, and the other end forms a wedge bond. After ball bonding to the bond pad 108, the bonding head moves towards the continuous lead 120. As bond wire 110 comes into contact with a surface of the continuous lead 120, bonding head deforms bond wire 110 against the continuous lead 120, which creates a wedge-shaped bond that has a gradual transition into the bond wire 110.

Instead of a wire bond, in one example, a ribbon bond is used that electrically connects between the bond pad 108 and the continuous lead 120. In another example, the conductor includes a conductive trace that makes the electrical connection between the bond pads 108 and the continuous leads 120. The conductive trace (as illustrated in FIG. 14D) includes a conductive material deposited using any suitable depositing techniques including printing. Various depositing techniques includes sputtering, Sol-gel technique, chemical bath deposition, spray pyrolysis technique, electroplating technique, electroless deposition, chemical vapor deposition, sputtering techniques, and printing techniques. If printed, the conductive material in the conductive trace is in the form of an ink residue that is cured. Printing of a conductive trace is described in more detail in copending provisional application titled "PRINTED PACKAGE AND METHOD OF MAKING THE SAME, filed on Dec. 31, 2020, with the first named inventor Sreenivasan Kalyani Koduri. Various printing techniques such as inkjet printing, screen printing, 2D or 3D printing, spray printing, aerosol jet printing, evaporation printing, micro contact printing, and nano-imprint lithography, are described therein and can be used to create the conductive trace.

The continuous lead 120 includes two lateral extensions 114 and 116 and a connecting portion 118 connecting the two lateral extensions 114 and 116. A first lateral extension 116 is on and contacting a top surface of the base insulating layer 102, and a second lateral extension 114 is on and contacting a bottom surface of the base insulating layer 102. The connecting portion 118 between the first lateral extension 116 and the second lateral extension 114 penetrates through the base insulating layer 102. In various examples, "penetrating" includes the connecting portion 118 piercing through the base insulating layer 102, which has characteristics of actions including pressing the continuous lead 120 to pierce through the base insulating layer 102. Thereafter the continuous lead is bent near the ends it to form a desired shape.

Figures 4A, 4B:
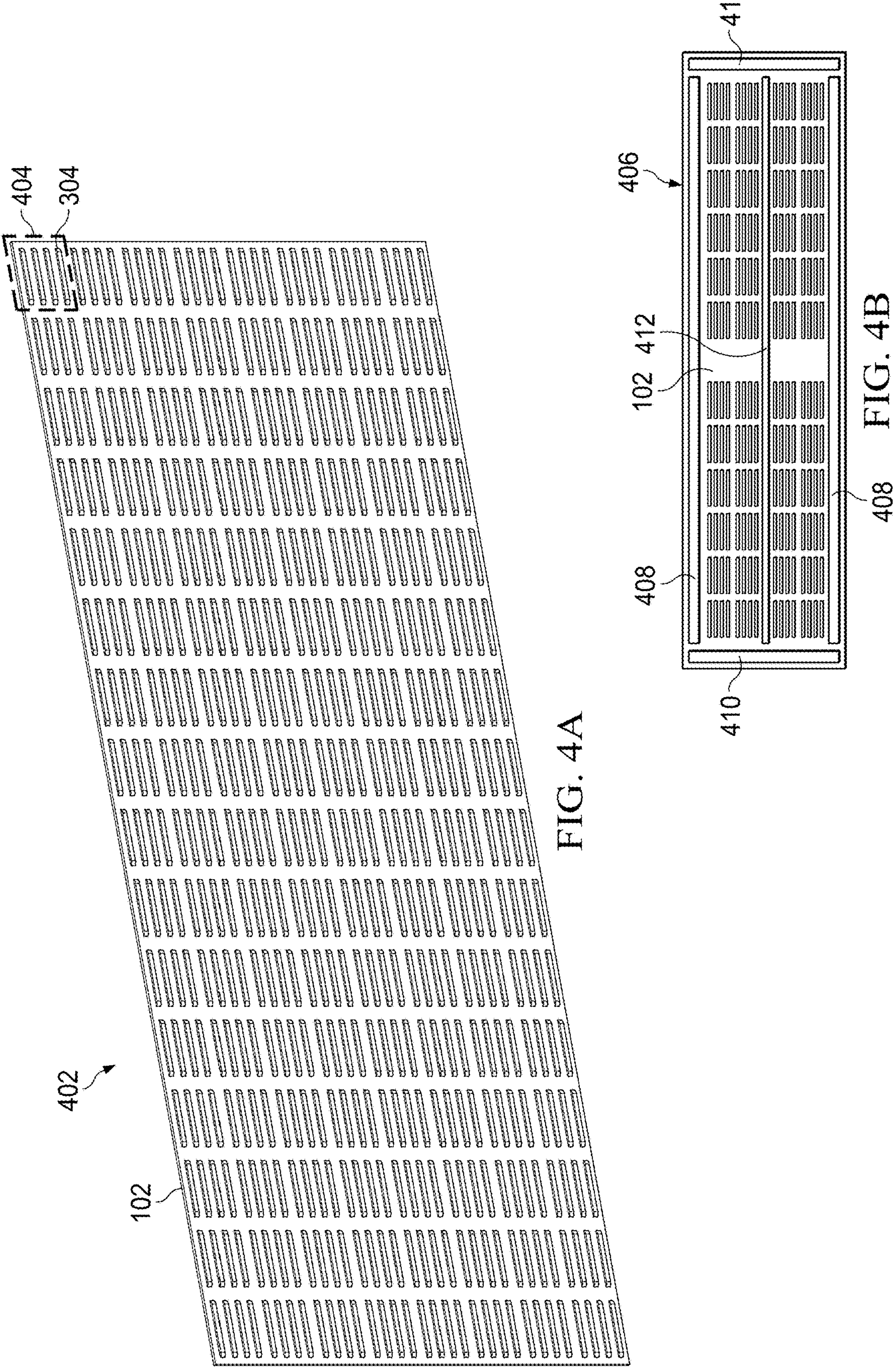
FIG. 4A illustrate a base insulating layer with a matrix of conductive pins 304 inserted, and formed as a lead frame or a panel.
FIG. 4B illustrates the base insulating layer with stiffening pins according to various examples.

The first and second lateral extensions 116, 114 include a bend near the connecting portion 118. The bend is reflective of an action that creates the first and second lateral extensions 116, 114 and the connecting portion 118 from a linear shape of the continuous lead 120. In various examples, of FIG. 1A-1W, the bend includes an angle between 20 and 60 degrees from a line normal to a plane along a surface of the base insulating layer 102. An encapsulation material 112 covering portions of the base insulating layer 102, the semiconductor die 106, and the continuous lead 120 is shown in FIG. 1A. The encapsulation material 112 includes one of a mold compound such as epoxy, insulating film, and sprayed insulative coat with suitable chemistry and properties that can be applied using 3D printing, scribe dispense, screen printing, spray coating, spin coating, dipping, dam-and-fill, A-B multipart casting (which uses an epoxy and a hardener), glazing, roller painting, brush painting, casting, potting, and filling. A full lead frame strip as shown in FIG. 4A can be block molded at a time and then cured. Alternatively, a large portion of the lead frame strip can be molded.

FIGS. 1B-1D illustrate various cut away views of the package of FIG. 1A. FIG. 1B illustrates the cut away view along the line A-A' looking from the top showing the shape of the first lateral extension 116. FIG. 1B illustrates the top surface of the first lateral extension 116 with the bond wire 110 connecting to the surface via a ball bond 122. One end of the first lateral extension 116, which is proximate to the semiconductor die 106 includes edges that are approximately right angled from the top view. The other end of the first lateral extension 116 is approximately right angled from the top view, however, a cross-sectional thickness of the same varies due to the bend as shown in the cross-sectional view in FIG. 1A.

FIG. 1C illustrates the cut away view along the line B-B' looking from the side showing the shape of the first lateral extension 116 and the second lateral extension 114. Only the edges of the first and second lateral extensions 116, 114 are visible in this view. The connecting portion 118 is not visible, as it is penetrating through the base insulating layer 102. An encapsulation material 112 covering portions of the base insulating layer 102, the semiconductor die 106, and the continuous lead 120 is shown in FIG. 1C. The encapsulation material 112 includes one of a mold compound such as epoxy, insulating film, and sprayed insulative coat, encapsulating laminates, and encapsulating liquids.

The material of the continuous lead 120 includes, but not limited to, iron, nickel, cobalt, copper, copper alloys, aluminum, aluminum alloys, or iron-nickel alloys or an alloy of two or more of these metals. In one example, the continuous lead 120 includes a base material coated with a conductive material that impacts oxidization of the base material. Examples of the base material include copper or cobalt, copper, copper alloys, aluminum, aluminum alloys, or iron-nickel alloys. Examples of the conductive material that impacts oxidization of the base material includes plating layers of nickel, palladium, silver, or an alloy of these metals. For example, the plating layers include NiPdAu, NiPd, NiPdAgAu, Ag spot, Cu, NiSn, or Sn, and or plated electroless materials including immersion gold, electroless nickel electroless palladium immersion gold (ENEPIG), etc. Optionally the material of the continuous lead 120 can be CuNi, CuCr, CuNiMn alloys with no post plating. The finish of the plating layers can additionally be roughened to increase adhesion between the continuous lead 120 and any component that gets attached to it. Electrolytic deposition or other suitable techniques can be employed to create the plated layers on the base material. In addition to preventing oxidization of the base material, these coatings enhance wettability during the soldering process when the package as in FIG. 1A is attached to a printed circuit board (PCB).

FIG. 1D illustrates the cut away view along the line C-C' of FIG. 1A, looking from the side showing the connecting portion 118 between the first lateral extension 116 and the second lateral extension 114. The base insulating material 102 and the encapsulating material 112 are visible from this view. A portion of the bond wire 110 can be seen extending from the first lateral extension 116.

Referring now to FIG. 1E, a cross-sectional view of a configurable leaded package, with a C type lead that is inverted compared to the C type lead in FIG. 1A, is illustrated. The edges of the C type lead in this example face away from the semiconductor die 106. Similar components are referenced with similar reference numerals as in FIG. 1A, and are not repeated.

FIG. 1F illustrates the cut away view along the line D-D' of FIG. 1E, looking from the side showing the connecting portion 118 between the first lateral extension 116 and the second lateral extension 114. The base insulating material 102 and the encapsulating material 112 are visible from this view. FIG. 1G illustrates the cut away view along the line E-E' of FIG. 1E, looking from the side showing the connecting portion 118 between the first lateral extension 116 and the second lateral extension 114. The base insulating material 102 is visible in between the first lateral extension 116 and the second lateral extension 114 indicating that the connecting portion 118 (not visible from this view) is penetrating the base insulating material 102. The encapsulating material 112 and a portion of the bond wire 110 extending from the first lateral extension 116 are visible from this view.

Referring now to FIG. 1H, a cross-sectional view of a configurable leaded package, with a J type lead is illustrated. The connecting portion 118 and the second lateral extension 114 together forms a J shape, therefore, referred to as J type lead. It is noted that the first lateral extension 116 includes a bend that is adjacent to and touching the base insulating material 102. The angle of the bend creates a standoff or a space between the bottom surface of the base insulating material 102 and the second lateral extension 114. The first lateral extension 116 is seen touching the top surface of the base insulating material 102. J-leads are more resilient, as they allow more shock absorbing capability once the package is attached to the PCB. This reduces problems of thermal mismatch between the PCB and the package, which can cause reliability issues for the product. The mechanical flexibility of the J-lead which provides protection against problems of thermal expansion is a result of its shape. Further, the second lateral extension 114 provides more surface area for solder to be attached when connected to the PCB. This feature increases the electrical connection reliability of the overall package. Other components illustrated in FIG. 1H such as bond wires 110, the semiconductor die 106 are referenced with similar reference numerals as in FIG. 1A. The properties, connections, and functions of those components are the same as in FIG. 1A and are not repeated.

Figure 1I:
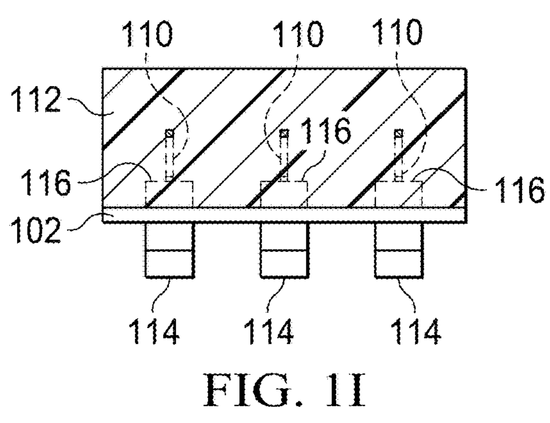

FIG. 1I illustrates the cut away view along the line F-F' of FIG. 1H, looking from the side showing the base insulating layer 102 between the first lateral extension 116 and the second lateral extension 114. The second lateral extension 114 from this view includes the edges or distal ends of the J type leads and the bend within the second lateral extension 114 that creates the standoff space between the base insulating layer 102 and the second lateral extension 114. Bond wires 110 and the encapsulating material 112 are visible from this view.

Figure 1J:
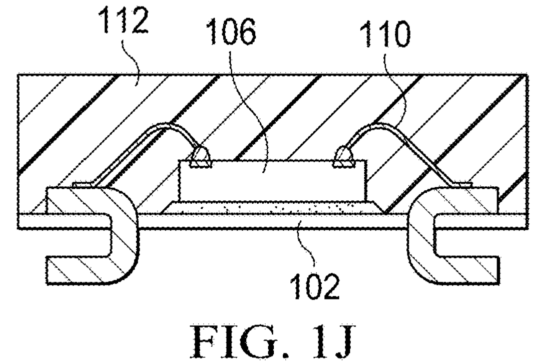

Referring now to FIG. 1J, a cross-sectional view of a configurable leaded package, with a J type lead that is inverted compared to the J type lead in FIG. 1H, is illustrated. The edges of the J type lead in this example face away from the semiconductor die 106.

Figure 1K:
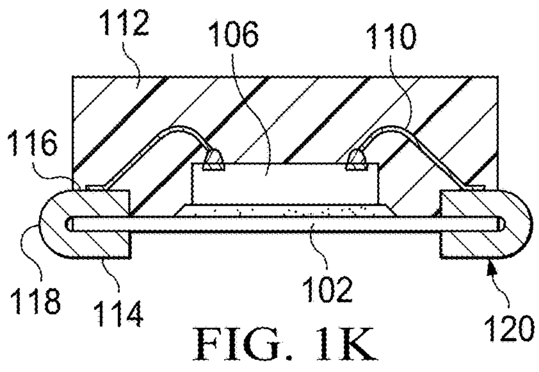

FIG. 1K illustrates a cross-sectional view of a configurable leaded package, with a J type lead with the interconnecting portion outside of the encapsulating material 112. In this example, the second lateral extension 114 contacts the bottom side of the base insulating layer 102. The connecting portion 118 contacts a side of the base insulating layer 102 such that the connecting portion 118 projects from the sides of the package in the cross-sectional view. The interconnecting portion 118 is not penetrating the base insulating layer 102 in this example. Instead, the interconnecting portion 118, and therefore the continuous lead 120, clamps to the base insulating layer 102 from three sides. In applications that require a complete automatic visual inspection (AVI) post assembly, or after the package is attached to the PCB (for example in automotive industry applications) this package offers the wettable flank capability. The wettable flank process was developed to resolve the issue of side lead wetting of leadless packaging for automotive and commercial component manufacturers. Yield issues from false assembly failures, along with poor solder joints affects the realibility of the package and its operation. One way to ensure reliability is to inspect the solder joints between the leads and the PCB. With the projected connecting portion 118 from the sides of the package, this type of projected C lead enables automatic visual inspection that increases reliability of the package on the PCB.

Figure 1L:
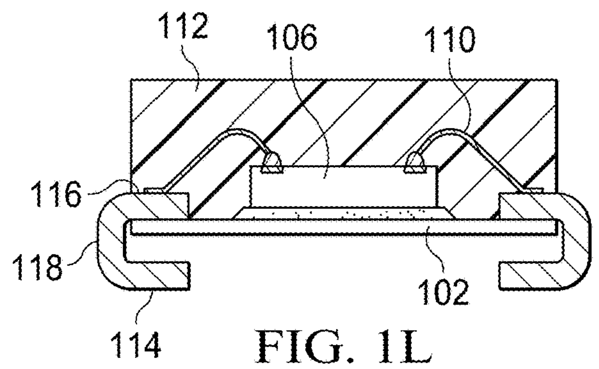

FIG. 1L illustrates a cross-sectional view of a configurable leaded package, with a J type lead with the interconnecting portion 118 outside of the encapsulating material 112, and the second lateral extension 114 creating a space between the bottom of the base insulating layer 102 and the second lateral extension 114. As in the package of FIG. 1H, this package allows for improved shock absorbing capability once the package is attached to the PCB.

The configurable leaded packages illustrated in FIGS. 1A-1L illustrate the edges of the leads to be straight, or in other words, at a 90 degree angle with respect to surfaces of the first or second lateral extensions 116, 114. The edges refer to the distal ends of the first and second lateral extensions 116, 114. It is noted that any other shapes or angles of the edges are within the scope of this disclosure. For example, the surfaces of the edges can be at an angle between 10-170 degrees with respect to surfaces of the first or second lateral extensions 116, 114. Any combinations of angles of edges are also within the scope of this disclosure, wherein the edge of the first lateral extension 116 can differ from that of the second lateral extension. The angles or shapes of the edges is reflective of a pinning or cutting mechanism involved in cutting individual leads from a roll of wire.

Figure 1M:
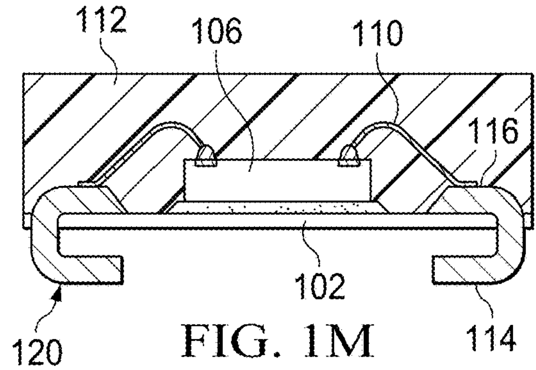
Figure 1N:
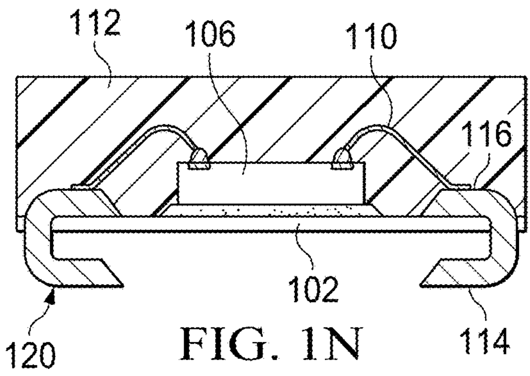
Figure 1O:
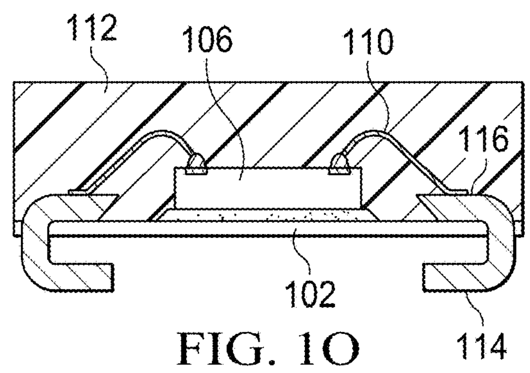
Figure 1P:
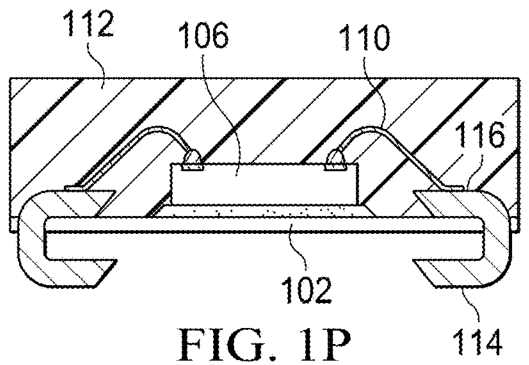

One such example of different angles or shapes is illustrated in FIG. 1M where the edge of the first lateral extension 116 is at an acute angle with respect to a plane along a bottom surface of the first lateral extension 116. The edge of the second lateral extension 114 is however at a 90 degree angle. In the example illustrated in FIG. 1N, both edges are at acute angles with respect to bottom surfaces of the first and second lateral extensions 116, 114. In the example of FIG. 1O, the edge of the first lateral extension 116 is at an obtuse angle with respect to a plane along a bottom surface of the first lateral extension 116 and the edge of the second lateral extension 114 is at a 90 degree angle with respect to its bottom surface. In the example illustrated in FIG. 1P, both edges are at obtuse angles with respect to bottom surfaces of the first and second lateral extensions 116, 114.

In the example of FIG. 1Q, each edge of the first and second lateral extensions 116, 114 includes two surfaces. One surface is adjacent to the top surface of each of the first and second lateral extensions 116, 114, and the other surface is adjacent to the bottom surface. Each of the two surfaces connects at an angle which is approximately 45 degrees. Sharp edges created with this example helps create least damage to the base insulating layer 102 as it cuts through. Burr created in the base insulating layer 102 can help with preventing the mold or other materials leaking. The shape of the edges are resultant of a pinching action performed when separating individual leads from a roll of wire, which is explained later in this detailed description.

FIG. 1R illustrates another example of a wettable flank in the package enabling complete automatic visual inspection post assembly, or after the package is attached to the PCB. The edges of each of the second lateral extensions 114 of the continuous lead 120 include a recess or a groove 122A. A portion of the each of the second lateral extensions 114 above the groove 122 (in the cross-sectional view) is flush with the encapsulating material 122A. The groove can either be formed by laser or saw during the packaging process.

FIG. 1S illustrates a cross-sectional view of a configurable leaded package, where the bends in each of the first and second lateral extensions 116, 114 are approximately at 90 degrees with respect to a plane along the surfaces of the first and second lateral extensions 116, 114. The continuous lead 120 from a cross-sectional view resembles a C type lead with sharp edges. In the example shown, the continuous lead 120 is positioned inside from the edges of the encapsulating material 112. In another example, the continuous lead 120 is positioned such that a surface of the connecting portion 118 (middle part of the C type lead) is exposed from the sides of the package. The bend in each of the first and second lateral extensions 116, 114 is flush with the side surfaces of the encapsulating material 112 as a result of the connecting portion 118 being exposed.

While only one semiconductor die is discussed in the description above, one of ordinary skill in the art would appreciate that one or more semiconductor dies may be packaged in a single package. One example of multiple semiconductor dies 106 is illustrated in FIG. 1U. Two semiconductor dies 106 are illustrated in this example. However, any number of semiconductor dies 106 can be attached to the base insulating layer 102. In this example, the semiconductor dies 106 are electrically connected to each other using a bond wire 110. Further, each of the semiconductor dies 106 is electrically connected to at least one of the continuous leads 120 using bond wires 110. Instead of multiple semiconductor dies 106, any other electrical component or device, including active and passive devices can be attached to the base insulating layer 102. In another example, one or more semiconductor dies 106 and a passive device is attached to the base insulating layer 102 and electrically interconnected, in addition to being electrically connected to at least one of the continuous leads 120. Passive devices include a resistor, a capacitor, an inductor, or a transformer. In another example, one or more semiconductor dies 106 and stacked passive devices are attached to the base insulating layer 102 and electrically interconnected, in addition to being electrically connected to at least one of the continuous leads 120.

In another example, one or more semiconductor dies 106 including a printed sensor are attached to the base insulating layer 102 and electrically interconnected, in addition to being electrically connected to at least one of the continuous leads 120. In another example, one or more semiconductor dies 106 and a printed sensor are attached to the base insulating layer 102 and electrically interconnected, in addition to being electrically connected to at least one of the continuous leads 120. In another example, one or more semiconductor dies 106 and thermal enhancement components including heat sinks are attached to the base insulating layer 102.

FIG. 1V illustrates a cross-sectional view of a configurable leaded package including multiple semiconductor dies 106 arranged as a multi-chip module (MCM). Here, one semiconductor dies 106 is attached to another one by stacking one on top of the other. A suitable die attach material is used to attach and stack one die 106 on top of the other. The top semiconductor die 106 is electrically connected to the bottom semiconductor die 106 using bond wires 110. The bottom semiconductor die 106 is electrically connected to at least one of the continuous leads 120 using bond wires 110. In another example, the top semiconductor die is replaced with a passive device that is electrically connected to the bottom semiconductor die 106.

FIG. 1W illustrates a cross-sectional view of a configurable leaded package including multiple semiconductor dies 106 forming a bulk acoustic wave (BAW) package. The BAW technology is a vital component in advanced filtering solutions for mobile products, as well as the advanced radar, communications systems, and sensor applications. Sensing performance can be achieved by isolating a sensor die within the package from mechanical stress, shock and/or vibration incident on the outer surfaces of the package. The example includes a stress absorbing material 124 that structurally isolates a BAW die 126 from external mechanical stress, such as shock and vibration. The stress absorbing material 124 functions as glob top to encapsulate a portion of the top side of the die 106, as well as the top and side portions of the BAW die 126 and the related wire bonds that electrically connects the BAW die 126 to the die 106. The stress absorbing material 124 includes silicon.

It is noted that in the examples of FIGS. 1A-1W, only one base insulating layer 102 is shown. In other examples, multiple base insulating layers are attached to each other using the connecting portion of the continuous lead 120. In yet other examples, a thick base insulating layer is attached to each other using the connecting portion of the continuous lead 120 that enhances thermal dissipation from the package. It is also noted that the semiconductor package described above does not involve singulation through the dam bars or tie bars as compared to a conventional lead frame strip, which increases the life of the saw blade used for singulation and saves time in the packaging process. It is further noted that in the above examples, the first lateral extension 116 and the second lateral extension 114 are substantially parallel to each other from the cross-sectional views of each of the packages. The first lateral extension 116 and the second lateral extension 114 may slightly deviate (for example, +/−20 degrees) due to manufacturing tolerances, and are within the scope of this disclosure.

The aforementioned examples of configurable leaded packages eliminate the premade custom lead frames that take a lot of tooling cost (~100 k for stamped), long cycle times, inventory costs, and high per unit manufacturing costs. With the elimination of large metal (lead frame based) die-pad, a low modulus die-attach has the potential to provide better moisture sensitive level reliability. Pins and package design can be modified with small changes to the software program of the stitching/stapling machine. In addition the need to lock into a standard body size, pin count or layout is eliminated compared to traditional packages. Instead, one can easily experiment and optimize to the best needs of individual products. By enabling lead extensions only in Z-axis, 100% lead frame utilization can be achieved in X-Y axis without any waste for leads. This enables a much higher number of units per strip, in turn improving the productivity of the factory requiring smaller foot print physically and environmentally, with less waste of materials. This also provides overall cost reductions. With the continuous die shrinks by Moore's law, package sizes can be quickly adjusted, and optimized for each device. Flexibility of creating J, C, S, and thru-hole type of pin configurations helps address individual end-equipment needs. By having pins under the package, PCB utilization is increased. This can enable higher functional density and lower cost at PCB and system levels. The curve shaped pins provide increased mold locking and could reduce the risk of pin level delamination. In short, CLP packages provide the best features of the leaded and leadless packages simultaneously.

FIGS. 2A-2H illustrate various views of a base insulating layer and the attachment of a continuous lead in the configurable leaded packages according to various examples. The process of construction of the configurable leaded packages start with a base insulating layer 102 such as the one illustrated in FIG. 2A. The material of the base insulating layer 102 includes one of a polyimide, a Kapton tape, a fiber cloth tape, a fiber board, a glass cloth, a back grind tape, a plastic plate, and a pre-molded blank. Kapton tape is a polyimide film produced from the condensation of pyromellitic dianhydride and 4,4'-oxydiphenylamine. The thermal conductivity of Kapton at temperatures from 0.5 to 5 kelvin is rather high for such low temperatures, K=4.638×10−3 T0.5678 W·m−1·K−1. This, together with its good dielectric qualities and its availability as thin sheets, and electrical insulation at low thermal gradients makes it suitable for use in a semiconductor package. A fiber cloth tape includes woven fiber. A glass cloth or glass cloth tape includes a rubber resin adhesive tape coated with a conformable glass cloth backing. A back grind tape includes a base material and an adhesive layer, which acts as an insulator as well when used in semiconductor packaging applications. A pre-molded blank includes a portion of a mold compound or epoxy that is molded into a sheet and cured before using in semiconductor packaging applications.

FIG. 2A illustrates a perspective view of the base insulating layer 102. The base insulating layer 102 is flexible, semi-flexible, or rigid carrier substrate that functions as the lead frame. One advantage of starting the process from a base insulating layer 102 is that, the layout of the lead frame and the leads can be configured based on the needs and dimensions of a required package. A thickness of the base insulating layer is between 0.020 mm to 0.080 mm. In one example, the thickness is 0.050 mm. The thickness can vary between +/−20% within a single unit of the base insulating layer 102 due to manufacturing tolerances and such variation is within the scope of this disclosure. FIG. 2A illustrates only one unit of the base insulating layer 102. In other examples, the base insulating layer 102 includes a large panel with multiple units, or a large number of units together as a sheet.

In another example, as illustrated in FIG. 2B, the base insulating layer 102 is in a roll with different sizes that can be unrolled to make it flat and thereafter start the assembly process. A coefficient of thermal expansion (CTE) of the base insulating layer 102 is close to the CTE of the encapsulating material 112 to reduce any stresses after the encapsulation of the package. The relative expansion or stress divided by the change in temperature is called the material's coefficient of linear thermal expansion and generally varies with temperature. If the CTEs of two materials in contact are close to each other, they expand relatively together reducing the mechanical stress in that area of the package. In one example, the base insulating layer 102 is soft enough to puncture through it, but strong enough not to crack or tear under expected forces such that stapling, pinning, or inserting the continuous leads into the base insulating layer 102 is possible. FIGS. 2C and 2D illustrate various perspective views of the base insulating layer 102 from the side and from the top. In another example, the base insulative layer 102 can be removed after the package is formed (after molding or encapsulation) making it a sacrificial layer that is temporary during the assembly process.

Figures 2I, 3A, 3B, 3C, 3D:
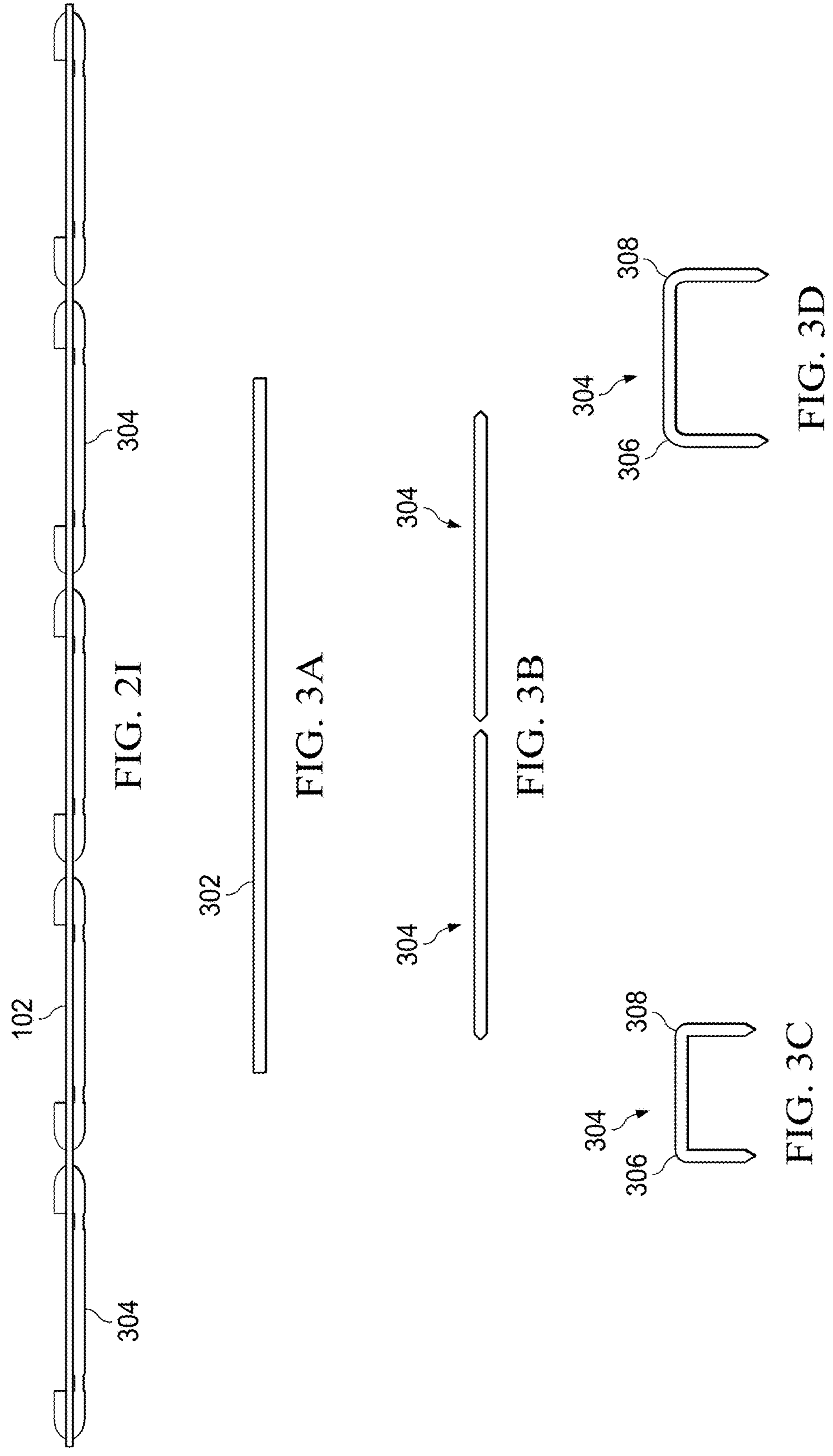

FIG. 2E illustrates a perspective view after a conductive pin 120 is inserted into the base insulating layer 102 and locked in as a result of a stapling action. The conductive lead 120 is formed from a wire 302 of a conductive material as shown in FIG. 3A. The wire 302, and therefore the conductive lead 120, includes a circular cross-sectional shape with a diameter of approximately between 0.010 and 0.050 mm. The wire 302 is then cut at a certain length to make individual units 304 as illustrated in FIG. 3B. A first bend 306 and a second bend 308 are created thereafter, making a shape of each individual unit 304 to resemble a stapling pin. Some portions of each of the individual units 304 are half etched using techniques including photo etching, chemical etching, or laser etching. In one example, the wire 302 is half etched at strategic locations in a repetitive pattern, such that, when individual units 304 are created, each of the individual units or the conductive pin 304 includes same number of half etched portions at designated locations. In another example, etching is performed after individual units 304 are created, as illustrated in FIG. 3D. In FIG. 3D, the half etches are at or near the bends 306, 308.

Referring back to FIG. 2E, two ends of the conductive pin 304 are inserted through a base insulating material 102. Thereafter, the two more bends 202, 204 are formed in the conductive pin 304 near the ends. After the bends 202, 204 are formed, bends 306 and 308 are on one side of the base insulating material 102, and bends 202, 204 are on the opposite side of the base insulating material 102. In other words, after inserting the conductive pin 304, the bends 202, 204 create a locking mechanism (stapling) for the conductive pin 304 to attach to the base insulating layer 102. After the conductive pin 304 is attached, a portion 206 between the first and second bends 306, 308 is removed to separate the conductive pin 304 into two separate continuous leads 120 at this stage or after the package is formed (post molding). FIG. 2F shows a bottom side of the base insulating layer 102 with the conductive pin 304 inserted and the portion 206 unremoved. FIG. 2G illustrates a perspective side view of the blank insulating layer 102 with multiple conductive pins 304 inserted. The area between the two ends of each of the conductive pins 304 is the die attach area, to which the semiconductor die 106 is attached. FIG. 2H illustrates a bottom side of the base insulating layer 102 with the multiple conductive pins 304 inserted and the portion 206 between the first and second bends 306, 308 unremoved. FIG. 2I illustrates a cross sectional side view of the base insulating layer 102 showing multiple conductive pins 304 inserted, where each conductive pin 304 shows a footprint of one configurable leaded package. In the example shown, five configurable leaded packages can be formed after the assembly process is completed.

Instead of forming the conductive pin 304 from a wire 302, they can be pre-formed with multiple conductive pins 304 mechanically connected to each other, where the bends 306, 308 are formed, as illustrated in FIG. 3E. The mechanical connection between the multiple conductive pins 304 is in the form of a bridge or a pole 310 that is connected to each of the pins 304. The pole 310 is in a plane below the portion 206 between the first and second bends 306, 308. Explained differently, the multiple conductive pins 304 in this example resembles a stapling pin set. FIGS. 3E-3H illustrate various perspective views of the stapling pin set. In one example, making of the conductive pin 304 starts with a sheet of copper that is about 125 microns thick. Alternatively a CuNi alloy sheet can be used. CuNi6 gives the combination of high resistance to corrosion but still solderable and workable. Then the edges of the sheet is tapered to form sharp corners to help tear the base insulating layer 102 and to provide ramp for interconnect traces. Next the sheet is laser cut, wire electrical discharge machined, or chemically etched at certain pre-set distances to form individual wires. The pole 310 is left in the middle to hold the pins together, where the pole 310 acts as a bridge between the pins. Cutting specifications include line of 200 microns thick, and spacing between lines of 20 microns. The pole 310 is of 20 microns thick. In this example, the pole 310 is in the same plane as the pins 304 because the pole 310 is left in the middle of the sheet un-etched. The bends are then formed in the pins 304 to a shape resembling to a stapler pin. The pins are plated after bending with Nickel of 2 micron thickness and followed by Palladium of 1 micron thickness.

FIG. 4A illustrates a base insulating layer 102 with a matrix of conductive pins 304 inserted, and formed as a lead frame or a panel. Specifically, FIG. 4A illustrates a 16*8 matrix with each individual unit 404 forming one configurable leaded package post assembly process. Depending on the requirement, more or less number of individual units 404 can be formed. Each individual unit 404 in this example includes 4 conductive pins 304. Again, depending on the requirement, more or less number of conductive pins 304 can be formed in each individual unit 404. A bottom view of the lead frame is shown in FIG. 4A.

FIG. 4B illustrates a lead frame 406 with a 12*4 matrix of individual units 404. Additionally, the lead frame includes stiffening pins 408, 410, and 412 attached to the base insulating layer 102 to improve handling of the base insulating layer 102. Stiffening pins 408 are attached to opposite length sides of the rectangular shaped lead frame 406. Stiffening pins 410 are attached to opposite width sides of the rectangular shaped lead frame 406. Additionally, a stiffening pin 410 is attached approximately in the middle of the lead frame 406 extending length wise of the rectangular shaped lead frame 406. The stiffening pins 408, 410, and 412 are either of the same thickness as the conductive pins 304, or larger than the conductive pins 304. In the example shown in FIG. 4B, the stiffening pins 408, 410, and 412 are larger in thickness than the conductive pins 304. In one example, the stiffening pins 410 are made of the same material as the conductive pins 304. In another example, the stiffening pins 410 are made of any suitable metal that can act as stiffener with suitable properties.

Figure 5G:
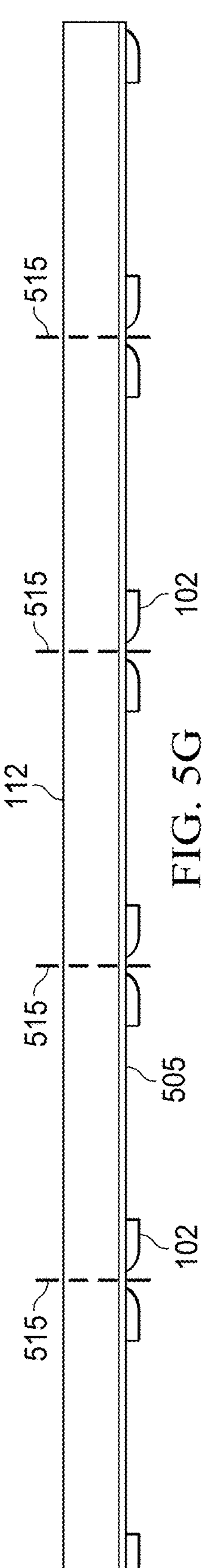

FIGS. 5A-5H illustrate the process of making the configurable leaded package as in FIG. 1A. FIG. 5A illustrates the base insulating layer 102 with the conductive pins 304 attached and die attach material 104 is placed on the central area of the base insulating layer 102. The die attach material 104 is a cured adhesive that is placed on the base insulating layer prior to attaching the semiconductor die 106. Die attach material 104 provides the mechanical support between the semiconductor die 106 and the base insulating layer 102. The die attach material 104 is also critical to the thermal and, for some applications, the electrical performance of the device. The die attach equipment is configured to handle the incoming wafer and base insulating layer 102 simultaneously. An image recognition system identifies individual semiconductor die 106 to be removed from the wafer backing/mounting tape, while die attach material is dispensed in controlled amounts on to the base insulating layer 102.

In one example, the die attach material 104 includes a thermally conductive and electrically insulating material. In another example, the die attach material 104 includes lead locks to reduce delamination between components within the package, for example, between the base insulating layer 102 and the die attach material 104, between the die attach material 104 and the semiconductor die 106, or between the die attach material 104 and the leads 102.

The coverage of the material dispensed during the die attach process is critical to the reliability and performance of the package. The presence of voids and variations in thickness are undesirable. Excessive or insufficient coverage of the die attach material makes the device susceptible to reliability failures. The adhesion strength of the die attach is weakened by the presence of voids, particularly during temperature cycle excursions, and can impact the ability of the die attach material to dissipate heat away from the device. A thickness of the die attach material 104 after dispensing is about 1-2 mils.

The die attach techniques include an adhesive bonding, eutectic bonding, solder attach, or a flip chip attach. In adhesive bonding, adhesives such as epoxy and polyimide to form a bond between the semiconductor die 106 and the base insulating layer 102. In eutectic bonding, a metal alloy is used as an intermediate layer to form a bond. A eutectic bond is formed when the metal alloy in the melted state forms atomic contact with the semiconductor die 106 and the base insulating layer 102. Solder attach uses solder or solder paste to attach the semiconductor die 106 to the base insulating layer 102. In flip chip attach the electrical connections between the semiconductor die 106 and base insulating layer are made directly by inverting the semiconductor die 106 face-down and making electrical connection to the continuous lead 120 as shown in FIGS. 11*a*-11*d* and FIGS. 12*a*-12*d*. FIG. 5B illustrates a side cross-sectional view of the device with the die attach material 104 attached to the base insulating layer 102.

A non-pierce through plunge up needle assists to separate an individual semiconductor die 106 to be picked by the collet on the pick-up head of the die attach machine. Thereafter, the semiconductor die 106 is aligned in the proper orientation and position on the base insulating layer 102 as illustrated in FIG. 5C. FIG. 5D illustrates a cross sectional view of the device with the semiconductor die 106 attached to the base insulating layer 102 via the die attach material 104.

FIG. 5E illustrates the device where the semiconductor die 106 is electrically connected to the conductive pins 304 using bond wires 110. High-speed wire bond equipment is used for wire bonding as explained earlier. The wire bond equipment consists of a handling system to feed the device of FIG. 5C into a work area. Image recognition systems ensure the semiconductor die 106 is orientated to match the bonding diagram for a particular device. Wires are bonded one wire at a time. For each interconnection two wire bonds are formed, one at the die and the other at the conductive pins 304. The first bond involves the formation of a ball with an electric flame off (EFO) process. The ball is placed in direct contact within the bond pad opening on the die, under bond force and ultrasonic energy within a few milliseconds and forms a ball bond at the bond pad metal. The bond creates an intermetallic layer that makes the connection on the bond pad 108. The bond wire 110 is then lifted to form a loop and then is placed in contact with the desired bond area of the conductive pins 304 to form a wedge bond. Bonding temperature, ultrasonic energy, and bond force & Time are key process parameters controlled to form a reliable bond and therefore, the electrical connection. The shape of the bond wire loop for a specific capability is controlled by the software that drives the motion of the bond head. The mechanical properties and diameter of the wire are wire attributes that impact the bonding process and yield. FIG. 5F illustrates a cross-sectional side view of the device of FIG. 5D, with bond wires 110 electrically connecting the semiconductor die 106 to the conductive pins 304. Multiple bond wires 110 can be connected to a single bond pad 108, or a single conductive pin 304/continuous lead 120 depending on the design requirements of the package.

FIG. 5G illustrates a molded strip 505 that includes five of the devices as shown in FIG. 5F. Encapsulating material such as mold compound protects the device mechanically and environmentally from the outside environment. Transfer molding is used to encapsulate most plastic packages. Mold compounds are formulated from epoxy resins containing inorganic fillers, catalysts, flame retardants, stress modifiers, adhesion promoters, and other additives. Fused silica, the filler most commonly used, imparts the desired coefficient of thermal expansion, elastic modulus, and fracture toughness properties. Most resin systems are based on an epoxy cresol novolac (ECN) chemistry though advanced resin systems have been developed to meet demanding requirements associated with moisture sensitivity and high temperature operation. Filler shape impacts the loading level of the filler.

Transfer molding is used to encapsulate lead frame based packages. This process involves the liquefaction and transfer of pelletized mold compound in a mold press. Liquid encapsulants are used where wire pitch is tight and for filling cavity packages. Liquid encapsulants are formulated using epoxy resins, fused silica filler, and other additives. Being in liquid form, these encapsulant materials have low viscosity and can be filled with high levels of silica to impart desired mechanical properties. Liquid encapsulants are dispensed from a syringe. Depending on the device configuration, a dam resin may be deposited as the first step. The dam resin defines the encapsulation area around the device. The cavity or defined area is filled with encapsulant that covers the device and the wires. Finally, a cure process is used. The lower viscosity of liquid encapsulants greatly diminishes the probability of wire sweep.

The liquefaction results in a low viscosity material that readily flows into the mold cavity and completely encapsulates the device. Shortly after the transfer process into the mold cavity, the cure reaction begins and the viscosity of the mold compound increases until the resin system is hardened. A further cure cycle takes place outside the mold in an oven to ensure the mold compound is completely cured. Process parameters are optimized to ensure the complete fill of the mold cavity and the elimination of voids in the mold compound.

In the mold tool, runners and gates are designed so the flow of mold compound into the mold cavity is complete without the formation of voids. Depending on the wire pitch, the mold process is further optimized to prevent wire sweep that can result in electrical shorts inside the package. Process parameters that are controlled are the transfer rate, temperature, and pressure. The final cure cycle (temperature and time) determines the final properties and, thus, the reliability of the molded package. The de-junk process removes excess mold compound that may be accumulated on the lead frame from molding. Media de-flash bombards the package surface with small glass particles to prepare the lead frame for plating and the mold compound for marking.

Figures 6A, 6B, 6C:
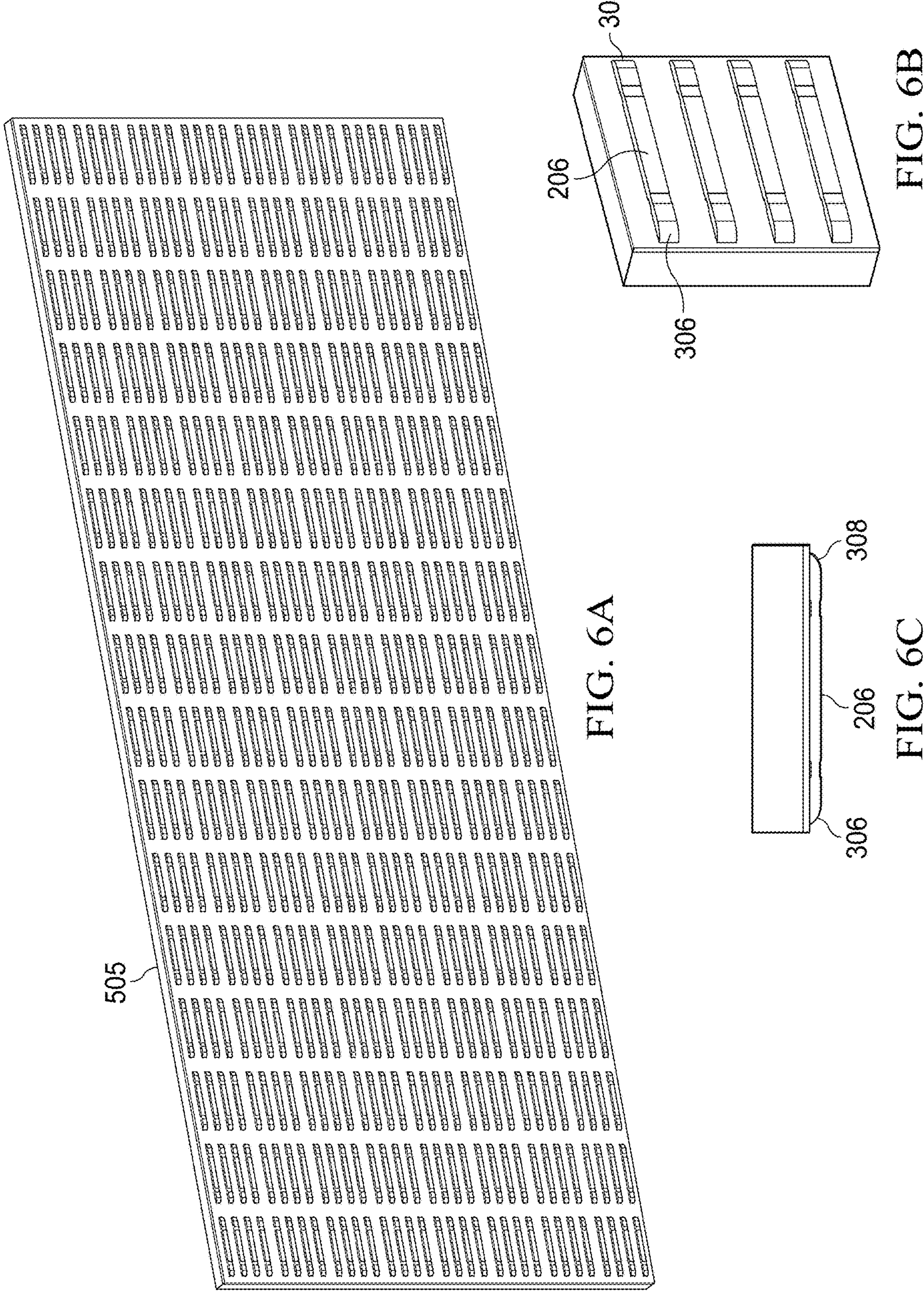
FIG. 6A illustrates another view of block molded strip having several devices according to an example.
FIG. 6B illustrates a magnified perspective view of one of the devices of FIG. 6A.
FIG. 6C illustrates a side view of the device of FIG. 6B.

In one example, since there is no dead space (unutilized space between devices in the base insulating layer/lead frame due to leads protruding from the X-Y axis of the device at this stage). Therefore, molding of multiple devices in a single cavity of the mold tool is enabled without expensive tooling modifications. With block molding, high strip utilization (units per strip), equipment and tooling reuse (for different package sizes), reduced cycle time, and low cost can be achieved. Since there are no continuous leads 120. FIG. 6A illustrates another view of block molded strip 505 having several devices. FIG. 6B illustrates a magnified perspective view of one of the devices. FIG. 6C illustrates a side view of the device of FIG. 6B. The portion 206 between the first and second bends 306, 308 is not removed from the device at this stage.

Instead of epoxy mold compounds, in one example, an insulative cover or a sheet is used that encapsulates the device. In another example, a spray based molding technique is used, where a sprayer is used to spray the insulator onto the device of FIG. 5F. Single or multiple passes of the sprayer to spray various coats of encapsulation material on top of each other is within the scope of this disclosure. It is noted that in the examples illustrated so far in this description, the encapsulation material does not cover a bottom side surface of the blank insulating layer 102. In other words, blank insulating layer 102 is exposed from the package. In an alternative example, the encapsulating material covers even the bottom side surface of the blank insulating layer 102. In another example, the blank insulating layer 102 can be removed after molding, exposing the encapsulating material 112 from all sides of the package.

Figures 6D, 6E, 6F:
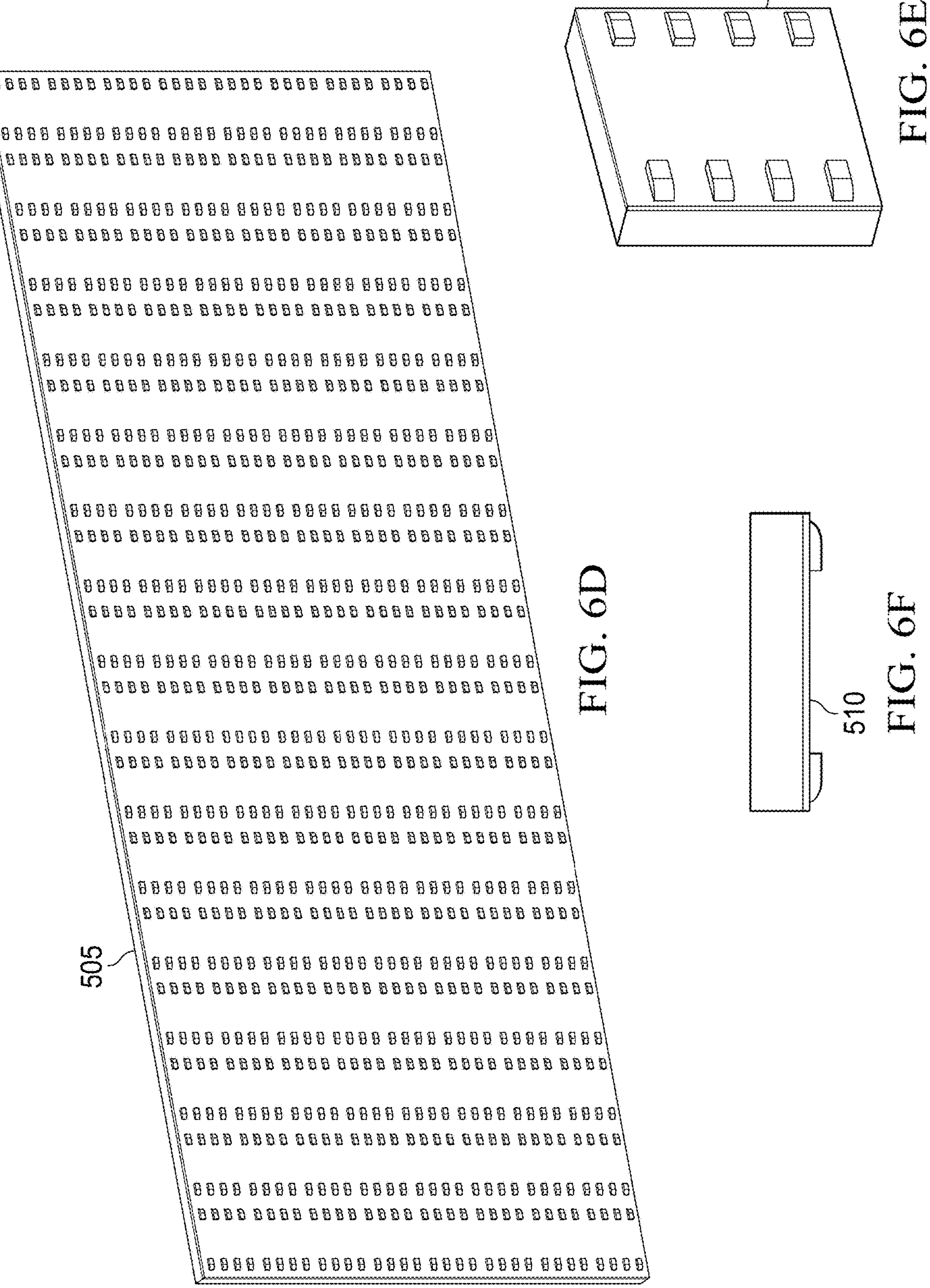
FIGS. 6D-6F illustrate various views of the device of FIG. 6A after a portion of the continuous lead is removed.

After molding, the portion 206 between the first and second bends 306, 308 is removed to separate the conductive pin 304 into separate continuous leads 120 in a trim and form process. FIG. 5G illustrates the molded strip 505 after the portion 206 is removed. FIG. 6D illustrates a bottom perspective view of the molded strip 505 after the portion 206 is removed. The conductive pins 304 include strategically placed half etched or coined slots where they are cut with mechanical saw, laser, water jet, or by a chemical etch. At this stage since each individual device 510 is still held together, a parallel electrical testing of all the individual devices 510 can be performed in a single step. Probe testing with a tester that can test multiple devices at once enables parallel testing and improves efficiency and saves testing time in the packaging process. As needed, the molded strip 505 can be baked for moisture sensitivity levels (MSL) (JEDEC Std-02) prior to or after electrical testing.

Figure 5H:
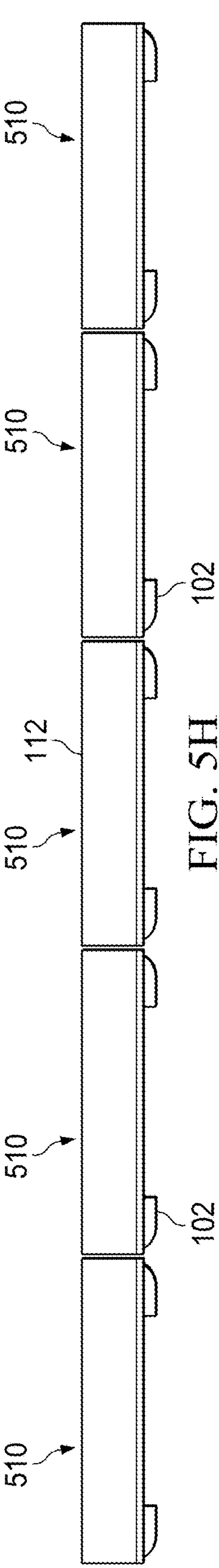

Individual packages 510 are then singulated from the molded strip 505 as illustrated in FIG. 5H. Individual devices 510 within the molded strip 505 are cut apart or singulated for producing individual packages 510. Such singulation is accomplished via a sawing process. In a mechanical saw process, a saw blade (or dicing blade) is advanced along saw streets 515 which extend in prescribed patterns between the individual devices 510 in the molded strip 505. Singulation separates individual devices 510 from one another. In the case of configurable leaded package according to most of the examples, the saw blade does not need to pass through any metal of the leads 102, as there is no metal in the saw streets. Instead, only encapsulation material 112 is present in the saw streets 515. This improves the efficiency and the life of the saw blade, compared to lead frame strips where the leads, and therefore metal, are present in the saw streets. In another example, instead of a saw blade, a laser at an appropriate wavelength is used to separate the molded strip 505 into packages 510.

Individual packages 510 are inspected for lead coplanarity, and placed in trays or tubes. The lead forming process is critical to achieve the coplanar leads required for surface mount processes. Portions of the leads 102 can be extended to be very close to the package edge, or even outside the package edge (by staggering) to enable visual inspection of leads and solder joints after surface mounting a package on a PCB. FIG. 6E illustrates a bottom view perspective view of an individual package (after the portion 206 is removed). FIG. 6F illustrates a side view of the device of FIG. 6E. Each package 510 is the marked to place corporate and product identification on a packaged device. Marking allows for product differentiation. Either ink or laser methods are used to mark packages. Laser marking provides higher throughput and better resolution.

Figure 7A:
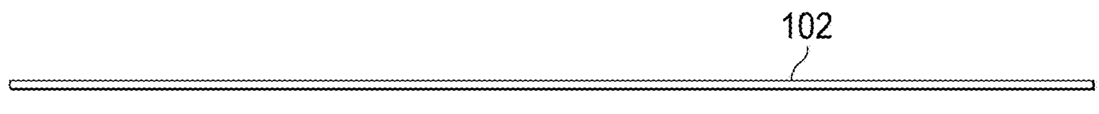
FIGS. 7A-7G illustrate various process steps involved in making a configurable leaded package with a J type lead to an example.
Figure 7B:
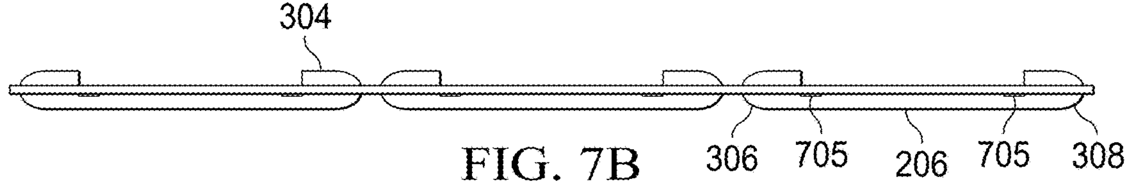
Figure 7C:
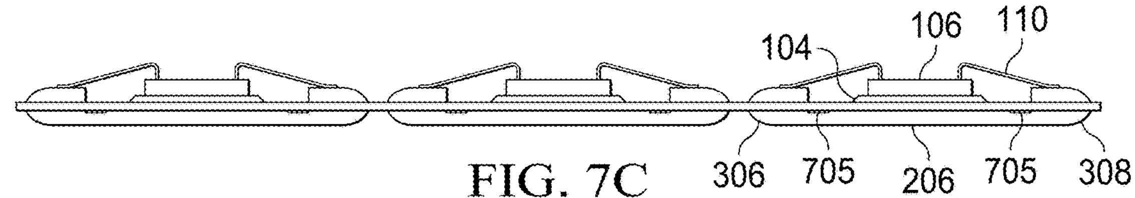
Figure 7D:
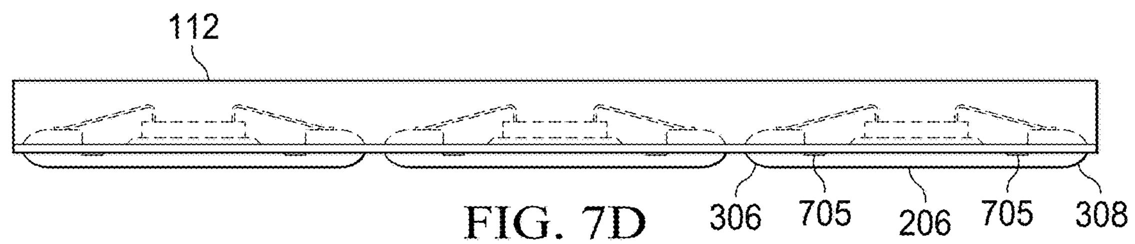
Figure 7E:
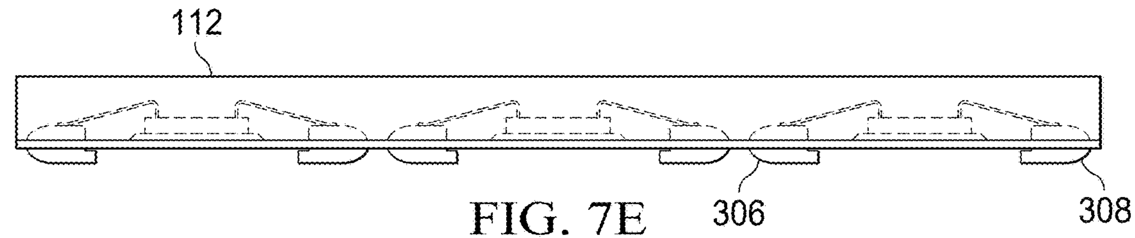
Figure 7F:
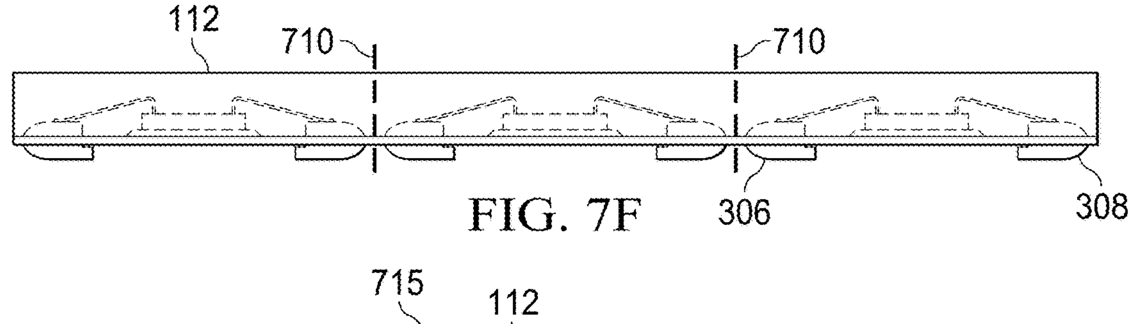
Figure 7G:
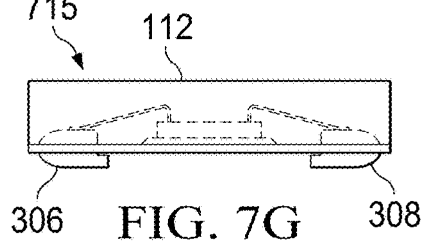

FIGS. 7A-7G illustrate various process steps involved in making a configurable leaded package with a J type lead to an example. The processes of die attach, wire bonding, molding, and singulation in FIGS. 7A-7G are similar to that of FIGS. 5A-5F and are not repeated for the sake of simplicity. The process starts with a blank insulating layer 102 in a sheet form. This example shows the blank insulating layer 102 designed for making three individual packages 715 as illustrated in FIG. 7G. Three conductive pins 304 are then inserted into the blank insulating layer 102 at designated places as illustrated in the cross-sectional side view in FIG. 7B. Each conductive pin 304 includes first and second bends 306, 308 and a portion in between the bends 306, 308 after inserting into the base insulating layer 102. Each conductive pin also includes two half etched portions 705 proximate the bends 306, 308. The half etched portions 705 are on both ends of the portion 206 as can be seen from the cross-sectional side view of FIG. 7B. FIG. 7C illustrates the cross-sectional side view of the device after the semiconductor die 106 is attached to the base insulating layer 102 using the die attach material 104, and electrically connected to the conductive pins 304 using bond wires 110. The wire bonding process attaches the bond wire between the semiconductor die 106 and each of the conductive pins. FIG. 7D illustrates a molded version of the device of FIG. 7D. In FIG. 7E, the portion 206 in between the bends 306, 308 is removed. In FIG. 7F, the device of FIG. 7E is singulated along the saw streets 710 to separate the individual packages 715, of which one is illustrated in FIG. 7G.

Figures 8A, 8B, 8C, 8D:
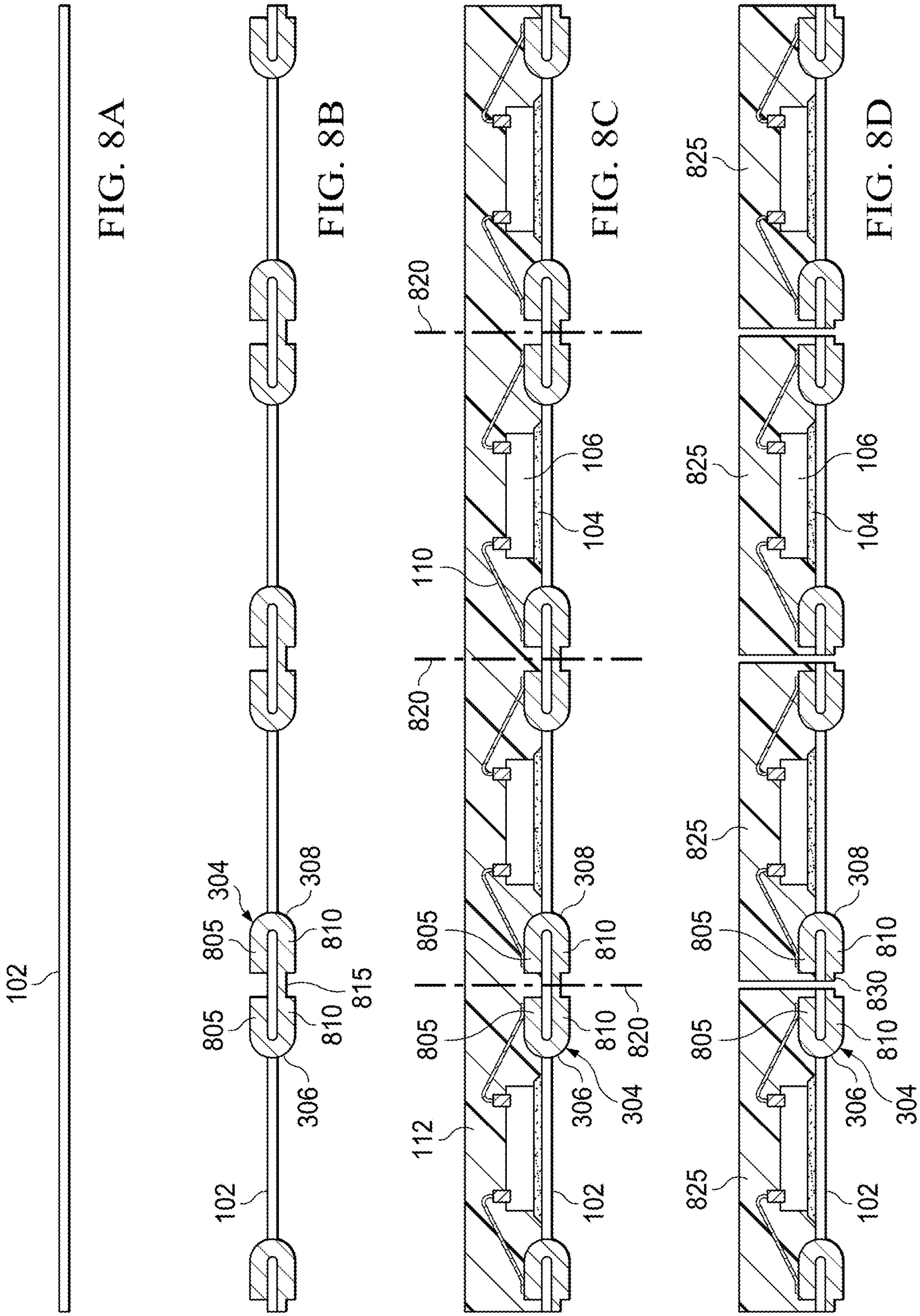
FIGS. 8A-8D illustrate various process steps involved in making a wettable flank in the package similar to the package of FIG. 1R.

FIGS. 8A-8D illustrate various process steps involved in making a wettable flank in the package similar to the package of FIG. 1R. The processes of die attach, wire bonding, molding, and singulation in FIGS. 8A-8D are similar to that of FIGS. 5A-5F and are not repeated for the sake of simplicity. The process starts with a blank insulating layer 102 in a sheet form. This example shows the blank insulating layer 102 designed for making four individual packages 825 as illustrated in FIG. 8D. Four conductive pins 304 are then inserted into the blank insulating layer 102 at designated places as illustrated in the cross-sectional side view in FIG. 8B. Unlike the conductive pins 304 of FIG. 7B, these conductive pins are smaller in size. Another difference is that each conductive pin 304 forms adjacent leads 102 of two adjacent individual packages. Each conductive pin 304 when inserted includes two first lateral extensions 805 on a first surface of the base insulating layer 102, and two second lateral extensions 810 on a second surface of the base insulating layer 102, which is opposite of the first lateral extension. A connecting portion connects each of the first lateral extensions adjacent to each other, and connects each of the second lateral extensions adjacent to each other. The connecting portion penetrates through the base insulating layer 102. A portion 815 of the conductive pin 304 in between the second lateral extensions 810 is half etched or coined to have approximately half the thickness from the cross-sectional view as shown in FIG. 8B. A saw street 820 is located at this portion 815 where the packages 825 are separated to individual ones.

FIG. 8C illustrates the cross-sectional side view of the device after the semiconductor die 106 is attached to the base insulating layer 102 using the die attach material 104, and electrically connected to the conductive pins 304 using bond wires 110, and thereafter molded using an encapsulating material 112. The wire bonding process attaches the bond wire between the semiconductor die 106 and each of the conductive pins. In FIG. 8D, the molded strip of FIG. 8C is separated/singulated at the saw street 820 to separate the individual packages 825, of which four are illustrated in FIG. 8D. It is noted that a thickness of the lead 102 at the end of the second lateral extension is less than a thickness of the lead across the first lateral extension 805 creating a recess 830. The thickness of the lead 102 at the end of the second lateral extension is also less than a thickness of the connecting portion and a portion of the second lateral extension 810, the portion of the second lateral extension 810 being adjacent to the recess 830.

FIGS. 9A-12D illustrate various examples of the configurable leaded package, where instead of a conductive pin 304, a clamp (905, 1005, 1105, or 1205) is used to create leads of the package. The advantage of having clamps is that there is no additional step of removing any portion (for example portion 206 or portion 815) after the device on the lead frame strip is molded. This reduces the cycle time of the assembly process and improves efficiency. Each of these clamps or alternatively referred to as conductive leads 905, 1005, 1105, or 1205 are formed of a straight wire similar to that of the wire 302.

Figure 9A:
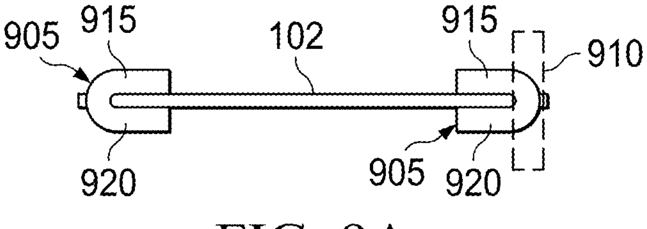
FIGS. 9A-9D illustrate various examples of the configurable leaded package with a clamp.
Figure 9B:
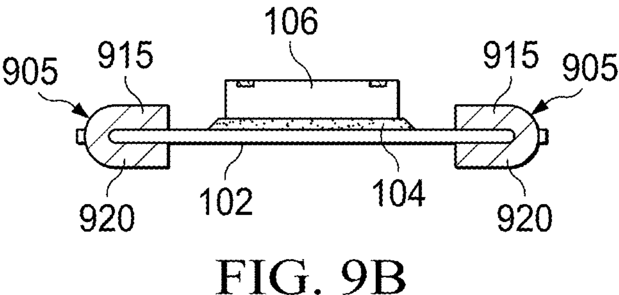
Figure 9C:
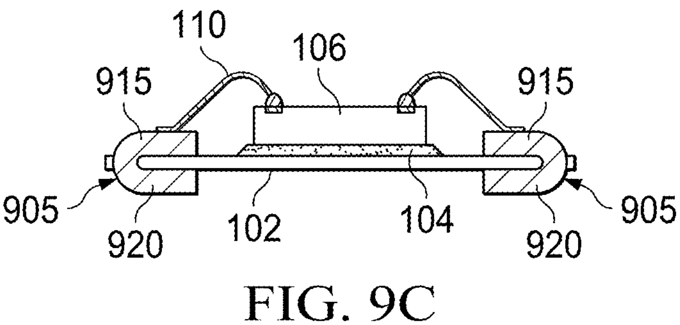
Figure 9D:
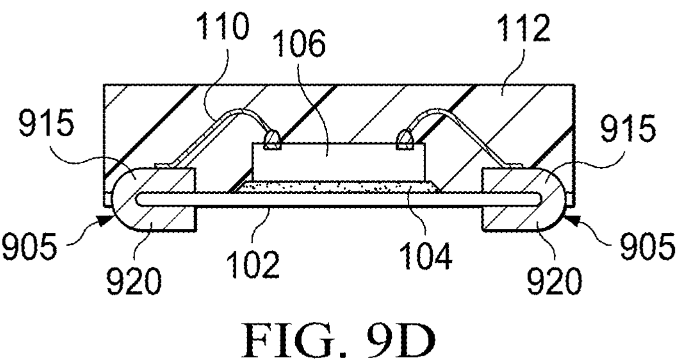

FIG. 9A illustrates a cross-sectional view after the wire 910 is inserted into the base insulating layer 102 and locked in as a result of a clamping action. The conductive lead 905 is formed from a straight shaped wire 910 of a conductive material, similar to the wire 302 shown in FIG. 3C. The wire 910 after inserting to the base insulating layer 102 is shown in FIG. 9A in dotted lines. Thereafter, the wire 910 is bent to create first and second lateral extensions 915 and 920. The first lateral extensions 915 are on a top surface of the base insulating layer 102, and the second lateral extensions 920 are on a top surface of the base insulating layer 102. The clamping action is similar to a stapling action used in other examples (also explained later in detail in this description) and the same tool can be configured to form the bends and the lateral extensions 915 and 920. It is noted that, the clamps hold firm to the base insulating layer 102 enabling further assembly processes of forming the package. In FIG. 9B, a semiconductor die 106 is attached to the base insulating layer 102 via the die attach material 104. The semiconductor die 106 is electrically connected to the conductive lead 905 in FIG. 9C using bond wires 110, and thereafter molded using an encapsulating material 112 as illustrated in FIG. 9D. The conductive lead 120 in FIGS. 9A-12D includes a circular cross-sectional shape with a diameter of approximately between 0.010 and 0.050 mm, or a rectangular cross-sectional shape with a thickness of approximately 0.125 mm.

Figure 10A:
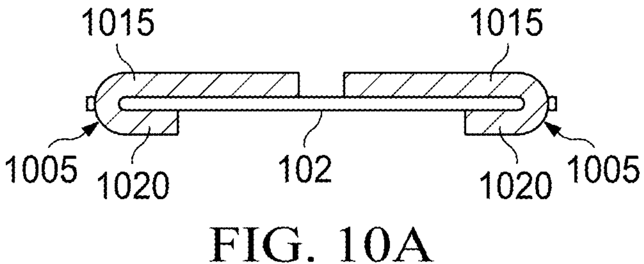
FIGS. 10A-10D illustrate various examples of the configurable leaded package in a chip-on-lead configuration.
Figure 10B:
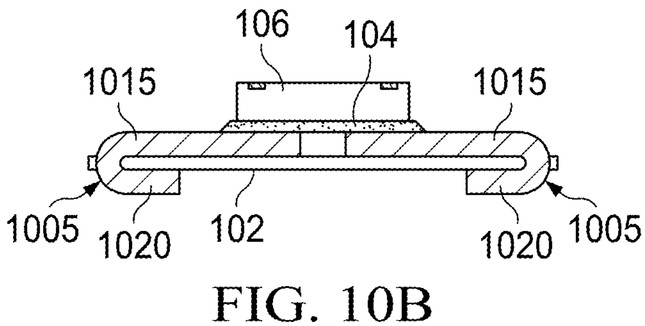
Figure 10C:
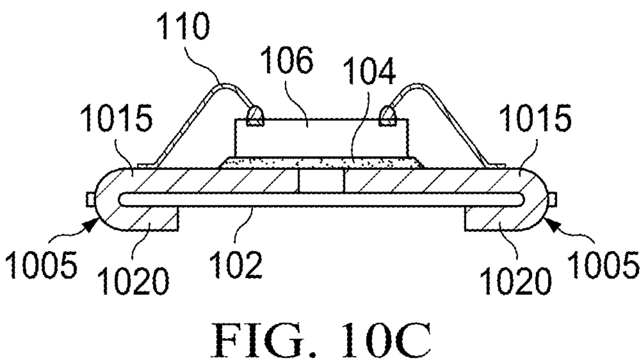
Figure 10D:
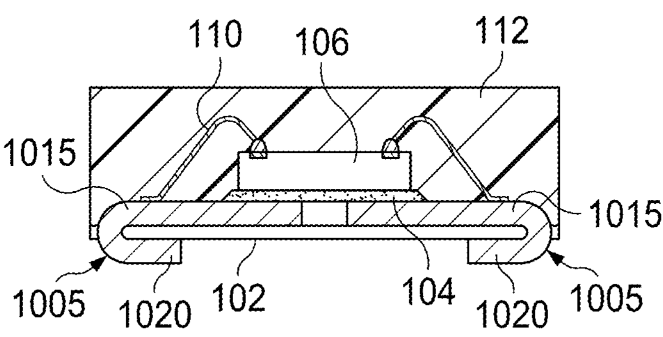

FIGS. 10A-10D illustrate a chip on lead (COL) example of the configurable leaded package. In this example, the semiconductor die 106 is attached to the leads 1005 directly using die attach material 104. Die attach material 104 can be electrically conductive or insulating depending upon design requirements including whether or not heat and/or current is to be conducted through die attach pad 14 or leads 12 beneath the semiconductor die 106 for COL configurations. For COL configurations, insulating die attach material 104 is required to avoid pin shorting. The first lateral extension 1015 of the lead 1005 is longer than the second lateral extension 1020 in the cross-sectional view of the device to attach to the semiconductor de 106. When attached, the semiconductor de 106 rests on the ends of the first lateral extensions 1015 as illustrated in FIG. 10B. The semiconductor die 106 is electrically connected to the conductive lead 905 in FIG. 10C using bond wires 110, and thereafter molded using an encapsulating material 112 as illustrated in FIG. 10D.

Figure 11A:
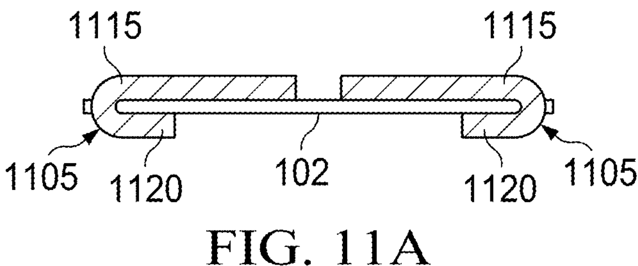
FIGS. 11A-11D illustrate various examples of the configurable leaded package including a flip chip configuration.
Figure 11B:
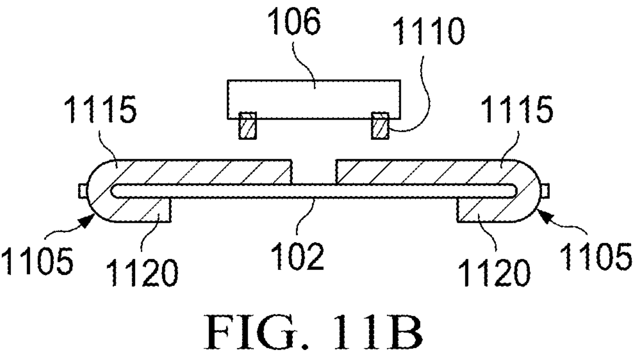
Figure 11C:
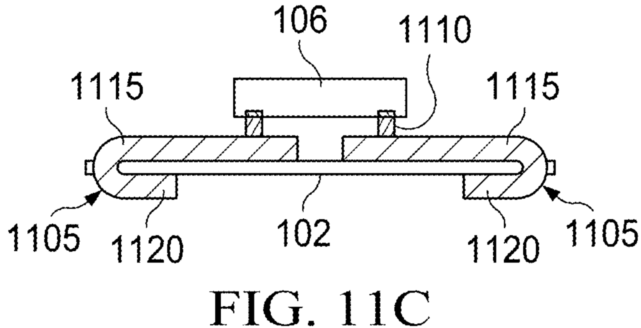
Figure 11D:
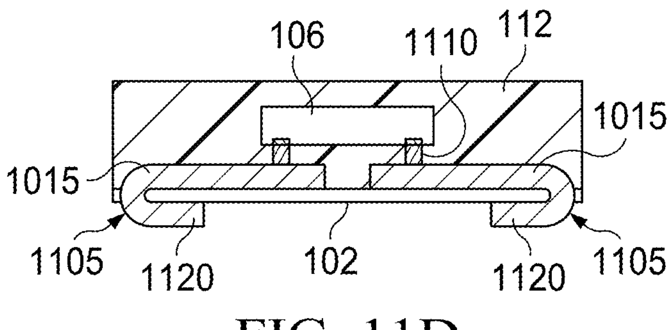

FIGS. 11A-11D illustrate a chip on lead example of the configurable leaded package. In this example, the semiconductor die 106 is attached to the leads 1005 directly using die attach material 104. Instead of using bond wires to electrically connect the semiconductor die 106 to the leads 1105, the die 106 is flip chip attached to the leads 1105. In flip chip attachment, an active side of the semiconductor die 106 (the side with bond pads) is attached face down to the top surface of the first lateral extensions 1115 as illustrated in FIG. 11B. A plurality of bumps 1110 that extend from the bond pads of the semiconductor die 106 are attached to the top surface of the first lateral extensions 1115 using an electrically conductive adhesive such as solder as illustrated in FIG. 11C. Thereafter the device is molded using an encapsulating material 112 as illustrated in FIG. 11D. As in the example of FIGS. 10A-10D, the first lateral extension 1115 is longer than the second lateral extension 1120 in the cross-sectional view of the device to attach to the semiconductor die 106.

Figure 12A:
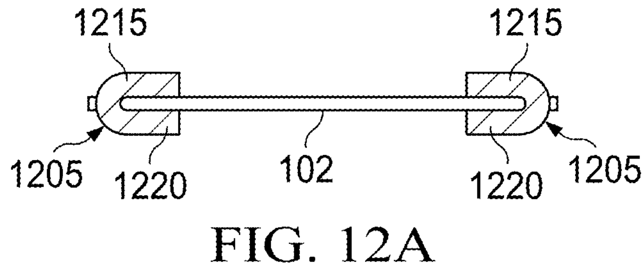
FIGS. 12A-12D illustrate various examples of the configurable leaded package with multiple dies.
Figure 12B:
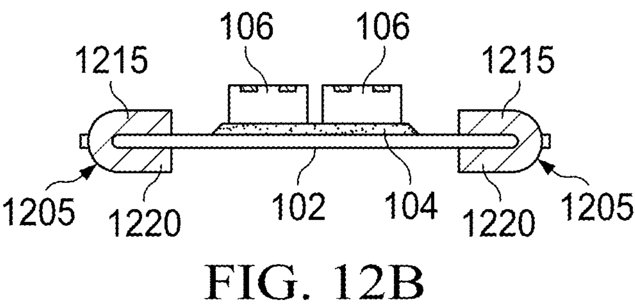
Figure 12C:
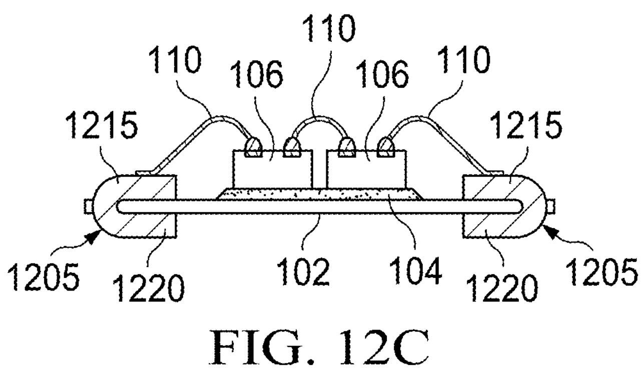
Figure 12D:
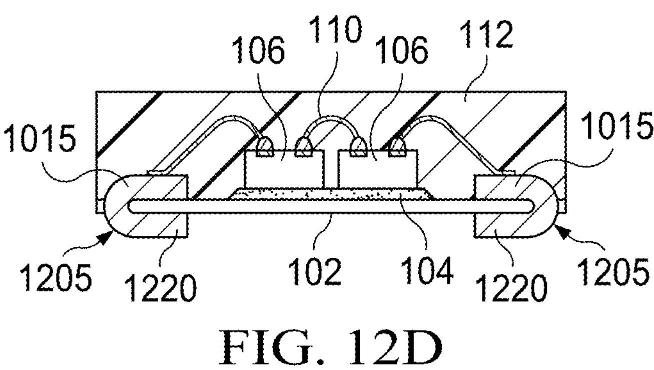

FIGS. 12A-12D illustrate an example where two semiconductor dies are attached to the base insulating layer 102 instead of one as in the example of FIG. 9A-9D. The base insulating layer 102, conductive lead 1205, and encapsulation material are similar to those of FIG. 9A-9D in construction and properties. After the leads are formed with first and second lateral extensions 1215 and 1220, the die attach material 104 is dispensed onto the base insulating layer 102. Coverage and size of the area of the die attach material 104 on the base insulating layer 102 depends on the sizes of the semiconductor dies 106 that need to be attached, as illustrated in FIG. 12B. The semiconductor dies 106 are electrically connected to the conductive lead 1205 using bond wires 110 as illustrated in FIG. 12C, and thereafter molded using an encapsulating material 112 as illustrated in FIG. 12D. In this example, each semiconductor die 106 is electrically connected to the first lateral extensions 1215 of the conductive lead 1205 using bond wires 110. Additionally, the two semiconductor dies 106 are electrically connected to each other using bond wire 110.

Figure 13A:
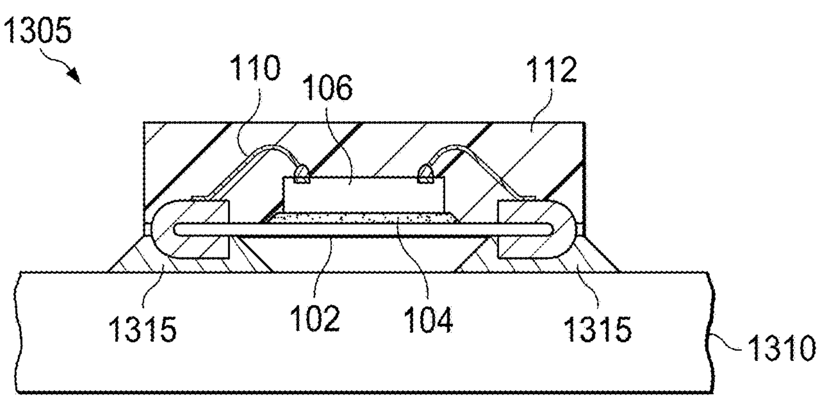
FIGS. 13A-13C illustrate various perspective views of a configurable leaded package attached to a PCB.
Figure 13B:
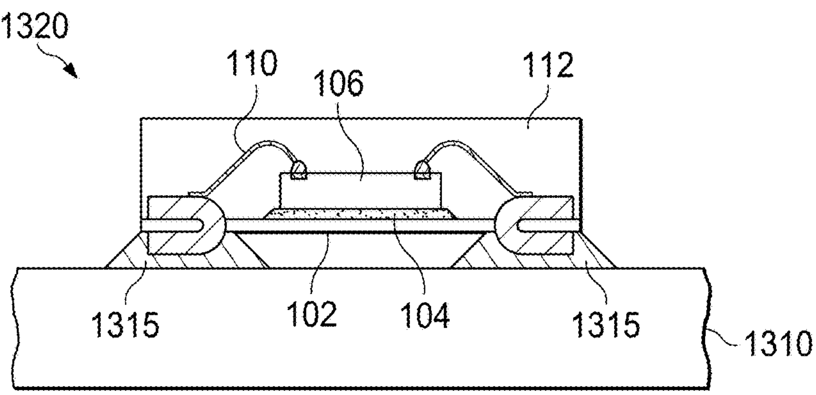
Figure 13C:
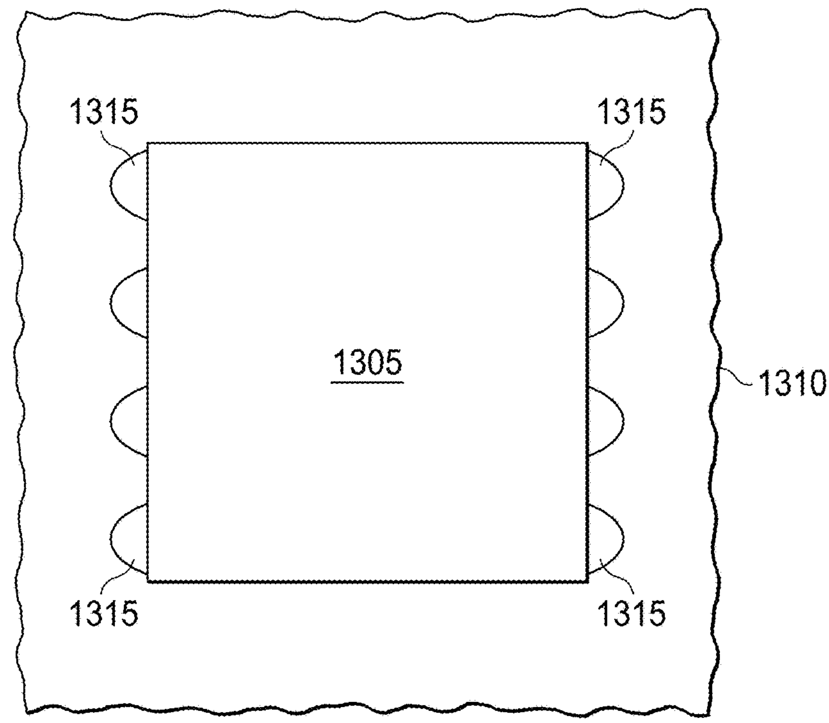

FIGS. 13A-13C illustrate various perspective views of a configurable leaded package 1305 attached to a PCB 1310. The configurable leaded package 1305 is attached to the PCB via a conductive adhesive such as solder 1315. FIG. 13A illustrates a cross-sectional view of a configurable leaded package with a C type lead 1305 attached to the PCB 1310. FIG. 13B illustrates a cross-sectional view of a configurable leaded package with a J type lead 1320 attached to the PCB 1310. FIG. 13C illustrate a top view of a configurable leaded package 1305 attached to the PCB 1310. The PCB 1310 includes contact pads onto which a portion of the leads at the bottom (second lateral extension) of the configurable leaded package 1305 or 1320 is placed. Solder paste is applied to the contact pads of the PCB 1310 prior to placing the configurable leaded package. The solder paste disposed on the of contact pads is reflowed by elevating the temperature to a reflow temperature in a reflow oven. The PCB and the configurable leaded package 1305 or 1320 are reflowed in an infrared (IR)-reflow oven by raising the temperature gradually from 240° C. to the reflow temperature of solder at 260° C. In some instances, the reflow temperature can be as high as about 350° C. Thereafter, the reflow temperature is lowered to room temperature, while holding the device in position. Lowering the temperature solidifies the solder joint to attach the package to the contact pads of the PCB. It is noted that, while examples of only two configurable leaded packages 1305, 1320 are shown in FIGS. 13A and 13B, any of the packages illustrated in the Figures of this disclosure, for example the packages illustrated in FIGS. 1A-1S can be attached to the PCB 1310 using the above reflow process, and are within the scope of this disclosure.

Figure 14A:
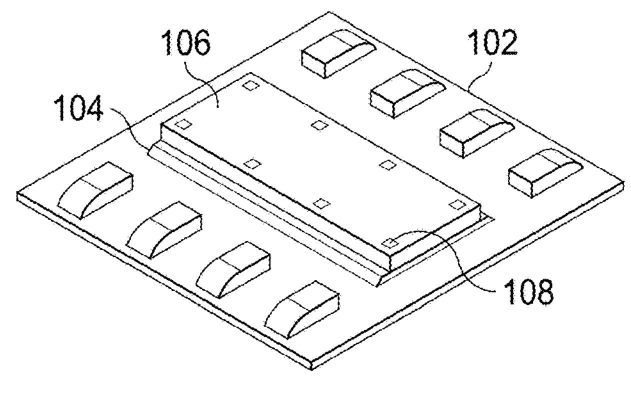

FIGS. 14A-14O illustrate various views of a printed configurable leaded package according to various examples. Instead of using a bond wire 110 or a flip chip attachment of the semiconductor die 106 using bumps and solder, these Figures illustrate printing a conductive trace to electrically connect between bond pads of the die 106 to the continuous lead 102. Described examples of printing include inkjet, scribe dispensing, aerosol jet, microprinting, laser transfer, spray, micro dispensing, 3D printing etc. to print or deposit conductive inks, conductive polymers, metal filled epoxies, sintering metallic powder, liquid assisted sintering particles, or solder paste to form conductive traces. Printing is described in more detail in copending provisional application titled "PRINTED PACKAGE AND METHOD OF MAKING THE SAME, filed on Dec. 31, 2020, with the first named inventor Sreenivasan Kalyani Koduri. Various printing techniques to print the conductive traces in the configurable leaded package are described therein. Additionally, various layers including the can be built by spin coating followed by photolithography.

Figure 14B:
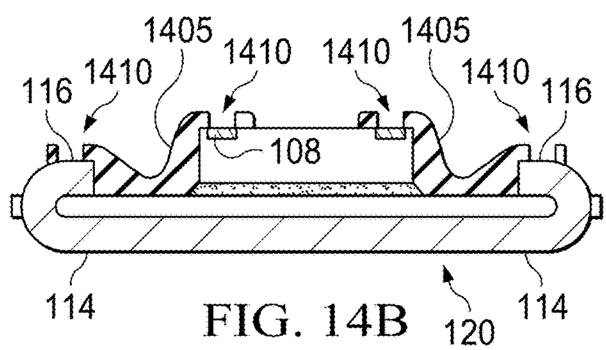
Figure 14B:
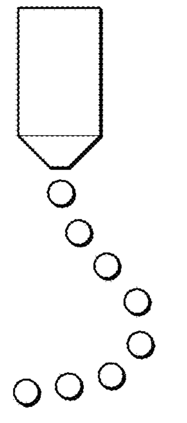
Figure 14B:
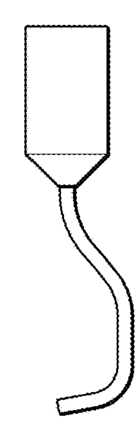
Figure 14C:
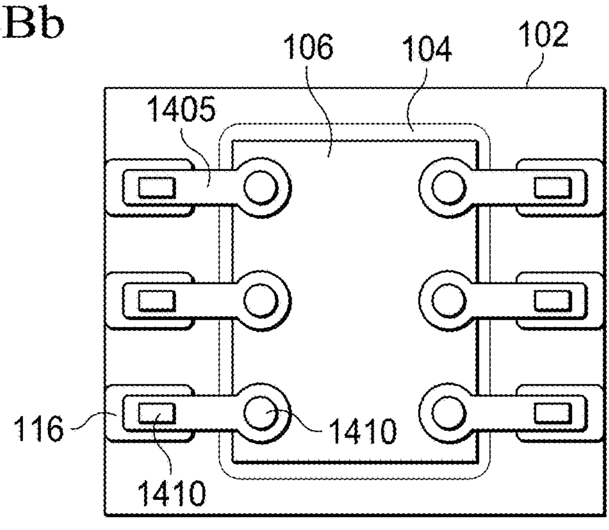
Figure 14D:
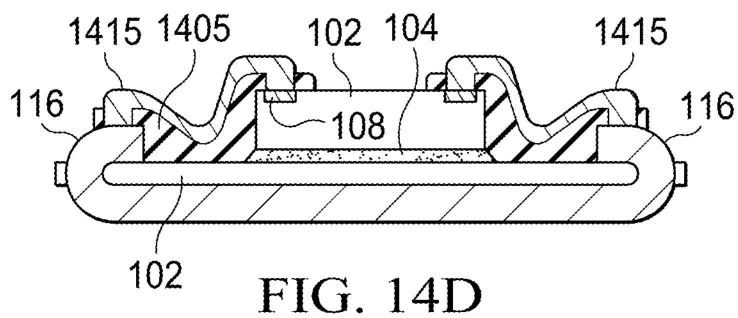
Figure 14D:
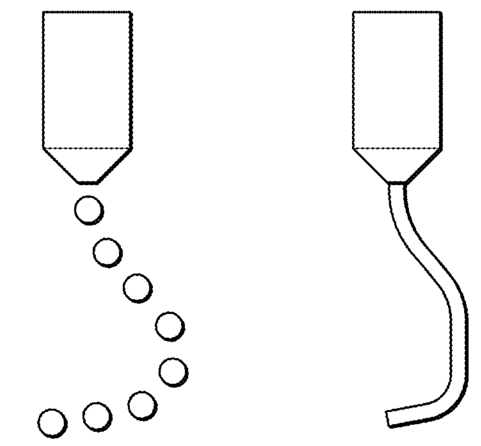

FIG. 14A illustrates a semiconductor die 106 attached to a base insulating layer 102 via die attach material 104, including the continuous leads 120 inserted into the base insulating layer 102 using various techniques described in this disclosure according to various examples. In an example, in FIG. 14B, a foundation insulating layer 1405 is printed, deposited, formed or otherwise applied as a foundation layer spanning a portion of a top surface of a lateral extension 116 of the continuous lead 102. The foundation insulating layer 1405 is deposited around each of the bond pads 108, contacting the top surface of the semiconductor die 106, on to the sides of the die 106, contacting the base insulating layer 102 and contacting the lateral extension 116. The top surface of each of the bond pads 108 and a portion of the top surfaces of the lateral extensions 116 are left uncovered by the foundation insulating layer 1405. In other words, the foundation insulating layer 1405 includes recesses 1410 at these locations to make space for a conductive trace to make electrical contact with the bond pad 108 and the continuous lead 102. The recesses 1410 includes a closed shape from the top view of the device as illustrated in FIG. 14C. Various closed shapes include circular, rectangular, square and polygonal shapes.

Optionally foundation insulating layer 1405 can be cured at this time (e.g., at, or later with additional layers. A polymer, epoxy, silicon, mold, or other insulators can be used for forming the foundation insulating layer 1405. The foundation insulating layer 1405 follows the contours of the topology of the lateral extensions 116 of continuous lead and die 18, while smoothing the turns in the Z axis. The foundation insulating layer 1405 is applied to create a path and access for a later layer of conductive ink or other conductive material that forms a conductive trace. The foundation insulating layer 1410 can be formed or deposited using one of multiple techniques such as screen-printing, photolithography and etching, CVD, PVD, vacuum evaporation, inkjet printing, spray coating, micro dispensing, aerosol jet, electro hydro dynamic (EHD) techniques with the appropriate insulating properties. If inkjet printing is used, foundation insulating layer 1405 can be formed from an inkjet deposition compatible polymer such as a polyimide ink, a thermally curable epoxy-based polymer ink, and a UV-curable acrylate ink. A polymer with a modulus less than 2 GPa is used to avoid undue stress on the assembly. A thickness of the foundation insulating layer 1410 can be in the range of about 2 μm to 35 μm. In one example, the thickness is about 2 μm to not more than 20 μm, and more in a range from about 2 μm to about 10 μm. Because the inkjet solvent deposition material has a solvent, the initial thickness, after the solvent dissipates, the remaining material forms the insulating layer at a reduced thickness.

To achieve the desired thickness, multiple inkjet depositions can be performed. Inkjet deposition allows precise placement of material by using "drop on demand" (DOD)

technology, where a reservoir of the liquid has a nozzle and a small volume of the liquid is forced from the nozzle in response to an electrical signal. The liquid forms a drop as it falls vertically onto a surface. Any other suitable printing techniques as described in more detail in copending provisional application titled "PRINTED PACKAGE AND METHOD OF MAKING THE SAME, filed on Dec. 31, 2020, with the first named inventor Sreenivasan Kalyani Koduri, can be used to create the foundation insulating layer 1410. In any printing technique employed, the printing can be done in one step or in multiple passes of a print head. FIG. 14C illustrates a top view of the device at this stage in the assembly process, where the foundation insulating layer 1405, the recesses 1410, the die 106, the blank insulating layer 102 and the lateral extensions 116 are visible. The foundation insulating layer 1405 includes a channel that is formed on its surface for the conductive trace 1415 to be formed.

FIG. 14D illustrates printing the conductive trace 1415 in the recess 1410 and on the surface of the foundation insulating layer 1405, in the channel. Various shapes of the channels include semicircular, V shaped, square, or rectangular and are described in more detail in the copending provisional application titled "PRINTED PACKAGE AND METHOD OF MAKING THE SAME, filed on Dec. 31, 2020, with the first named inventor, Sreenivasan Kalyani Koduri. The conductive traces, and any contacts, can be made with low resistive material(s). Conductive inks, conductive polymers, metal filled epoxies, sintering metallic powder, liquid assisted sintering particles, solder paste, etc. can be used to form this trace and contacts. This material can be applied using at least one of many techniques, including inkjet printing, EHD/Electro-spraying printing, spray coating printing, aerosol jet printing, micro-dispensing printing, laser induced forward transfer printing, micro-transfer printing, scribe dispensing (as illustrated in FIG. 14Db), screen printing, or 3D printing (as illustrated in FIG. 14Da). In one example, the conductive trace 1415 is built photolithography and electroplating similar to forming a redistribution layer (RDL) layer in bumping of semiconductor dies.

Figure 14E:
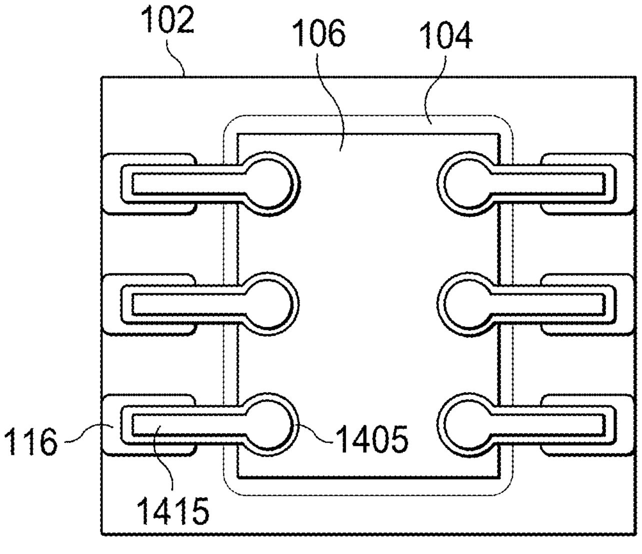

The conductive material forming the conductive trace is constrained within the channel created by the foundation insulating layer 1405. This will avoid unexpected shorts or opens. The conductive material follows the contours of the foundation layer and adheres well with the foundation insulating layer 1405. The conductive trace 1415 fills the recesses 1410 on the lateral extension 116 and the bond pad 108 electrically connecting between them. A thickness of the conductive trace 1415 is in the range of 5 microns to 30 microns. FIG. 14E illustrates a top view of the device at this stage in the assembly process, where the foundation insulating layer 1405, the conductive traces 1415, the die 106, the blank insulating layer 102 and the lateral extensions 116 are visible. In one example, the conductive trace 1415 is cured at this stage using a thermal cure, a chemical cure, or a rapid cure process. For example, a thermal cure includes conduction, convection, infrared, or microwave heating. In another example, the conductive trace 1415 is cured after additional layers in the package are built. The printing techniques described above can print the conductive trace 1415 in one step forming the full thickness of the conductive trace 1415, or multiple layers at different times eventually forming the full thickness.

Figure 14F:
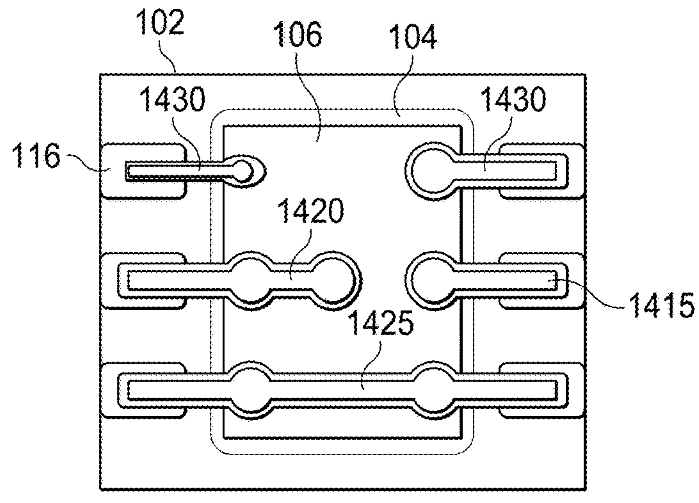

One disadvantage of electrically connecting the semiconductor die 106 to the lead 102 using wire bond is that, the process is limited to only a single wire size and diameter, at a time. Wire bonds do not address the need for having wires with various thicknesses for current carrying purposes. For example, certain terminals or bond pads of the die need to carry higher current than the others, requiring thick bond wires connected to those bond pads. Printing conductive traces 1415 gives the flexibility to create conductive trace 1415 with multiple shapes, sizes, materials, and contacts within a single package. A few examples of such conductive trace 1415 are illustrated in FIG. 14F. The conductive trace 1430 is thinner compared to conductive trace 1415. Two bond pads can be interconnected using the conductive trace 1420. The conductive trace 1425 is formed over and across the semiconductor die 102 that can interconnect two bond pads and two lateral extensions 116 that are opposite to each other. The conductive trace 1430 is formed of a different conductive material than the rest of the conductive traces. While FIG. 14F illustrates only a few examples, it is noted that any size and shape of conductive trace 1415 is within the scope of this disclosure.

Figure 14G:
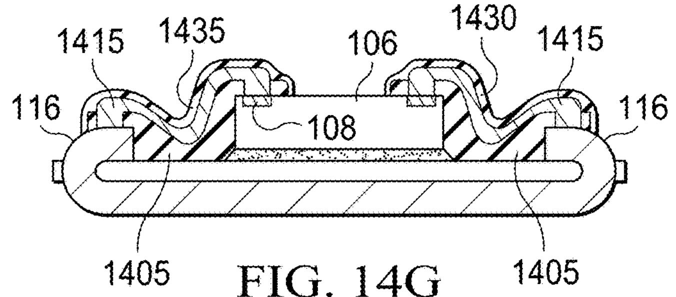

The conductive trace 1415 is covered with a cover insulating layer 1430 contacting portions of the conductive trace 1415 and the foundation insulating layer 1405, as illustrated in FIG. 14G. The cover insulating layer 1430 is printed, deposited, formed or otherwise applied over exposed portions of the foundation insulating layer 1405, and exposed portions of conductive traces 1415 on the foundation insulating layer 1405, which spans a portion of a top surface of lateral extension 116 of the lead. The foundation insulating layer 1405 and the cover insulating layer 1430 together contacts and covers/encloses the conductive trace 1415 fully except where the contacts are made to the bond pads 108 or the lateral extension 116 of the leads. The cover insulating layer 1430 contacts a top surface of the die 106 adjacent to the bond pads 108 and follows the contour of the conductive trace 1415 and the foundation insulating layer 1405. The material of the cover insulating layer 1430 can be applied using at least one of many techniques, including inkjet printing, EHD/Electro-spraying printing, spray coating printing, spin coating, aerosol jet printing, micro-dispensing printing, laser induced forward transfer printing, micro-transfer printing, scribe dispensing, screen printing, 3D. A top view of the device of FIG. 14G is illustrated in FIG. 14I.

The material of the cover insulating layer 1430 is same as the material of foundation insulating layer 1405, or they are made of different insulating materials. If the foundation insulating layer 1405 and the cover insulating layer 1430 are made of same/similar materials, they can form a homogenous wrap around the conductive trace 1415. A thickness of the cover insulating layer 1430 is between 5-25 microns from a cross-sectional view of the package. Note that, at this point the topology of the device has no holes. All exposed surfaces are in the line of sight, unlike with wire bonds with loops. Also, unlike wire bonds, all the surfaces are robust without issues of wire sweep or other issues associated with wire bonds.

Figure 14H:
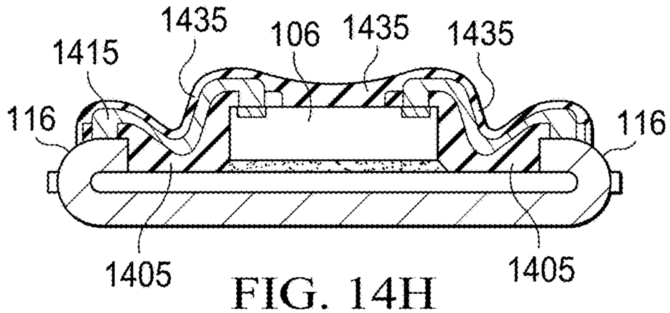
Figure 14I:
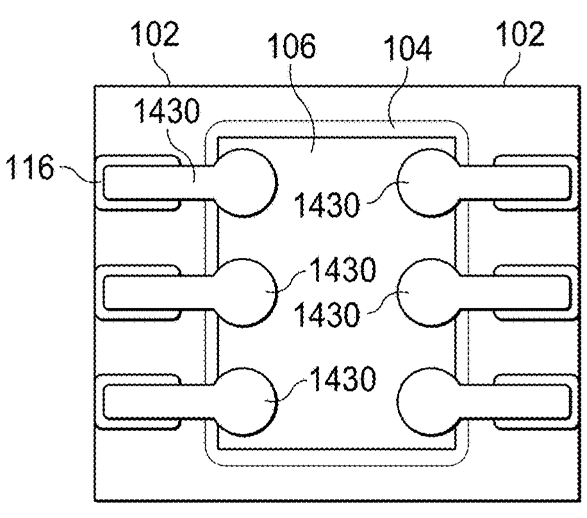

In one example, a cover insulating layer 1435 is applied as a blanket coat across the surface of the die 106, the conductive traces 1415, portions of the lateral extension 116 of the leads, in one step, as illustrated in FIG. 14H. This blanket cover insulating layer 1435 follows the contours of the topology on the foundation insulating layer 1405 and the conductive traces 1415 on the foundation insulating layer 1405, at least sufficiently to ensure that all these components are wrapped or sealed between the foundation insulating layer 1405 and the cover insulating layer 1435.

A layer of encapsulating material 112 is applied to fully cover the top side of the device as illustrated in FIG. 14J. This layer is mostly for mechanical strength and cosmetic appearance. Most of the reliability and protection is provided by the earlier layers, and electrically critical areas of the device are already protected. Since there are no sensitive wire loops are there (zero hole topology), surface of the device can be physically pressed on. This allows for multiple encapsulation options. Encapsulation can be applied as lamination as illustrated in FIG. 14N. A sheet of an insulative material of a required thickness can be applied on the device to cover the surface of the die 106, the cover insulating layer 1430, portions of the lateral extension 116, and portions of the blank insulating layer 102 in lamination. Other methods of molding include transfer molding or injection molding as illustrated in FIG. 14L. Yet another example of molding include casting, potting, or filling as illustrated in FIG. 14M where the encapsulating material is poured over the designated areas of the device in a required thickness. Methods of 3D printing, scribe dispense, screen printing, spray coating, spin coating, dipping, dam-and-fill, A-B multipart casting (which uses an epoxy and a hardener), glazing, roller painting, brush painting etc. are within the scope of this disclosure.

Since the bottom layers (foundation insulating layer 1405 and the cover insulating layer 1430) are providing most of the reliability, the encapsulating material 112 can be optimized for adhesion while trading off on moisture permeability and ionic stability. Optionally, a top surface of the device can be flattened with a hot plate while encapsulating. With the cover insulating layer 1430 fully covering the sensitive portions of the device, encapsulating material 112 does not have to contact with die or interconnects. This significantly reduces reliability and manufacturability requirements. This encapsulating material 112 includes a thickness in the range of 50 microns to 1 mm.

In one example, the device does not include encapsulating material 112, as the cover insulating layer 1430 can provide all the functions of a mold compound or encapsulation including protection from moisture. FIG. 14K illustrates a cross-sectional view of the package after the leads are separated, by removing a portion that interconnects two leads. FIG. 14O illustrates an X-ray view of the device after molding with the encapsulating material 112. It is noted that only a C type lead is illustrated in the example of FIGS. 14A-140 as the printed configurable leaded package. The electrical connections between the die 106 and the leads 102 in any other packages as illustrated in FIGS. 1A-1W can be replaced with the printed conductive traces, and such examples are within the scope of this disclosure. The material of the continuous lead is the same as the leads illustrated in FIGS. 3A-3H. The material and construction of the base insulating layer is the same as the base insulating layer 102 illustrated in FIGS. 2A, 2B, 2C, and 2D.

FIGS. 15A and 15B illustrate cross-sectional views of the printed CLP with dimensions of each component in the package. In both these figures, cross-sectional thicknesses of each component are illustrated. For example, the thickness of the die 106 is 0.200 mm, the foundation insulating layer 1405 is 0.010 mm, the conductive trace 1415 is 0.010 mm, the die attach material 104 is 0.025 mm, the base insulating layer 102 is 0.050 mm, the cover insulating layer 1430 is 0.010 mm, lead 102 is 0.0125 mm. The standoff, or the distance between the lead 102 and a bottom surface of the base insulating layer 102 is 0.125 mm. Laser groove 1505 for marking a symbol on the package is at a depth of 0.030 mm. A total thickness of the package is 0.785 mm. FIG. 15B illustrates another example of the printed CLP where the thickness of the die 106 is 0.200 mm, the foundation insulating layer 1405 is 0.010 mm, the conductive trace 1415 is 0.010 mm, the die attach material 104 is 0.150 mm, the base insulating layer 102 is 0.050 mm, the cover insulating layer 1430 is 0.010 mm, lead 102 is 0.0125 mm. Laser groove 1505 for marking a symbol on the package is at a depth of 0.030 mm. The standoff is 0.125 mm. A total thickness of the package is 0.910 mm.

FIGS. 15C, 15D, 15E, 15F, 15G, and 15H illustrate various steps in the process of making a printed CLP with a J type lead where the cover insulating layer 1435 is applied as a blanket coat, according to one example. FIGS. 15I, 15J and 15K illustrate various steps in the process of making a printed CLP with a C type lead. FIGS. 15La, 15Lb, 15Lc, and 15Ld illustrate various steps in the process of making a printed CLP with a J type lead according to another example. FIGS. 15Ma, 15Mb, 15Mc, and 15Md illustrate various steps in the process of making a printed CLP as a chip on lead package according to an example. FIGS. 15Na, 15Nb, 15Nc, and 15Nd illustrate various steps in the process of making a printed CLP with a J type lead and multiple dies 106 according to an example. Various components in FIGS. 15C-15Nd are similar to those explained earlier, and are identified with similar reference numerals. These components are same in construction, material properties, and functions, and are not repeated here for the sake of simplicity. It is noted that any component that is printed will include an ink residue after the material is cured. Therefore, in various examples, the foundation insulating layer 1405, the conductive trace 1415, the cover insulating layers 1430, 1435 all include ink residue.

Figures 16A, 16B, 16C, 16D, 17A, 17B, 17C, 17D, 17E, 17F, 17G:
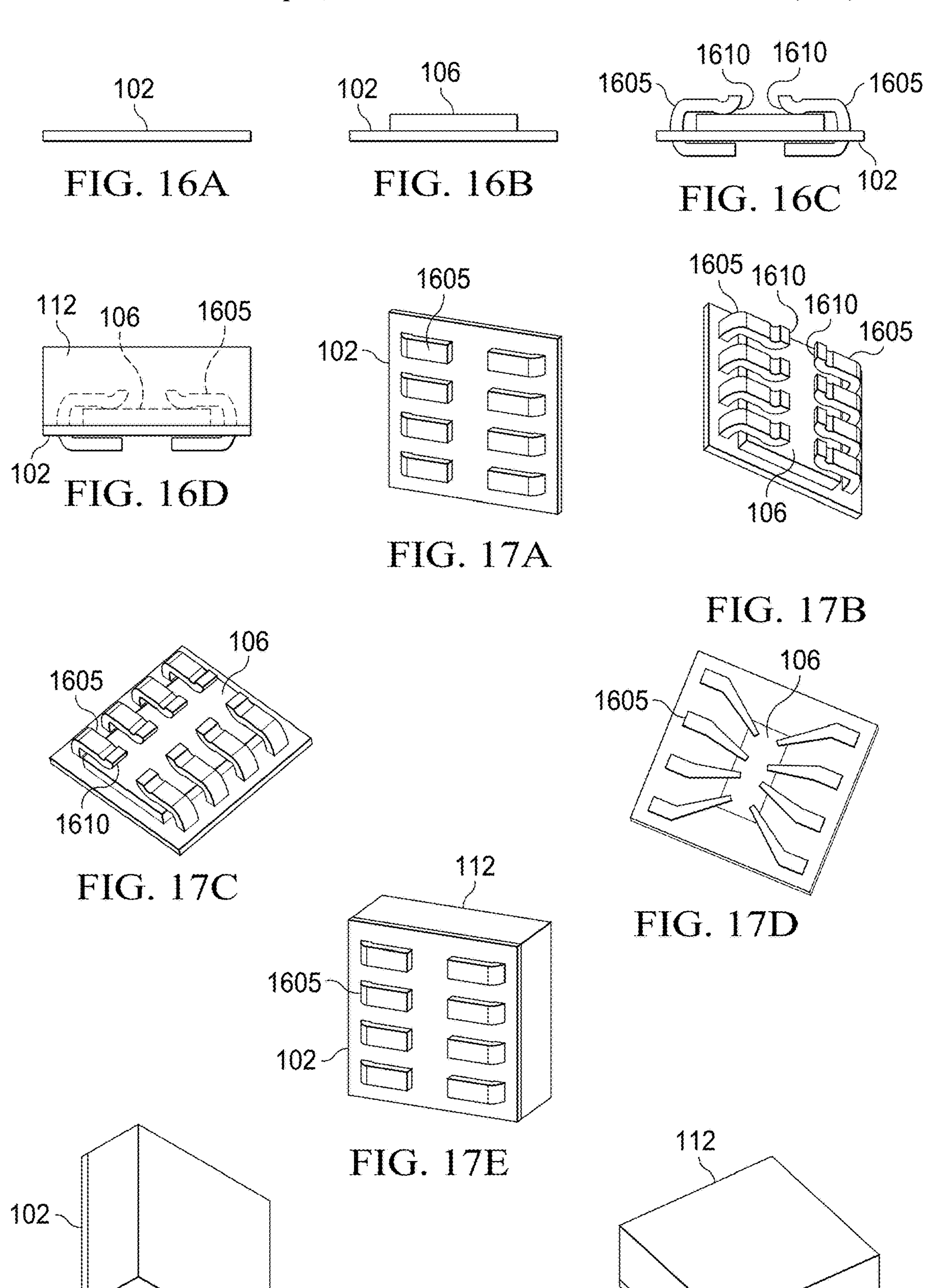

Typical semiconductor packages use multiple materials that are combined in complex forms using a series of machines. With such complex combination of materials and machines multiple failure mechanisms are introduced in the process of manufacturing in every step, for example, die attach, wire bonding etc. A pin interconnect package eliminates the complexities of such package and provides a robust solution where die-attach, wire bond and lead frame are all replaced by a set off pins and an insulating carrier. Simplified design and construction make such packages robust and easy to produce. A process of constructing a pin interconnect package is illustrated in FIG. 16A-16D. The process starts with a blank insulating layer 102 as illustrated in FIG. 16A. A semiconductor die 106 is then placed on to the blank insulating layer 102 without attaching the die 106 to the blank insulating layer 102 as illustrated in FIG. 16B. Since only die 106 placement is needed, the need for die attach material and the die attach process is eliminated.

In FIG. 16C, a continuous lead 1605 is inserted into the base insulating layer 102 and bent on opposite sides of the base insulating layer 102 to create a clamp that can large enough to contact the bond pads of the die 106. The top part of the continuous lead 1605 includes a portion 1610 that is below a plane along the majority of the bottom surface of the top part of the continuous lead 1605. This portion 1610, when press fitted, can make electrical connection with the bond pad of the die 106. The portion of the lead below the base insulating layer 102 acts as external leads of the package which can be then attached to a PCB. The material of the continuous lead is the same as the leads illustrated in FIGS. 3A-3H. The material and construction of the base insulating layer is the same as the base insulating layer 102 illustrated in FIGS. 2A, 2B, 2C, and 2D. The device is then molded using a suitable encapsulating material 112 as covered in various examples.

The pin interconnect package has much fewer process steps, equipment, materials and failure modes compared to other package types. It eliminates the need for wire bonding or even printing conductive traces. Another advantage is that the same continuous lead 1605 provide interconnect on die side, as well as on the PCB side. Instead of press fitting the continuous lead 1605 on to the die, solder, sintered silver, or other conductive adhesives can be used to attach the portion 1610 to the bond pads of the die 106. The portion 1610 can be designed to have a shape and size different than the rest of the continuous lead 1605 to make contact with the bond pad. For example, the portion 1610 can be tapered at the contact point to make contact with the bond pads of the die 106.

FIGS. 17A-17C illustrate various perspective views of the pin interconnect package. FIG. 17A illustrates a bottom perspective view of the pin interconnect package. FIG. 17B illustrates a top perspective view of the pin interconnect package where the portion 1610 of the continuous leads 1605 contacts the die 106. FIG. 17D illustrates a top perspective view of a pin interconnect package including a fan-out feature, where continuous leads 1605 are shaped to spread from a small die 106. This type of fan-out features are used when the die size shrinks, but the package overall size needs to remain large. FIGS. 17E-17G illustrate various views of the pin interconnect package that is molded using an encapsulating material.

FIGS. 18A-18F illustrate various perspective views of a through-hole version of a single-in-line pin interconnect package. In this example, a semiconductor die 106 is a placed on a blank insulating layer 102. The size of the blank insulating layer 102 is the same as that of the die 106 (size of the bottom surface of the die). Optionally, the blank insulating layer 102 can be placed onto the die 106. Since only die 106 placement is needed, the need for die attach material and the die attach process is eliminated.

Figures 18A, 18B, 18C, 18D, 18E, 18F:
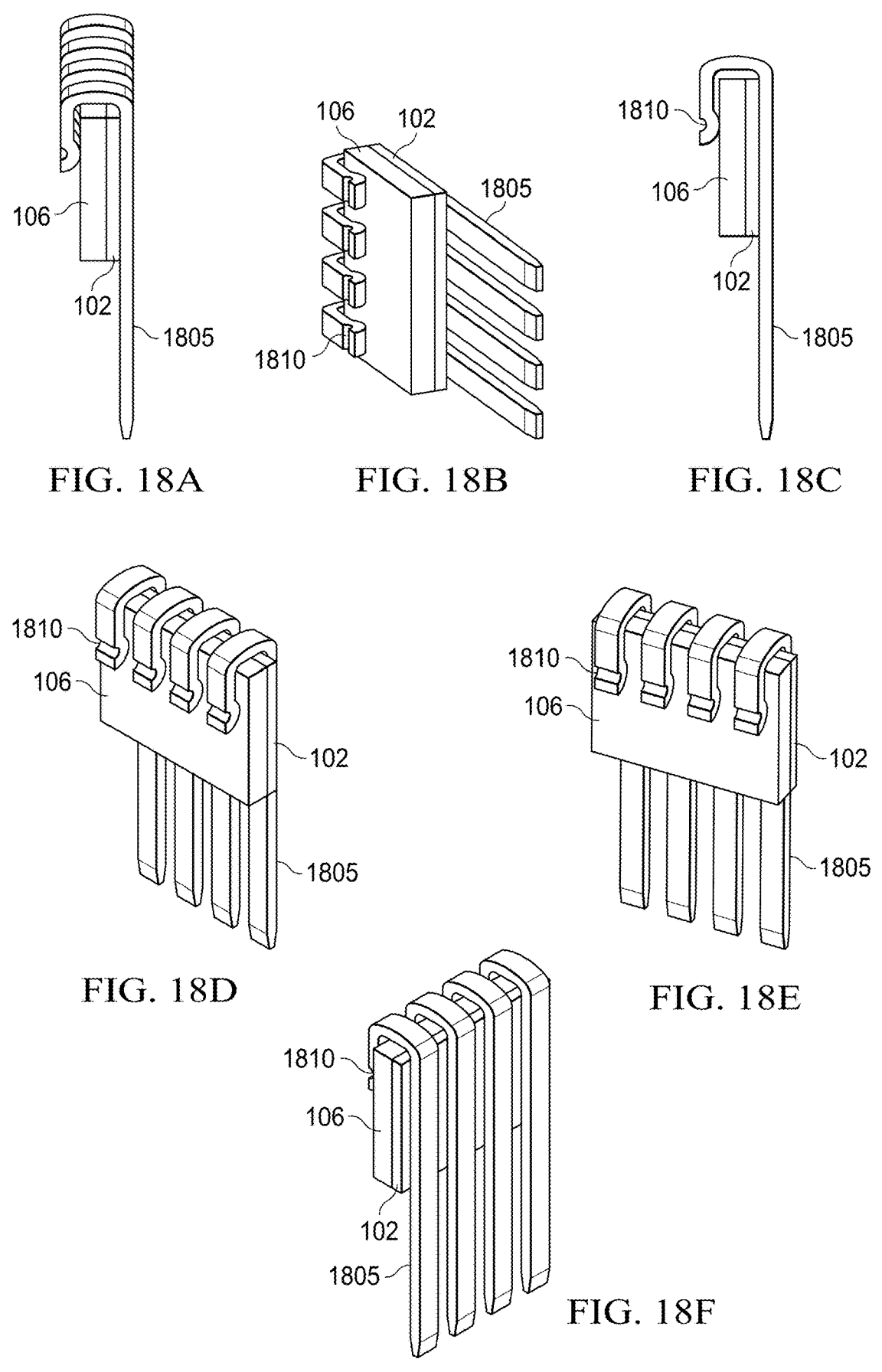

In FIG. 18A, a continuous lead 1805 is bent to create a clamp that can large enough to contact the bond pads of the die 106. The top part of the continuous lead 1805 includes a portion 1810 (clearly visible in FIGS. 18B, C) that is below a plane along the majority of the bottom surface of top part of the continuous lead 1605. This portion 1810, when press fitted to the die 106 attached to the base insulating layer 102, can make electrical connection with the bond pad of the die 106. The continuous lead at this position contacts the side surfaces of the die 106 attached to the base insulating layer 102, and the contacts the bottom surface of the base insulating layer 102 and projects beyond the opposite side surface of the die 106 attached to the base insulating layer 102. The single-in-line pin interconnect package can replace die-attach material, bond-wires, and lead frame materials. The material of the continuous lead is the same as the leads illustrated in FIGS. 3A-3H. The material and construction of the base insulating layer is the same as the base insulating layer 102 illustrated in FIGS. 2A, 2B, 2C, and 2D. The device is then molded using a suitable encapsulating material 112 as covered in various examples.

Figure 19A:
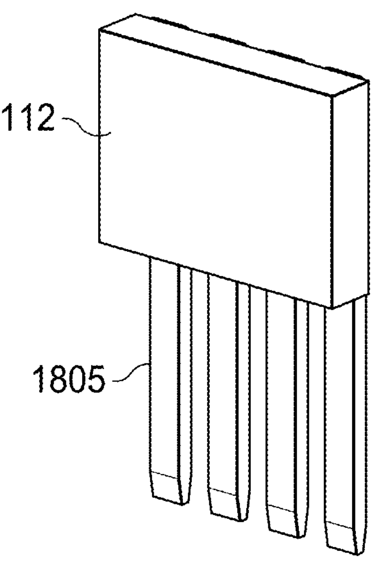
Figure 19B:
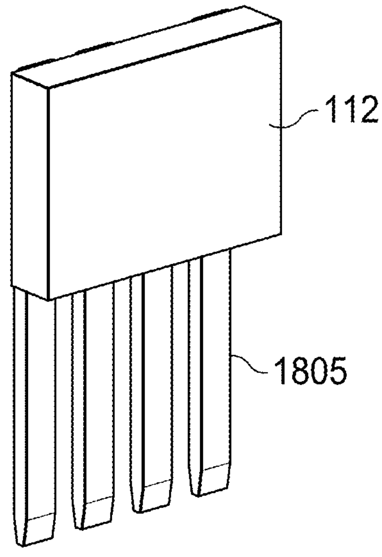
Figure 19C:
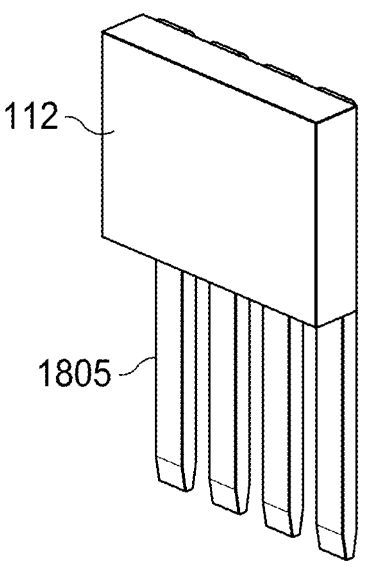
Figure 19D:
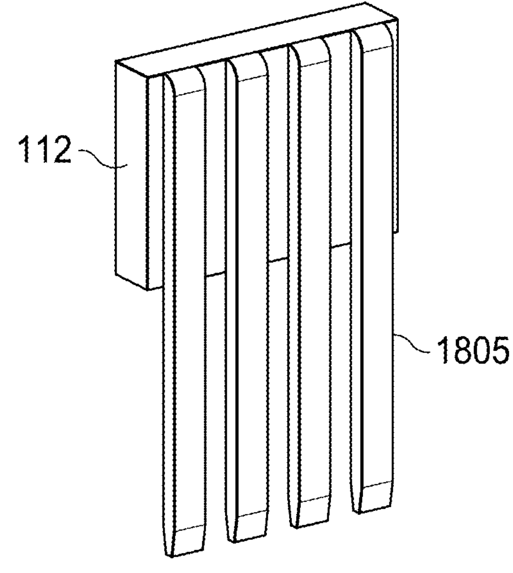

FIG. 18B illustrates a side perspective view of the single-in-line pin interconnect package. FIG. 18C illustrates a cross-sectional view of the single-in-line pin interconnect package. FIGS. 18D and 18E illustrate side perspective views of the single-in-line pin interconnect package. FIG. 18B illustrates a bottom side perspective view of the single-in-line pin interconnect package. The single-in-line pin interconnect package is molded optionally as illustrated in FIGS. 19A-19D which shows various perspective views of molded packages. Encapsulation is mostly cosmetic and to provide mechanical protection to the die. FIGS. 19A and B illustrate front and back side perspective views of the single-in-line pin interconnect package, respectively. The encapsulating material 112 fully covers the continuous leads 1805 until the edge of the die and the blank insulating layer 102. Molding can be done by a suitable molding technique to form the encapsulating material 112 as covered in various examples. FIGS. 19C and 19D illustrate front and back side perspective views of a thermally enhanced single-in-line pin interconnect package, respectively. In this example, the portions of the continuous leads 1805 that are contacting the bottom surface of the blank insulating layer 102 is exposed from the encapsulating material 112. These exposed portions of the continuous leads 1805 can be connected to a heat sink for thermal dissipation from the package.

FIG. 20 illustrates a system or a tool to manufacture a configurable lead package according to various examples. The computer can be programmed to move mechanical components, for example robotic arms within each section of the system to receive a blank insulating layer 102 in the form of a sheet or a roll, and a wire 302 which is also in the form of a roll as illustrated in FIG. 20. The system performs one of a pinching action (to cut the wire 302 at designated places), bending or forming action (to create the continuous lead 304) and stapling, stitching, or clamping type of action (to insert and attach the continuous lead 304 to the base insulating layer 102). In one example, the system is operated manually, or semi-automatically. In another example, the system is fully automatic which includes a controller 2005 that is a programmable computer. The controller 2005 can also be connected to the factory database and IT systems to interact with other systems like die attach, wire bonder for forming wire bonds, printer for printing conductive traces, and a molding unit. In one example, the other systems are integrated into the system of FIG. 20 so that the whole packaging process can be performed with a single tool. In such case, the system includes additional units such as the ones mentioned above. In another example, the system of FIG. 20 with its functionality can be added to any other units that are used in the assembly process including die attach unit, wire bonder, and molding unit.

The system of FIG. 20 can make, and attach to the base insulating layer 102, one pin at a time, a pair, or multiple pins at a time rapidly. A wire feeder 2010 receives the roll of wire 302. Multiple types and quality of wires can be fed through the wire feeder 2010. Wire feeding operation includes wire loading where the roll of wire is loaded to the system. At a section of the wire feeder 2010 a robotic arm or other suitable mechanism pulls one end of the wire from the roll and straightens the wire. The wire is passed through a section of wire holders to keep the wire straight. Multiple sharp cutting heads 2105, 2010 as illustrated in FIG. 21 are designed to move from two opposite sides (top and bottom of the wire 302) and contact the wire 302 at preset distances. The preset distances are set according to a length of the individual unit 304.

The cutting heads then compress into each other creating the pinch cutting action and separating the wire 302 into individual units 304. The cutting heads are T shaped with one section of the T including the sharp cutting features. In the example illustrated in FIG. 21, and creates the continuous leads 102 of FIG. 1Q. In other examples, the cutting feature of only the top cutting head 2105 can have a sharp tip, and the bottom one 2010 can act as a support creating the leads 120 of FIG. 1M, 1N, 1O, or 1P. The tips of the cutting heads are shaped depending on a desired shape of the edges of the individual units 304. The wire 302 can be a flat cut, star shaped pointed tip, conical point, or a wedge/chisel edge.

The individual units 304 are then transferred to a forming unit 2015 using robotic arms or in a tray. The forming unit 2015 creates the bends in the individual unit 304, a first bend 306 and a second bend 308, making a shape of each individual unit 304 to resemble a staple. The forming unit 2015 includes a punch 2205 and an anvil 2210. The punch 2205 is an inverted U shaped punch. Depending on the shape of the bends required, for example for the continuous lead 1805, or a clamp (905, 1005, 1105, or 1205), the shape of the punch 2205 can be changed.

The forming unit 2015 also includes an anvil at the bottom. The punch 2205 and anvil 2210 are designed as robotic arms that can move up and down along the Y axis. The anvil 2210 is shaped and sized to fit inside the punch 2205 when moved up. The individual unit 304 is loaded into the forming unit 2015, and the anvil comes to contact with the individual unit 304, and thereafter the anvil pushes up to mate with the punch 2205 forming the bends 306, 308 and a desired shape. In other example, both the punch 2205 and the anvil 2210 are moved relative and closer to each other, making individual unit 304 to take the shape defined by the two together, as illustrated in FIG. 22B.

The sheet of base insulating layer is loaded to the carrier loader 2020 at the same time when the wire 302 is loaded to the wire feeder 2010 or at a separate time in the process. The carrier loader 2020 receives the sheet of the base insulating layer 102 and cuts it into a desired size based on the package size. Each individual sheet of the base insulating layer 102 is passed onto the pinning unit 2025, individually or as a set. The pinning unit as illustrated in FIG. 22C includes a punch 2215 that is T shaped. A set of guiding plates 2220 are designed to be in contact with the bottom side of the T shape of the punch 2215. An anvil 2225 is positioned at the bottom of the tool including a cavity 2230. The sidewalls of the cavity 2230 align with the sidewalls of the guiding plates 2220 when either the anvil 2225 is moved up or when the punch 2215 and the guiding plates 2220 are moved down together.

Figure 22D:
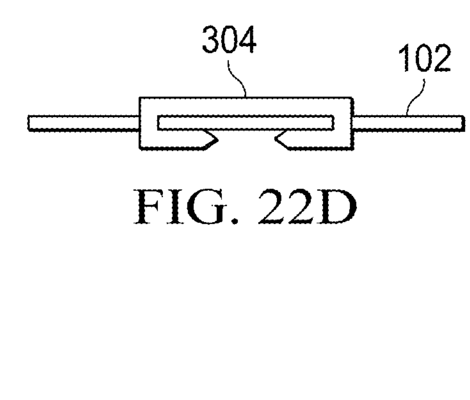

The base insulating layer 102 is fed between the guiding plates 2220 and the anvil 2225 as shown in FIG. 22C. With the aid of the guiding plates 2220, the pins or individual units 304 are accurately placed and held in position as illustrated. When the punch 2215 pushes down, the individual unit 304 gets pressed down into the defined shape of the anvil's cavity 2230. Each individual unit 304 thus follows that shape defined by the cavity 2230 and completes the pinning operation producing the device as illustrated in FIG. 22D. Depending on the shape of the bends required, for example for the continuous lead 1805, or a clamp (905, 1005, 1105, or 1205), the shape of the punch 2215, the cavity 2230 of the anvil 2225 can be changed.

FIG. 23 illustrates a block diagram of a process flow of making the configurable leaded package according to various examples. In block 2305 a wafer from the wafer fab is received. The wafer includes multiple dies 106. The wafer is then reduced in thickness using a back grind process in block 2310. The wafer is then singulated to separate the dies 106. A tape or a blank insulating layer 102 is received in block 2320 and it is there after cut to shape and the leads 120 are inserted in block 2325, as explained in earlier examples. Individual die is attached to the device at this stage in block 2330, and thereafter electrical connections between the die 106 and the leads 120 using wire bonds or printing conductive traces, or by clamping in block 2335. The device is then encapsulated using appropriate encapsulating material in block 2340. Portions of the leads are removed in block 2345 to separate the leads 120. The device is then tested in block 2350, and thereafter symbol of the package is laser marked in block 2355. The device is finally singulated to from individual packages in block 2360. Each individual package is then loaded to a tape and reel in step 2365 and thereafter packed for shipment in block 2370.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and example are possible in light of above teachings, and it is thus intended that the scope of invention not be limited by this Detailed Description, but only by the following Claims.

What is claimed is:

1. A semiconductor package comprising:

a base insulating layer;

a semiconductor die attached to a portion of the base insulating layer; and a first continuous lead electrically connected to the semiconductor die, the first continuous lead including a first lateral extension on a first surface of the base insulating layer, a second lateral extension on a second surface of the base insulating layer, and a connecting portion between the first lateral extension and the second lateral extension; wherein the connecting portion penetrates through the base insulating layer, wherein the first continuous lead includes a uniform construction without any joints between the first lateral extension, the second lateral extension, and the connecting portion.

2. The semiconductor package of claim 1 further comprising an encapsulation material covering portions of the base insulating layer, the semiconductor die, and the first continuous lead.

3. The semiconductor package of claim 2, wherein the second lateral extension does not extend past a periphery of the semiconductor package along a surface of the encapsulation material, from a cross-sectional view of the semiconductor package.

4. The semiconductor package of claim 2, wherein a portion of the second lateral extension extends past a periphery of the semiconductor package along a surface the encapsulation material, from a cross-sectional view of the semiconductor package.

5. The semiconductor package of claim 2, wherein the encapsulation material includes one of a mold compound, an insulating film, and a sprayed insulative coat.

6. The semiconductor package of claim 1, wherein the first lateral extension is substantially parallel to the second lateral extension in at least one view of the semiconductor package.

7. The semiconductor package of claim 1, wherein the second lateral extension is exposed to an exterior environment of the semiconductor package.

8. The semiconductor package of claim 1, wherein the semiconductor die is directly attached to the base insulating layer via a die attach material.

9. The semiconductor package of claim 1, wherein the semiconductor die is electrically connected to the first continuous lead via a bond wire.

10. The semiconductor package of claim 1, wherein the semiconductor die is electrically connected to the first continuous lead via a conductive trace.

11. The semiconductor package of claim 10, wherein the conductive trace includes an ink residue of a conductive material.

12. The semiconductor package of claim 1, wherein the second lateral extension functions as an external lead of the semiconductor package.

13. The semiconductor package of claim 1, wherein a thickness of the first lateral extension, the second lateral extension, and the connecting portion are substantially the same from a cross-sectional view of the semiconductor package.

14. The semiconductor package of claim 1, wherein the first continuous lead includes copper.

15. The semiconductor package of claim 1, wherein the first continuous lead includes a copper base material coated with a conductive material that impacts oxidization of copper.

16. The semiconductor package of claim 1, wherein the second lateral extension is attachable to a printed circuit board.

17. The semiconductor package of claim 1, wherein the base insulating layer includes a material with a flexibility between 40-50 N/cm.

18. The semiconductor package of claim 1, wherein the base insulating layer includes one of a kapton tape, a fiber cloth, a fiber board, a glass cloth, a back grind tape, a plastic plate, and a pre-molded blank.

19. The semiconductor package of claim 1, wherein a portion of each of the first lateral extension and the second lateral extension that is adjacent to the connecting portion includes a bend from a cross-sectional view of the semiconductor package.

20. The semiconductor package of claim 1, wherein the base insulating layer includes an insulating material in its entirety.

21. The semiconductor package of claim 1 further comprising a second continuous lead opposite the first continuous lead, wherein a first end of the second lateral extension of the first continuous lead and a second end of the second lateral extension of the second continuous lead face each other in at least one view of the semiconductor package.

22. A semiconductor package comprising:

a base insulating layer;

a lead including a first lateral extension on a first surface of the base insulating layer and a second lateral extension on a second surface of the base insulating layer, a connecting portion between the first lateral extension and the second lateral extension, the connecting portion penetrating through the base insulating layer; and a semiconductor die attached to a portion of the first lateral extension and electrically connected to the lead, wherein the lead does not include any joints between the first lateral extension, the second lateral extension, and the connecting portion.

23. The semiconductor package of claim 22, wherein the semiconductor die is attached to the portion of the first lateral extension via a die attach material.

24. The semiconductor package of claim 22, wherein the semiconductor die is electrically connected to the lead via a bond wire.

25. The semiconductor package of claim 22, wherein the semiconductor die is electrically connected to the lead via a bump.

26. The semiconductor package of claim 22, wherein the base insulating layer includes an insulating material in its entirety.

27. The semiconductor package of claim 22, wherein the lead includes copper.

28. The semiconductor package of claim 22, wherein the lead includes a copper base material coated with a conductive material that impacts oxidization of copper.

29. The semiconductor package of claim 22 further comprising an encapsulation material covering portions of the base insulating layer, the semiconductor die, and the lead.

30. The semiconductor package of claim 22, wherein the first lateral extension is substantially parallel to the second lateral extension at least in one view of the semiconductor package.

31. The semiconductor package of claim 22, wherein the second lateral extension is exposed from the semiconductor package.

32. The semiconductor package of claim 22, wherein the semiconductor die is attached to the base insulating layer via a die attach material.

33. The semiconductor package of claim 22, wherein the semiconductor die is electrically connected to the lead via a bond wire.

34. The semiconductor package of claim 22, wherein the semiconductor die is electrically connected to the lead via a conductive trace.

35. The semiconductor package of claim 34, wherein the conductive trace includes an ink residue of a conductive material.

36. The semiconductor package of claim 22, wherein the second lateral extension is attachable to a printed circuit board.

37. The semiconductor package of claim 22, wherein the second lateral extension functions as an external lead of the semiconductor package.

38. A semiconductor package comprising:

a base insulating layer;

a semiconductor die attached to a portion of the base insulating layer; and a first lead electrically connected to the semiconductor die, wherein the first lead includes a first lateral extension on a first surface of the base insulating layer, a second lateral extension on a second surface of the base insulating layer, and a connecting portion between the first lateral extension and the second lateral extension; wherein an end of the second lateral extension includes a recess.

39. The semiconductor package of claim 38, wherein the connecting portion penetrates through the base insulating layer.

40. The semiconductor package of claim 38, wherein a thickness of the first lead at the end of the second lateral extension is less than a thickness of the first lead across the first lateral extension, the connecting portion and a portion of the second lateral extension.

* * * * *